(12) United States Patent
Koh et al.

(10) Patent No.: US 9,704,977 B2
(45) Date of Patent: Jul. 11, 2017

(54) ENERGY-FILTERED COLD ELECTRON DEVICES AND METHODS

(71) Applicant: BOARD OF REGENTS, THE UNIVERSITY OF TEXAS SYSTEM, Austin, TX (US)

(72) Inventors: Seong Jin Koh, Mansfield, TX (US); Pradeep Bhadrachalam, Arlington, TX (US); Liang-Chieh Ma, Arlington, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 0 days.

(21) Appl. No.: 15/115,999

(22) PCT Filed: Feb. 3, 2015

(86) PCT No.: PCT/US2015/014258
§ 371 (c)(1),
(2) Date: Aug. 2, 2016

(87) PCT Pub. No.: WO2015/119947
PCT Pub. Date: Aug. 13, 2015

(65) Prior Publication Data
US 2017/0012115 A1   Jan. 12, 2017

Related U.S. Application Data

(60) Provisional application No. 61/935,493, filed on Feb. 4, 2014, provisional application No. 62/032,554, filed on Aug. 2, 2014.

(51) Int. Cl.
*H01L 29/66* (2006.01)
*H01L 29/76* (2006.01)
(Continued)

(52) U.S. Cl.
CPC ........ *H01L 29/66977* (2013.01); *B82Y 10/00* (2013.01); *B82Y 40/00* (2013.01);
(Continued)

(58) Field of Classification Search
CPC ................................. H01L 29/66977
See application file for complete search history.

(56) References Cited

U.S. PATENT DOCUMENTS 5,466,949 A   11/1995  Okuno
6,218,677 B1   4/2001  Broekaert
(Continued)

OTHER PUBLICATIONS

International Search Report and Written Opinion issued in corresponding International Application No. PCT/US2015/014258 mailed Jul. 22, 2015.

*Primary Examiner* — Jeffrey Zweizig
(74) *Attorney, Agent, or Firm* — John P. Zimmer; Smith Moore Leatherwood LLP

(57) ABSTRACT

Energy-filtered cold electron devices use electron energy filtering through discrete energy levels of quantum wells or quantum dots that are formed through band bending of tunneling barrier conduction band. These devices can obtain low effective electron temperatures of less than or equal to 45K at room temperature, steep electrical current turn-on/turn-off capabilities with a steepness of less than or equal to 10 mV/decade at room temperature, subthreshold swings of less than or equal to 10 mV/decade at room temperature, and/or supply voltages of less than or equal to 0.1 V.

20 Claims, 27 Drawing Sheets

(51) Int. Cl.
*H01L 29/08* (2006.01)
*B82Y 10/00* (2011.01)
*B82Y 40/00* (2011.01)
*H01L 29/12* (2006.01)
*H01L 29/06* (2006.01)
*H01L 29/24* (2006.01)
*H01L 29/41* (2006.01)
*H01L 29/88* (2006.01)

(52) U.S. Cl.
CPC ........ *H01L 29/068* (2013.01); *H01L 29/0673* (2013.01); *H01L 29/0676* (2013.01); *H01L 29/0895* (2013.01); *H01L 29/122* (2013.01); *H01L 29/127* (2013.01); *H01L 29/24* (2013.01); *H01L 29/413* (2013.01); *H01L 29/66439* (2013.01); *H01L 29/7613* (2013.01); *H01L 29/882* (2013.01); *Y10S 977/774* (2013.01); *Y10S 977/937* (2013.01)

(56) References Cited

U.S. PATENT DOCUMENTS

| | | |
|---|---|---|
| 7,465,953 B1 | 12/2008 | Koh et al. |
| 7,875,958 B2 * | 1/2011 | Cheng .................... B82Y 10/00 257/190 |
| 2009/0072137 A1 | 3/2009 | Hunt et al. |
| 2009/0162963 A1 | 6/2009 | Tansu et al. |
| 2010/0207101 A1 | 8/2010 | Register, II et al. |

* cited by examiner

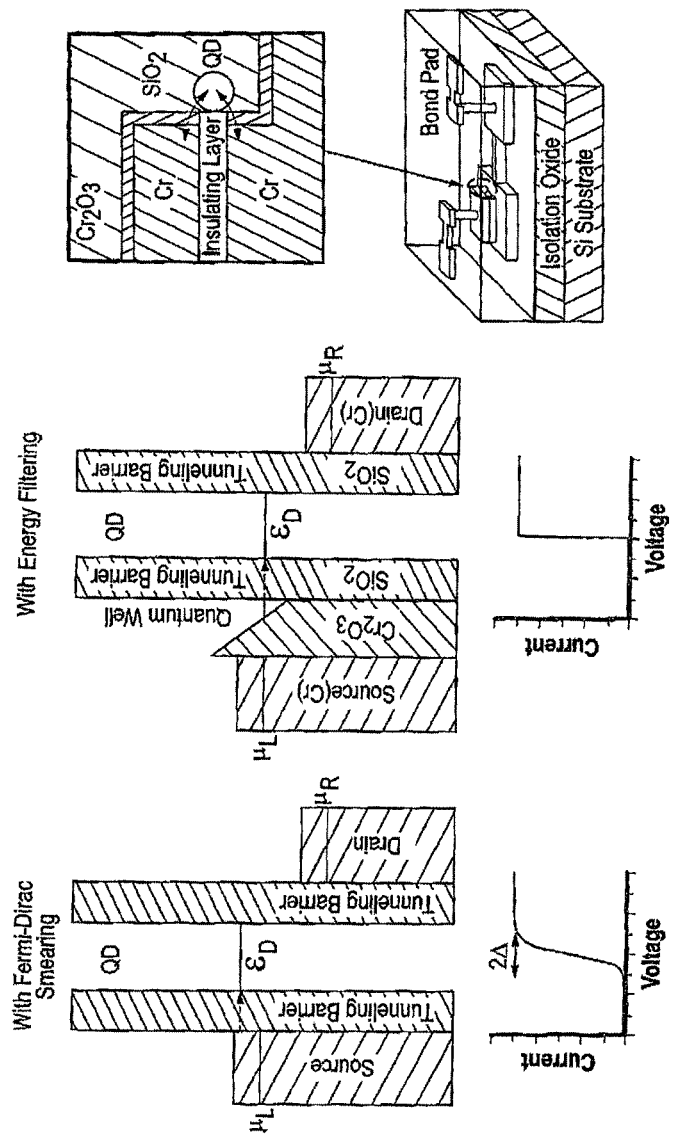

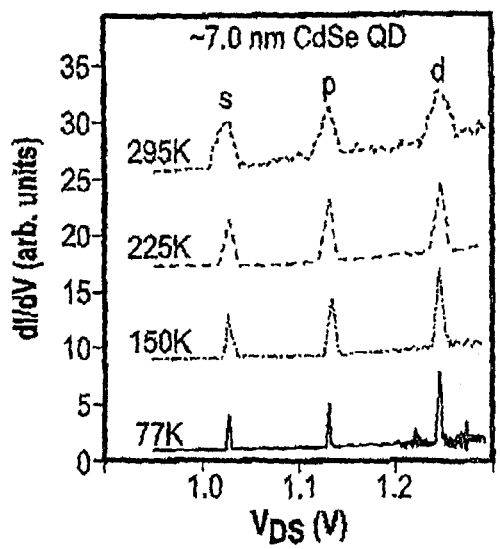 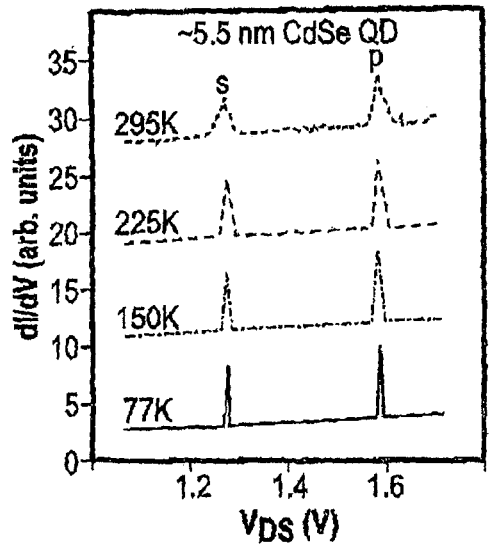
*FIG. 3A*  *FIG. 3B*
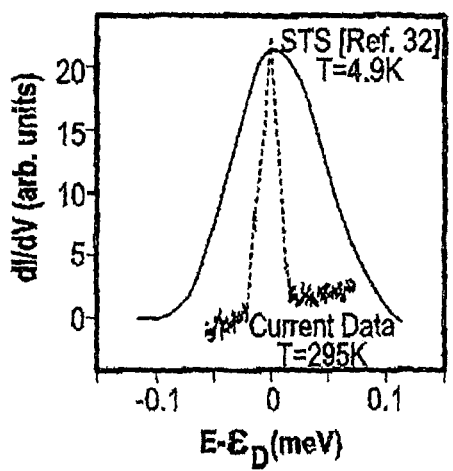 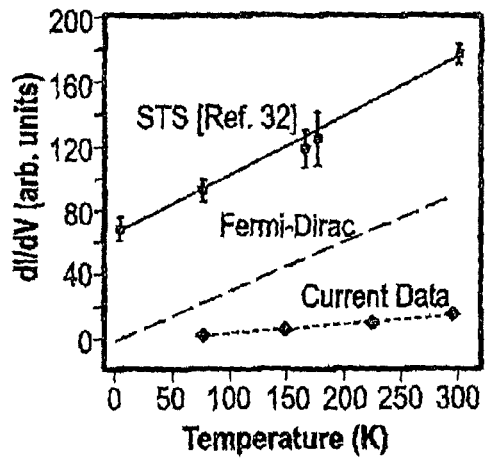
*FIG. 3C*  *FIG. 3D*

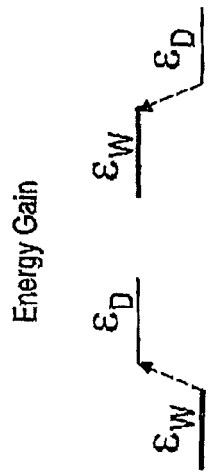
FIG. 10B
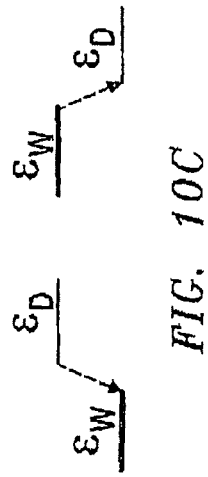
FIG. 10C
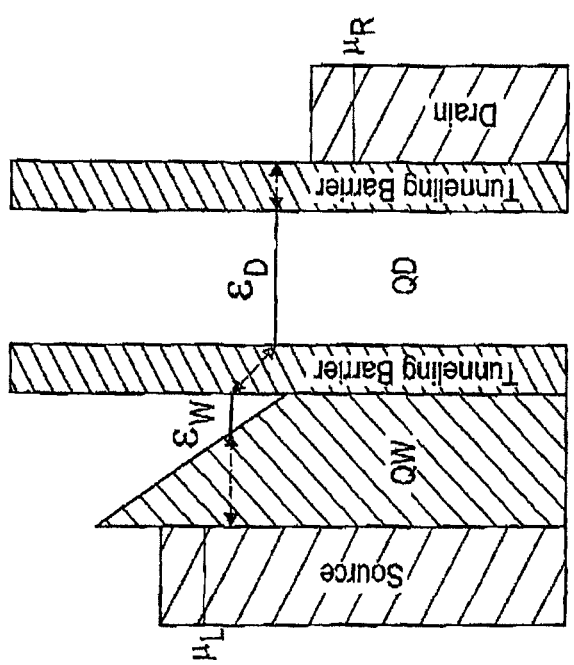
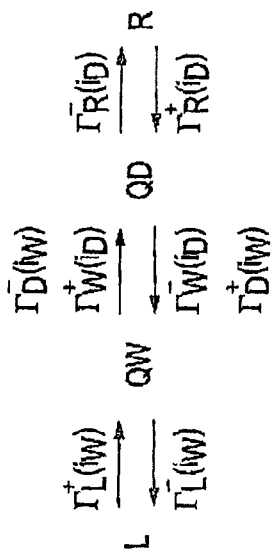
FIG. 10A

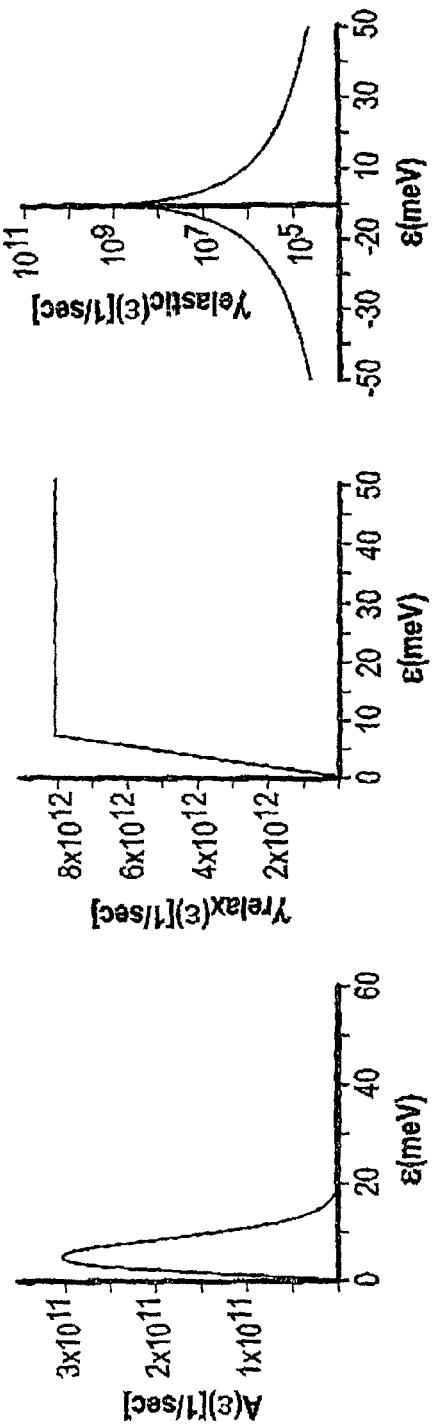

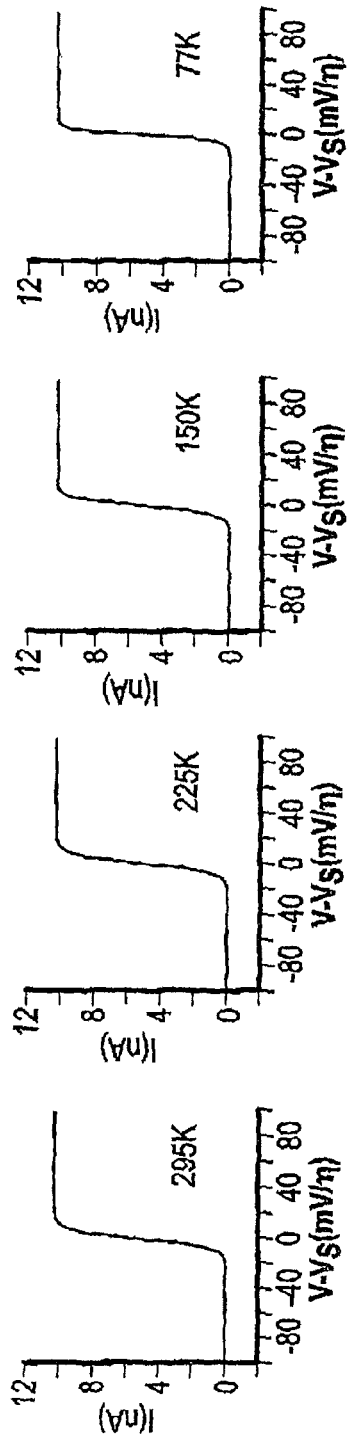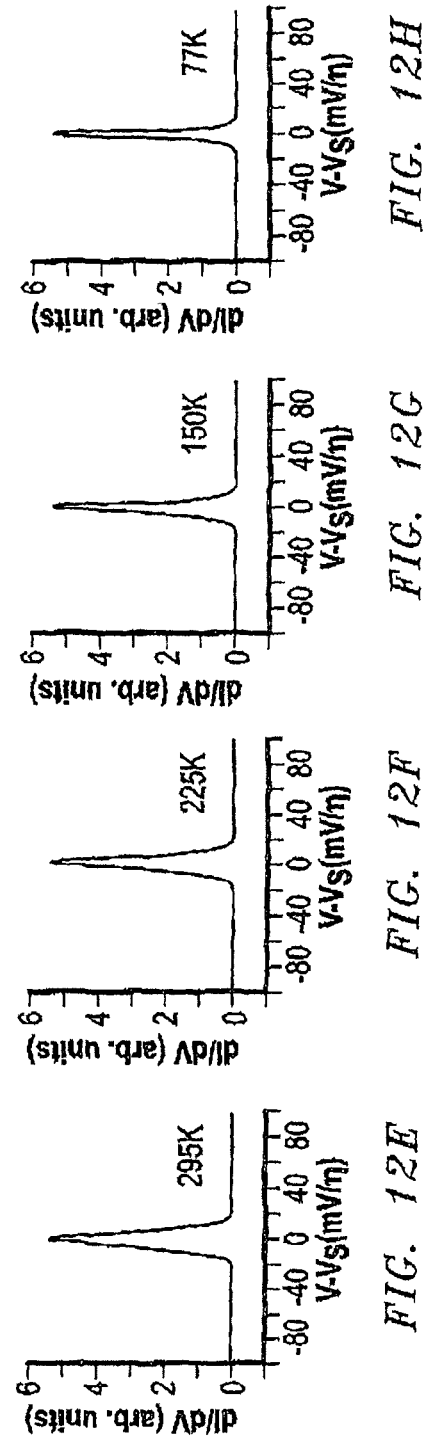

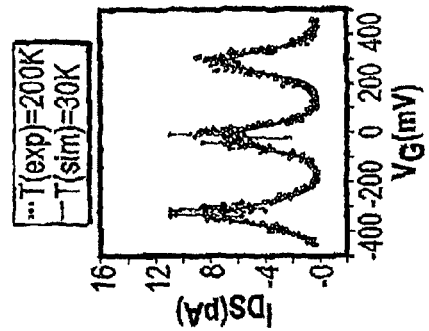
FIG. 13E
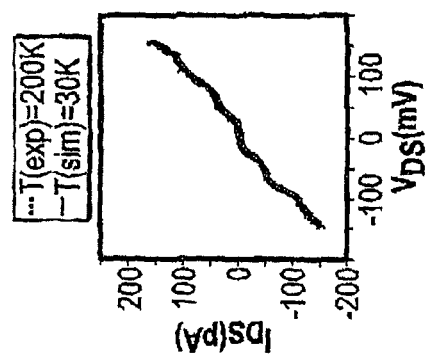
FIG. 13F
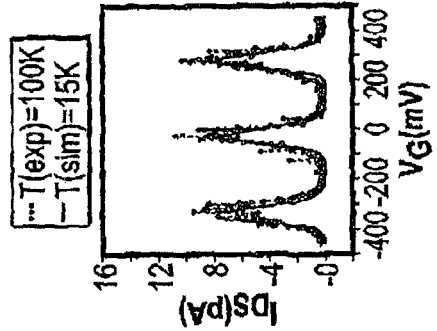
FIG. 13G
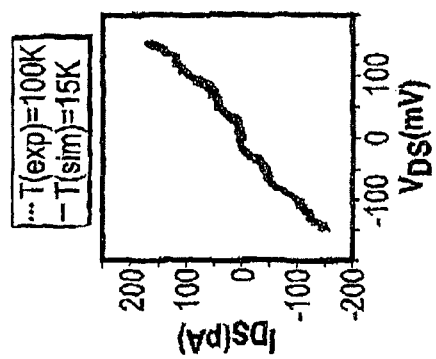
FIG. 13H
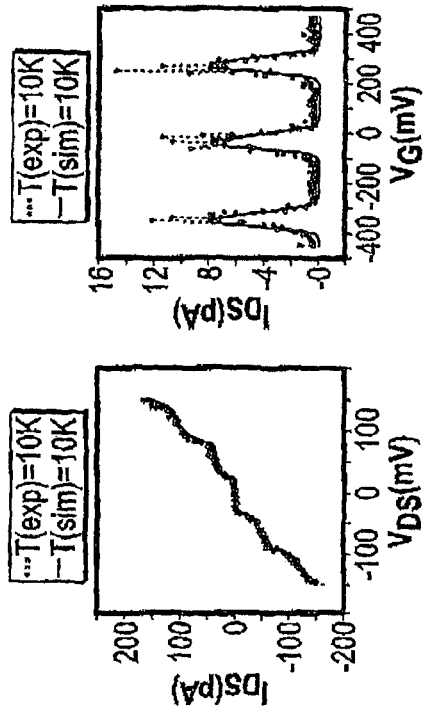
FIG. 13I
FIG. 13J
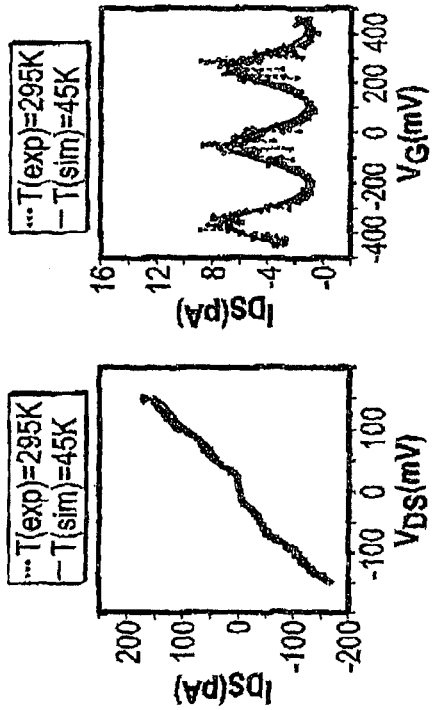
FIG. 13K
FIG. 13L

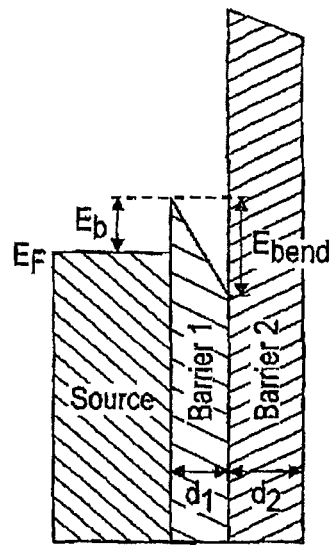
FIG. 14
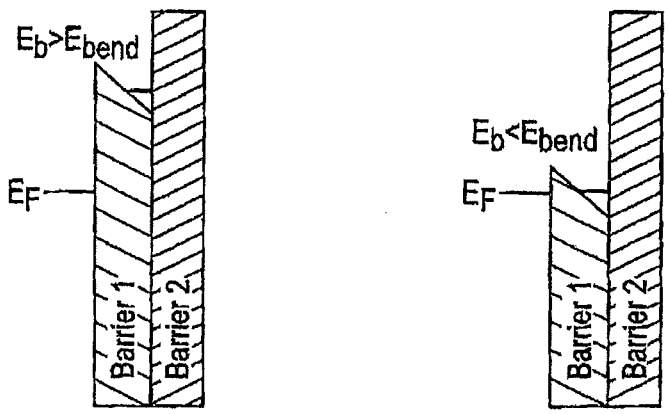
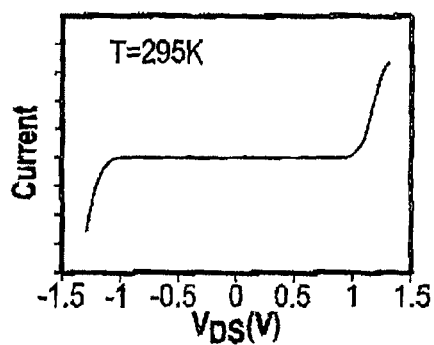
FIG. 15A
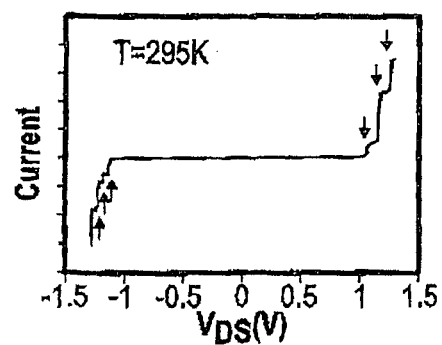
FIG. 15B

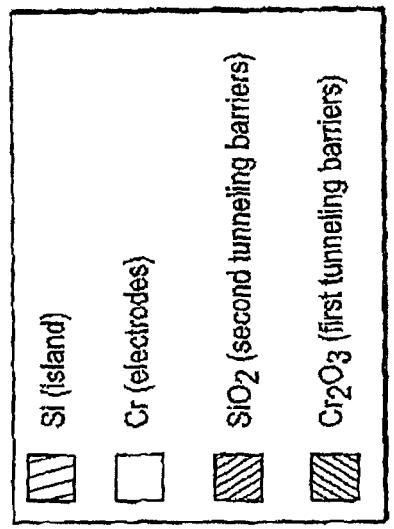
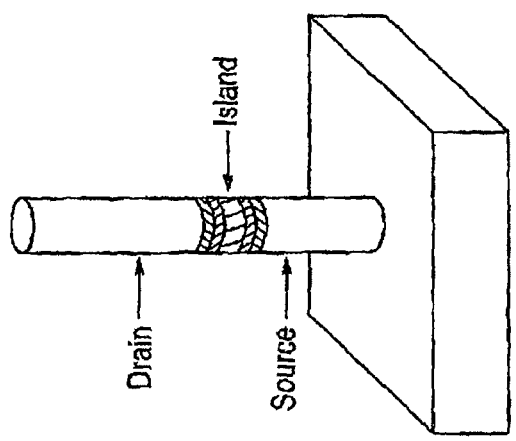
FIG. 18

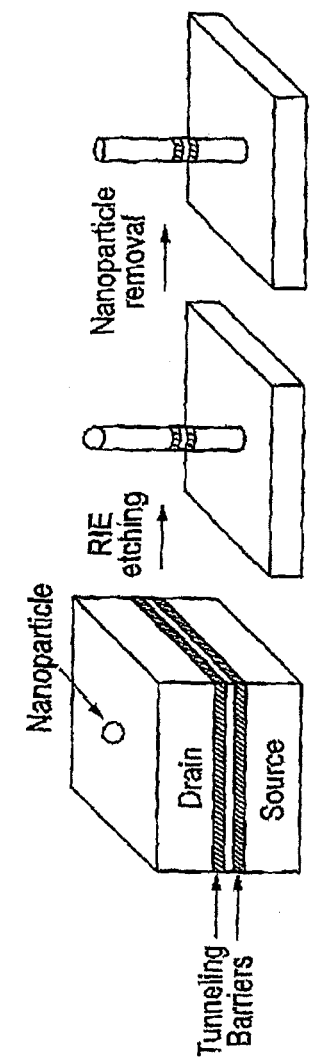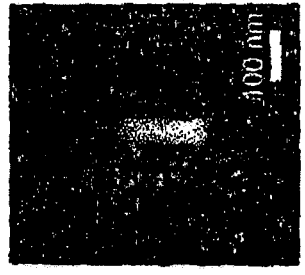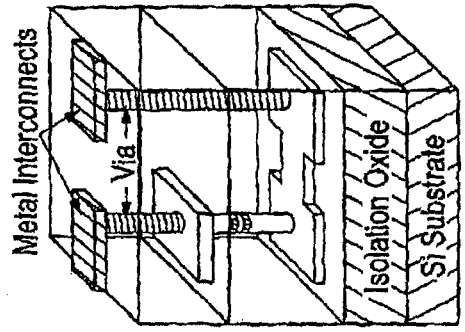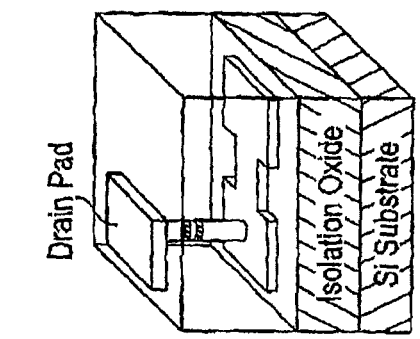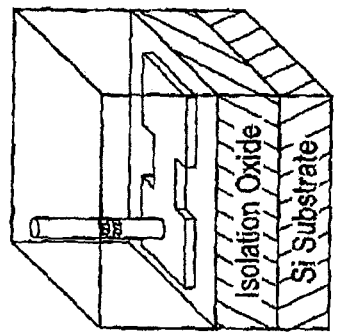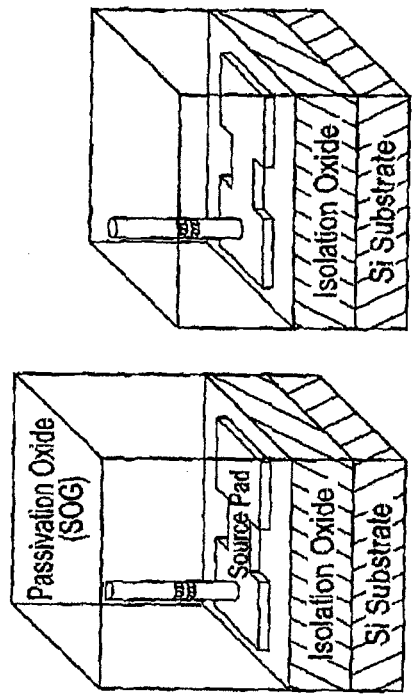

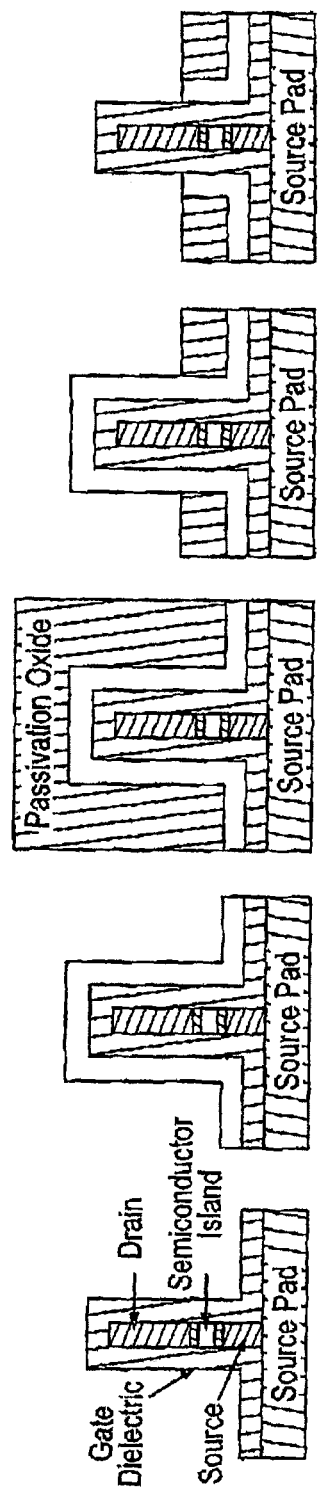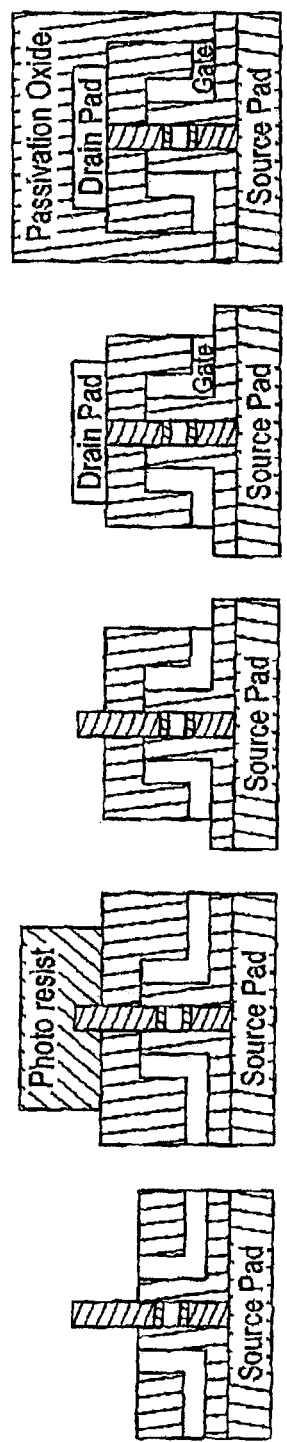

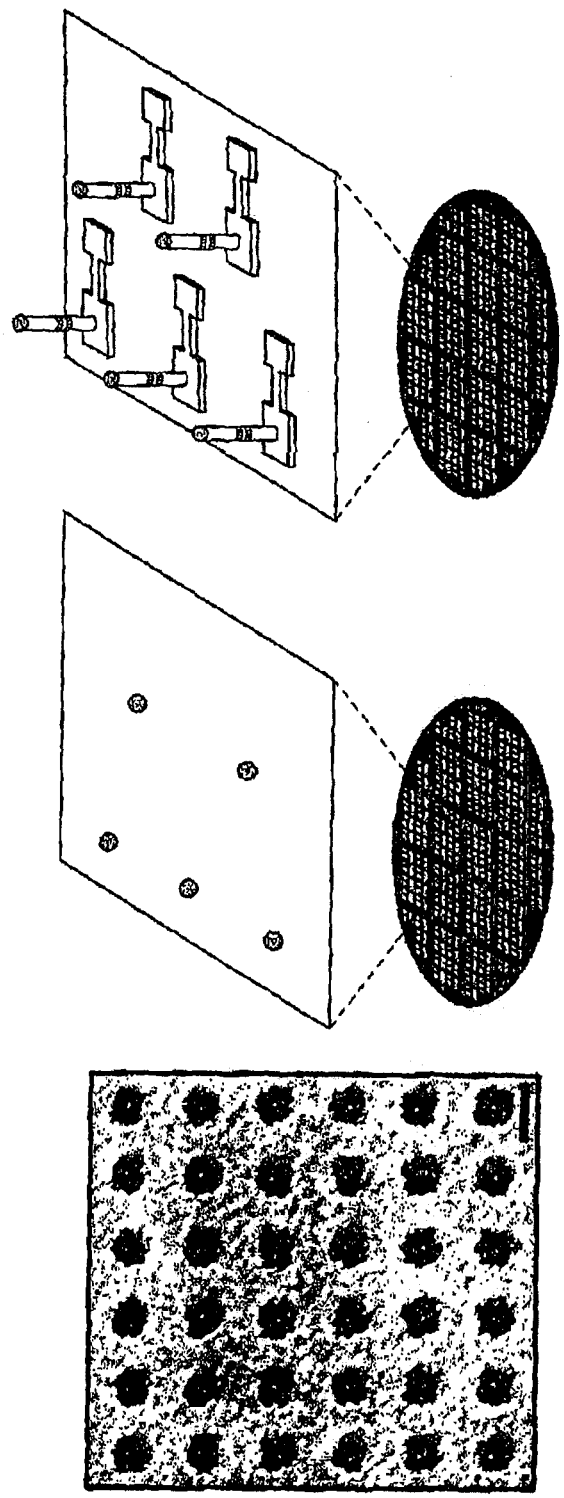

Cross Sectional View

Top View

Mask 1: Definition of Central Island

Mask 2: Definition of Source and Drain

Mask 3: Definition of Gate

Mask 4: Definition of Via Holes

Mask 5: Definition of Metal Interconnects

ENERGY-FILTERED COLD ELECTRON DEVICES AND METHODS

CROSS-REFERENCE TO RELATED APPLICATIONS

This application is a U.S. national stage application under 35 U.S.C. §371 of International Application No. PCT/US2015/014258, filed Feb. 3, 2015, which claims priority pursuant to 35 U.S.C. §119 to U. S. Provisional Patent Application Ser. No. 61/935,493, filed Feb. 4, 2014, and U. S. Provisional Patent Application Ser. No. 62/032,554, filed Aug. 2, 2014, each of which is hereby incorporated by reference in its entirety.

FIELD OF INVENTION

The present invention relates generally to the field of electronics and, more particularly, to electronic devices and methods for ultralow-power-dissipation electronics.

BACKGROUND ART

At finite temperatures, electrons in solids are thermally excited in accordance with the Fermi-Dirac distribution. This electron thermal excitation obscures or nullifies many novel and technologically important phenomena in various electron systems. For example, it can wipe out the Coulomb blockade in single-electron systems [1,2] and deteriorate the efficiency of spin-valve effect in spintronic systems [3,4]. Electron thermal excitation can also significantly degrade the performance of more mainstream electronic devices. For example, it is the root cause of excessive power dissipation in metal-oxide-semiconductor field-effect transistors (MOSFET); the electron thermal excitation prevents a steep turning-on/off of electric current, limiting the subthreshold swing to ~60 mV/decade at room temperature, causing excessive power dissipation [5-7]. These are just a few examples, but the negative effect of electron thermal excitation prevails in solid-state electron systems in general. Therefore, if there were a method that could enable manipulation of electron thermal excitation, a broad range of scientific and technological benefits would be expected.

Previous studies by others have demonstrated that it is possible to suppress electron thermal excitations and obtain low electron temperatures by utilizing discrete energy levels present in quantum dots. If electron transport is made to occur through a discrete energy level, it can serve as an energy filter (or thermal filter) since only those electrons whose energies match the discrete energy level are allowed to participate in the transport. This has been experimentally demonstrated using double quantum dot systems, in which the first quantum dot adjacent to the source electrode serves as an energy filter, passing only cold electrons to the second quantum dot [8-10]. In a similar manner, it has also been demonstrated that the discrete energy levels or superconducting energy gaps can be utilized for quantum cooling of electron gases through energy-selective electron tunneling [11-15]. Until now, studies have been focused on obtaining ultralow sub-Kelvin electrons and investigating their novel phenomena, while the entire system is cooled to cryogenic temperatures, typically less than 1 K [8-15], regimes not suitable for practical applications.

SUMMARY OF THE INVENTION

This present invention provides new electronic devices, hereinafter referred to as energy-filtered cold electron devices, which can effectively suppress the Fermi-Dirac electron thermal excitation, lower electron temperature, decrease power dissipation by achieving an extremely small subthreshold swing of less than 10 mV/decade at room temperature which in turn reduces the supply voltage to less than 0.1V. A discrete energy state obtained in the quantum well serves as an energy filter which can suppress the Fermi-Dirac smearing of electrons and hence effectively lower the electron temperature, leading to an extremely small subthreshold swing at room temperature. The present invention is primarily targeted at solving the problem of high power dissipation and power consumption in electronic devices, which can effectively increase the battery life of laptops, smart phones and other electronic gadgets. For military purposes, it is targeted at effectively reducing the weight of equipment carried by a soldier. This could mean a 90% reduction in total weight of equipment that requires battery power.

The present invention demonstrates that cold electrons whose effective temperature is as low as ~45 K can be created and transported at room temperature without any physical cooling using a structure having a sequential arrangement of a source electrode, a quantum well (QW), a quantum dot (QD) and a drain electrode, in which a discrete state of the QW serves as an energy filter as electrons are transported from the source to the drain. The key aspect of this approach is that once electrons are filtered by the QW state, they cannot gain energy because no path exists for electron excitation (except for the phonon absorption), and therefore, the electrons remain cold until transported to the drain. This method holds promise for being used as a general strategy to raise the low-temperature operation regimes of various electron systems to room temperature or greatly enhance the performance of electron systems at room temperature. This is demonstrated with two examples. First, cold electrons are used in single-electron transistors, in which energy-filtered cold electrons eliminate the need of the cooling liquid and produce Coulomb staircase and Coulomb oscillations at room temperature. Second, the cold electrons enable an extremely steep current turn-on/off capability of ~10 mV/decade at room temperature, a critical advancement that would pave routes to the realization of ultralow-power-dissipation electronics.

The present invention provides an energy-filtered cold electron device that includes a first electrode disposed on an isolation layer, an insulation layer disposed on the first electrode, a second electrode disposed on the insulating layer, and a first tunneling barrier spontaneously formed or deposited on each outer surface of the first electrode and the second electrode. The first electrode, the insulating layer, the second electrode and the first tunneling barrier form a stack having an exposed insulating layer sidewalls and an exposed first tunneling barrier sidewalls. Semiconductor or metal nanoparticles are attached on the exposed insulating layer sidewalls. A second tunneling barrier is formed from a dielectric material disposed between the semiconductor or metal nanoparticles and the exposed first tunneling barrier sidewalls. Quantum wells or quantum dots are formed in the conduction band of the first tunneling barrier. Discrete energy levels are formed in the quantum wells or quantum dots.

In addition, the present invention provides a method for fabricating an energy-filtered cold electron device that includes the steps of depositing a first electrode on an isolation layer, depositing an insulation layer on the first electrode, depositing a second electrode on the insulating layer, and dispositing or spontaneously forming a first tunneling barrier on each outer surface of the first electrode and the second electrode. The first electrode, the insulating layer, the second electrode and the first tunneling barrier form a stack having an exposed insulating layer sidewalls and an exposed first tunneling barrier sidewalls. Additional steps include attaching semiconductor or metal nanoparticles on the exposed insulating layer sidewalls, and forming a second tunneling barrier by depositing a dielectric material between the semiconductor or metal nanoparticles and the exposed first tunneling barrier sidewalls.

Moreover, the present invention provides an energy-filtered cold electron nanopillar device that includes a first electrode disposed on an isolation layer, a first tunneling barrier disposed on the first electrode, a second tunneling barrier disposed on the first tunneling barrier, an island material comprised of a semiconductor or metal disposed on the second tunneling barrier, an additional second tunneling barrier disposed on the island material, an additional first tunneling barrier disposed on the additional second tunneling barrier, and a second electrode disposed on the additional first tunneling barrier. The first electrode, the first tunneling barrier, the second tunneling barrier, the island material, the additional second tunneling barrier, the additional first tunneling barrier and the second electrode form a nanopillar. Quantum wells or quantum dots are formed in the conduction bands of the first tunneling barrier and the additional first tunneling barrier. Discrete energy levels are formed in the quantum wells or quantum dots.

Furthermore, the present invention provides a method for fabricating an energy-filtered cold electron nanopillar device that includes the steps of depositing a first electrode on an isolation layer, depositing or spontaneously forming a first tunneling barrier on the first electrode, depositing a second tunneling barrier on the first tunneling barrier, depositing an island material on the second tunneling barrier, depositing an additional second tunneling barrier on the island material, depositing or spontaneously forming an additional first tunneling barrier on the additional second tunneling barrier, depositing a second electrode on the additional first tunneling barrier, depositing a nanoparticle on the second electrode, producing a nanopillar using a vertical etching process and the nanoparticle as an etching hard mask, and removing the nanoparticle.

The present invention also provides a device component that injects electrons or holes having an electrode, a quantum well disposed adjacent to the electrode in which the energy level spacing of the quantum well is at least 250 meV or larger, and a tunneling barrier disposed adjacent to the quantum well.

The device component that injects electrons or holes can be fabricated by depositing an electrode on a substrate, forming a quantum well adjacent to the electrode, and forming a tunneling barrier adjacent to the quantum well.

Similarly, the present invention provides a device component that injects electrons or holes having an electrode, a quantum dot disposed adjacent to the electrode in which the energy level spacing of the quantum dot is at least 250 meV or larger, and a tunneling barrier disposed adjacent to the quantum dot.

The device component that injects electrons or holes can be fabricated by depositing an electrode on a substrate, forming a quantum dot adjacent to the electrode, and forming a tunneling barrier adjacent to the quantum dot.

The present invention provides a method for operating an energy-filtered cold electron transistor by providing the energy-filtered cold electron transistor having a first electrode, a second electrode, a gate electrode and an electron energy filter disposed between the first electrode and the second electrode, wherein the electron energy filter comprises a quantum well, filtering out any thermally excited electrons using the electron energy filter by a discrete state of the quantum well at room temperature, transporting only energy-filtered cold electrons between the first and second electrodes, and controlling the transport of the energy-filtered cold electrons using the gate electrode.

In addition, the present invention provides an energy-filtered cold electron transistor that includes a central island, a second tunneling barrier, an additional second tunneling barrier, a first tunneling barrier, an additional first tunneling barrier, a first electrode, a second electrode, a gate dielectric and an a gate electrode. The central island is disposed on an isolation layer and has at least a first wall and a second wall. The second tunneling barrier is disposed on the first wall of the central island. The additional second tunneling barrier is disposed on the second wall of the central island. The first tunneling barrier is disposed on the second tunneling barrier and a first portion of the isolation layer. The additional first tunneling barrier is disposed on the additional second tunneling barrier and a second portion of the isolation layer. The first electrode is disposed on the first tunneling barrier above the first portion of the isolation layer and adjacent to the first tunneling barrier disposed on the second tunneling barrier. The second electrode is disposed on the additional first tunneling barrier above the second portion of the isolation layer and adjacent to the additional first tunneling barrier disposed on the additional second tunneling barrier. The gate dielectric is disposed above a portion of the first electrode, the first tunneling barrier, the second tunneling barrier, the central island, the additional second tunneling barrier, the additional first tunneling barrier and a portion of the second electrode. Alternatively, the gate dielectric is disposed only above the central island. The gate electrode is disposed on the gate dielectric.

Moreover, the present invention provides a method for forming an energy-filtered cold electron transistor by providing a substrate, forming or depositing an isolation layer on the substrate, forming or depositing a semiconductor material or a metal on the isolation layer, forming or depositing a sacrificial material on the semiconductor material or the metal, and forming a central island by etching or removing the sacrificial material and the semiconductor material or the metal around the central island. A second tunneling barrier material is formed or deposited around the semiconductor material or the metal of the central island. The second tunneling barrier material forms a second tunneling barrier on a first side of the central island and an additional second tunneling barrier on a second side of the central island. A first tunneling barrier material is formed or deposited on top and around the sacrificial material on the central island, on the second tunneling barrier, and on the isolation layer. The first tunneling barrier material forms a first tunneling barrier adjacent to the second tunneling barrier and an additional first tunneling barrier adjacent to the additional second tunneling barrier. An electrode material is formed or deposited on the first tunneling barrier to form a first electrode adjacent to the first tunneling barrier and a second electrode adjacent to the additional first tunneling barrier. All materials above a plane substantially level with a top of the first electrode and the second electrode are removed or lifted off. A gate dielectric is formed or deposited above a portion of the first electrode, the first tunneling barrier, the second tunneling barrier, the central island, the additional second tunneling barrier, the additional first tunneling barrier and a portion of the second electrode. Alternatively, a gate dielectric is formed or deposited only above the central island. A gate electrode is formed or deposited on the gate dielectric.

The present invention is described in detail below with reference to the accompanying drawings.

BRIEF DESCRIPTION OF THE DRAWINGS

The above and further advantages of the invention may be better understood by referring to the following description in conjunction with the accompanying drawings, in which:

FIGS. 1A-1C are schematics of electron energy filtering via electron tunneling through a quantum well state in accordance with one embodiment of the present invention;

FIGS. 3A-3D are graphs showing the effectiveness of the energy filtering manifested in narrow dI/dV peak widths at different temperatures in accordance with one embodiment of the present invention;

FIGS. 10A-10C show the modeling for energy-filtered cold electron transport in accordance with one embodiment of the present invention;

FIGS. 11A-11C are graphs showing the functions used in the numerical calculations in accordance with one embodiment of the present invention;

FIGS. 12A-12I are graphs showing the calculated results for the model for energy-filtered cold electron transport in accordance with one embodiment of the present invention;

FIGS. 13A-13L show an application of energy-filtered cold electron transport to single-electron transistors (SETs) in accordance with one embodiment of the present invention;

FIG. 14 is a diagram showing the parameters that affect electron energy filtering in accordance with one embodiment of the present invention;

FIGS. 15A-15B are diagrams and graphs showing the role of energy barrier $E_b$ on the formation of a quantum well and its discrete state in accordance with one embodiment of the present invention;

FIG. 18 illustrates an energy-filtered cold electron device structure that uses a nanopillar configuration in accordance with one embodiment of the present invention;

FIGS. 19A-19D illustrate the process for fabricating nanopillar structures in accordance with one embodiment of the present invention;

FIGS. 20A-20D illustrate the process to make electrical contacts to the nanopillar in accordance with one embodiment of the present invention;

FIGS. 25A-25J illustrate the process flow for a gate insertion into the two-terminal energy-filtered cold electron nanopillar device (cross-sectional view) in accordance with one embodiment of the present invention;

FIGS. 26A-26C illustrate the large-scale fabrication of individually addressable energy-filtered cold electron nanopillar transistors in accordance with one embodiment of the present invention;

DESCRIPTION OF THE INVENTION

Figure 2A:
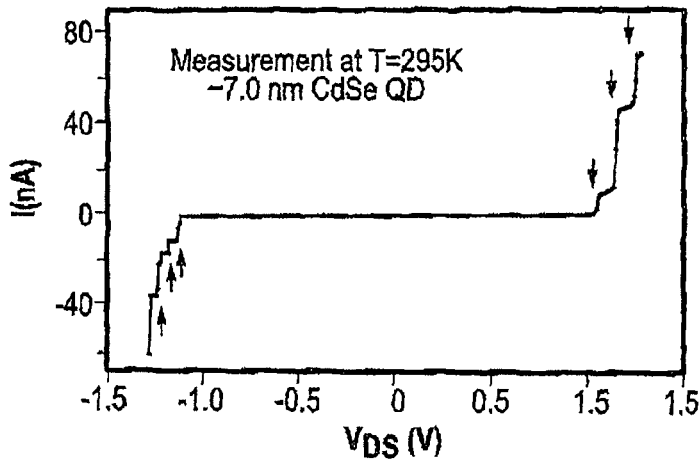
FIGS. 2A-2C are graphs demonstrating energy-filtered cold electron transport at room temperature in accordance with one embodiment of the present invention.

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

Transistors that can operate with extremely low energy consumption would generate a lot of applications for military, commercial, and space use. For example, if the power consumption of battery-powered electronic devices can be reduced by ~100 times, without sacrificing the performance, the battery weight of an instrument would be able to be reduced by ~100 times. This would tremendously increase the capability of numerous military equipment, examples including unmanned aerial vehicles (UAVs), remote communication devices, remote sensing devices, missiles, submarines, aircrafts, and electronic devices that soldiers carry in the battlefield. Commercial applications are also expected to be immense; for example, one may envision cell phones and laptops that can operate for a month without recharging.

The Fermi-Dirac (FD) distribution is a fundamental property that governs the thermal behavior of electrons. At finite temperatures, it leads to thermal smearing of electrons around the Fermi level, which is generally an undesirable effect that sets an intrinsic temperature limit for proper functioning of many electronic, optoelectronic, and spintronic systems. Since the FD distribution cannot be subject to manipulation, the only way to suppress the FD smearing is to reduce the temperature. This intrinsic limitation requires many electronic/spintronic systems to be cooled down to cryogenic temperatures (e.g. <77K) for proper operation, barring their implementations to practical applications. If, however, there exists a way to effectively suppress the FD smearing, many novel electronic/optoelectronic/spintronic systems would be able to operate even at room temperature, leading to numerous military and commercial applications.

The present invention provides a new method of manipulating thermal behavior of electrons in such a way that the FD thermal smearing of electrons is effectively suppressed. The electrons are filtered by a discrete energy level of a quantum well or quantum dot during electron tunneling so that only cold electrons are allowed to participate in the tunneling events. This energy-filtered electron tunneling effectively suppresses the FD thermal smearing or, equivalently, effectively lowers the electron temperature without any physical cooling.

An important application of the energy-filtered electron tunneling is a new type of transistor "energy-filtered cold electron transistor" which can operate with extremely-low power consumption. The extremely large heat generation (power consumption or power dissipation) of the current state-of-the-art transistors originates from the fact that, due to thermally excited electrons following the FD distribution, the transistor cannot be abruptly turned off when voltage is reduced. The present invention overcomes this limitation by filtering the thermally excited electrons and therefore effectively lowering the electron temperature to 45K or below without any physical cooling (i.e., at room temperature), which means that transistors that can operate with extremely-low power dissipation.

Put another way, the key to decreasing the power consumption of transistors is to reduce the subthreshold swing (SS), the measure of how fast a transistor can be turned off below the threshold voltage $V_{th}$. With a low subthreshold swing, the supply voltage $V_{DD}$ can be reduced and hence the power consumption (proportional to the square of $V_{DD}$) while maintaining a low OFF-state current. For the metal-oxide-semiconductor-field-effect-transistor (MOSFET), however, the minimum possible subthreshold swing is 60 mV/decade at room temperature, and $V_{DD}$ which is much smaller than one volt cannot be implemented without having a significant amount of OFF-state current. Since the 60 mV/decade subthreshold swing for MOSFET is set by the thermodynamics (the Fermi-Dirac distribution of electrons), this is an intrinsic value that cannot be further reduced using prior art techniques. Although tunnel field-effect transistors (TFETs) in which interband tunneling is utilized have been actively investigated [7, 80], many challenges exist for TFETs, including controlling very abrupt doping profiles and implementing low bandgap materials into Si platform.

The present invention demonstrates a new type of transistor, named energy-filtered cold electron transistor, which will have subthreshold swing of less than 10 mV/decade at room temperature. With this extremely small subthreshold swing, the supply voltage $V_{DD}$ will be reduced to less than 0.1 V. The key element of this transistor is that its device configuration and materials selection produce an electron energy filter, which effectively suppresses the Fermi-Dirac distribution of electrons resulting in an effective electron temperature of 45K or less without any external cooling. Importantly, the energy-filtered cold electron transistor can be fabricated with complete CMOS-compatible processes and materials, which will enable a facile implementation of the energy-filtered cold electron transistors into the mainstream silicon-based IC platform.

As shown in FIG. 1A, the energy filtering structure of the present invention was created by incorporating a quantum well into a double-barrier tunneling junction (DBTJ) configuration. When a voltage bias is applied to the usual DBTJ such that an energy level of the quantum dot $\in_D$ is brought close to the Fermi level $\mu_L$ of the source electrode, electrons can tunnel from the source to the QD, resulting in a current onset in the I-V characteristics as shown in FIG. 1A (bottom). At finite temperatures, however, this current onset is not abrupt because thermally excited electrons in the source electrode can tunnel to the QD even if $\in_D$ is positioned above $\mu_L$ (red arrow in FIG. 1A). This situation changes dramatically if a quantum well is inserted between the source and the tunneling barrier as shown in FIG. 1B. In this case, the electron transport from the quantum well energy level $\in_W$ to the QD energy level $\in_D$ can occur only if $\in_D$ is equal to or lower than $\in_W$ (red arrow in FIG. 1B) [16]. If $\in_D$ is positioned above $\in_W$, the transport will be blocked since there is no available excitation path (except for the phonon absorption that can occur when the energy level offset is small, which will be discussed below). This will produce an abrupt current step where the current onset corresponds to the alignment of $\in_W$ and $\in_D$ as shown in FIG. 1B (bottom).

The quantum well is formed between the source and the tunneling barrier on the source side ($SiO_2$) by using Cr as the source electrode, for which a thin layer (~2 nm) of $Cr_2O_3$ is naturally formed on the Cr surface and serves as the quantum well material as shown in FIG. 1B. Here the interface dipoles and/or interface charges that spontaneously form at the $Cr_2O_3/SiO_2$ interface [17-20] induce a band bending of the $Cr_2O_3$ conduction band, producing the quantum well [21-25]. The discrete energy state in the quantum well serves as an energy filter for the injection of electrons to the QD. This energy filtering effectively suppresses the Fermi-Dirac ("FD") smearing of electrons on the electrode, or, equivalently, effectively lowers the electron temperature, leading to an extremely small subthreshold swing, <10 mV/decade at room temperature. This energy filtering structure was fabricated in a three-dimensional configuration shown in FIG. 1C using CMOS-compatible processes and materials. It is important to note that the fabrication of this structure does not require any elaborate procedures involved in forming 2-D electron gases (2DEG) and creating QDs in the 2DEG, so that the fabrication can be carried out on a large scale using the CMOS-compatible processes and materials [26]. In this configuration, the electrodes (Cr) are vertically separated by an insulating layer ($SiO_2$ or $Al_2O_3$), the QD is positioned at the sidewall of the insulating layer, and the $SiO_2$ between the QD and electrode serves as an additional tunneling barrier. CdSe nanoparticles were used as QDs to investigate the electron transport through their discrete energy states. The energy level separation in the 2DEG QDs of prior art is much smaller than the room-temperature thermal energy (~25 meV), so that the energy-filtering does not work at room temperature for the prior art configurations and materials. In the present invention, the quantum well is formed in the thin tunneling barrier (~2 nm), producing quantum well states whose energy separations are much larger than the room-temperature thermal energy, enabling energy filtering at room temperature.

FIG. 2A shows the I-V characteristics measured at room temperature for a unit fabricated with the structure shown in FIG. 1C in which a ~7.0 nm CdSe nanoparticle was used as the QD. Abrupt current jumps (indicated by arrows) are clearly resolved, which reveals that the energy filtering and subsequent cold electron transport work extremely well at room temperature. Each current jump corresponds to the alignment of an energy level of the CdSe QD with the QW energy level $\in_W$, where s, p, and d represent the first three levels in the conduction band of the CdSe QD and $h_1$, $h_2$, and $h_3$ the first three levels in the valance band. A clear zero-conductance gap (~2.2 V), which originates from the band gap of the CdSe QD, can also be seen.

Figure 2B:
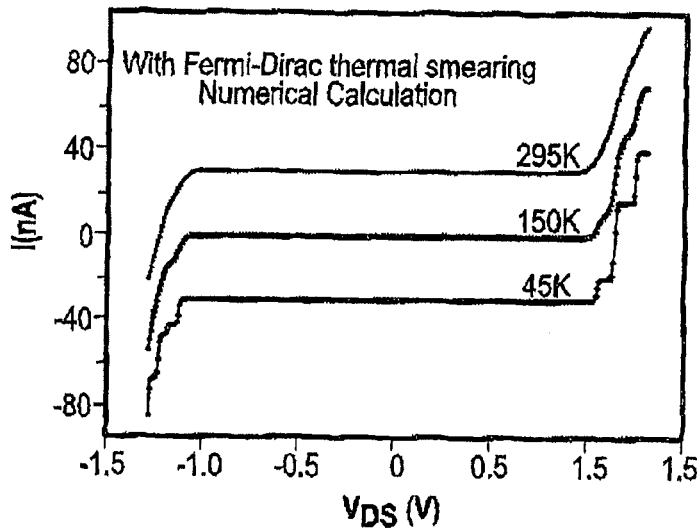

For electron transport without the energy filtering, these abrupt current steps can be obtained only at low temperatures. FIG. 2B shows numerically calculated I-Vs at varying temperatures in which the Fermi-Dirac thermal excitation governs their temperature behavior. The experimental I-V in FIG. 2A can be achieved only when the temperature is brought to ~45 K (blue in FIG. 2B), where thermal excitation is sufficiently suppressed. At room temperature, all the current steps are wiped out due to Fermi-Dirac thermal smearing (green in FIG. 2B). Note that the I-Vs are vertically displaced by 30 nA for clarity. Experimentally, electron transport through a QD in the usual DBTJ was extensively studied by others using scanning tunneling microscopy (STS) [27-31]. Note that their well-resolved current steps were observed only at low temperatures (<5 K), most often accompanied by non-thermal broadening factors, such as optical phonon contributions [27-34]. For example, the I-V characteristics obtained for a CdSe QD showed that the broadening $\Delta$ (definition in FIG. 1A) in the current steps is ~50 mV at 4.5 K [30]. On the other hand, the method in accordance with the present invention led to much more abrupt current steps even at room temperature: $\Delta$ is only ~20 mV at 295 K (FIG. 2A).

Figure 2C:
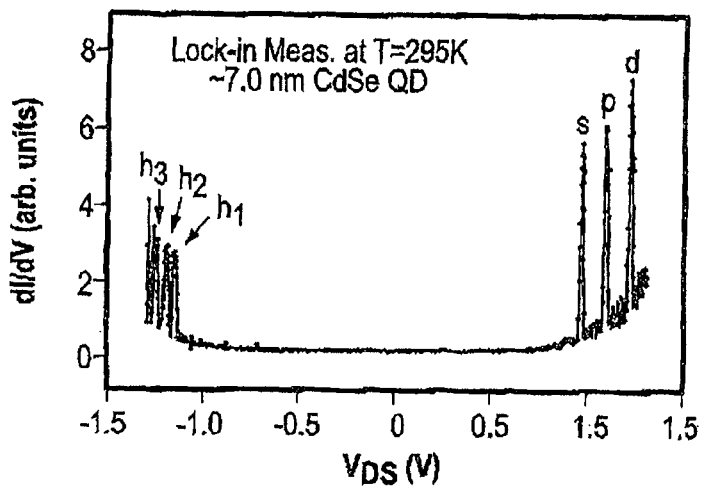

To further investigate the abrupt current jumps in FIG. 2A, independent direct differential conductance (dI/dV) measurements were carried out using the lock-in technique at room temperature as shown in FIG. 2C (the data in FIGS. 2A and 2C are from different units). The first three QD levels in the conduction and valence band are labeled s, p, d and $h_1$, $h_2$, $h_3$, respectively. One observes well-resolved peaks, each corresponding to the current step (marked by the arrow) in the I-V measurement in FIG. 2A. The peak widths in FIG. 2C are extremely narrow; the full widths at half maximum (FWHMs) of the peaks are only ~18 meV. Were the usual Fermi-Dirac thermal smearing in effect, the same FWHMs could have been obtained only when the temperature were lowered to ~45 K, according to numerical calculation. In other words, the usual FD thermal smearing should have produced ~100 mV FWHMs and the measurement in FIG. 2C demonstrates that a factor of >~5 suppression of the FD smearing has been obtained.

Temperature Dependence

To investigate the effect of temperature on the energy filtering, differential conductance measurements (using lock-in) were carried out at varying reservoir temperatures, ranging from 77K to 295K. FIG. 3A displays differential conductances obtained from a unit in which a ~7 nm CdSe nanoparticle was used as the QD. The peak widths decrease as the temperature is lowered; the FHWMs are ~17, ~10, ~8 and ~4 mV at 295, 225, 150 and 77 K, respectively. At each temperature, the peak widths are the same for all s, p and d peaks.

The small FWHMs and their temperature dependence in FIG. 3A will prevail without regard to any specific energy level of a QD since the energy filtering occurs through an energy level of the QW, not the QD. To verify this, a unit was fabricated having a ~5.5 nm CdSe QD as its central island. Differential conductance measurements at varying temperatures are shown in FIG. 3B. Their peak positions well reflect the size dependence of QD energy levels, in agreement with the literature [29, 35-39]; compared to the unit with ~7 nm CdSe QD (FIG. 3A), the unit with ~5.5 nm CdSe QD shows a higher conduction band onset (at ~1.3 V) and a larger s-p level separation (~240 mV). Nevertheless, the peak widths and their temperature dependence are essentially the same in FIGS. 3A and 3B, demonstrating that the same energy filtering process is in effect without regard to a specific QD energy level structure (see also below).

Note that the peak widths in the differential conductance measurements, in FIGS. 3A-3B, are much narrower than those observed by others in STS measurements of QDs in the DBTJ configuration [27-34] (e.g., FWHM reaches as small as ~3 meV at 77K). For the latter, the FWHMs are typically larger than ~50 mV even at cryogenic temperatures (<5 K). For example, a comparison in FIG. 3C shows that the peak from room temperature measurement in this invention (green) is much narrower than the one from an STS measurement of a CdSe QD at 4.9 K (red) [32].

For the experimental temperature range of 77K-295K, a linear relationship was found between the FWHMs and the temperature, which is displayed in FIG. 3D (green). The temperature dependences of the FWHMs which result from electron transport without the energy filtering are also shown in FIG. 3D, one from calculations based on Fermi-Dirac electron energy distribution (blue line), which will be described below, and the other from reported STS measurements (red) [32]. Here note that the slope for the experimental STS data is almost the same as that from the Fermi-Dirac smearing calculations, affirming that the STS thermal behavior is governed by the usual Fermi-Dirac smearing. Comparing all three cases in FIG. 3D, it is clear that the present invention has effectively filtered out hot electrons, leading to extremely narrow peak widths over all temperature ranges explored (i.e., suppression of the FD smearing by a factor of ~6.5).

The temperature of electrons is determined by their energy distribution [11, 12], which is reflected on the dI/dV peak widths. One can, therefore, obtain effective electron temperatures of the energy-filtered electrons by comparing the FWHMs of the experiment with those from the Fermi-Dirac smearing calculations. For example, at reservoir temperature of 295 K, the electron temperature becomes ~45 K;

in FIG. 3D, the FWHM from Fermi-Dirac electrons at 45 K is the same as the FWHM from the energy-filtered electrons at reservoir temperature of 295 K. Likewise, electron temperatures of the energy-filtered electrons were obtained as ~35K, ~22K and ~10K for reservoir temperatures of 225K, 150K and 77K, respectively (see below). These cold electrons promise numerous practical applications as will be discussed below.

Figure 4:
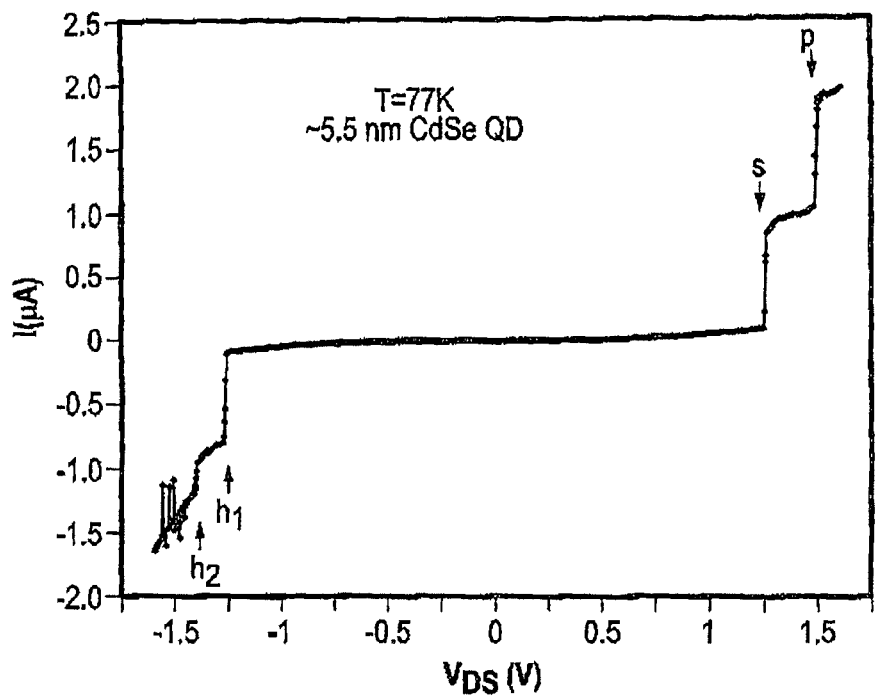
FIG. 4 is a graph showing the I-V characteristics of a unit with ~5.5 nm CdSe QD in accordance with one embodiment of the present invention.

As described above, FIG. 3B shows direct dI/dV measurements (using the lock-in technique) for a unit having a ~5.5 nm CdSe QD. The I-V measurements were also carried out for the same unit as shown in FIG. 4. The I-V shows clear current steps (indicated by the arrows), each corresponding to an alignment of the QW energy level $\in_W$ with a discrete energy level of the QD. Labels s, p and $h_1$, $h_2$ indicate the first two peaks in the conduction and valence band, respectively. The separation between the first two arrows in the positive bias (labeled s and p) is ~237 meV. This value is the same as the s-p separation in the dI/dV measurements in FIG. 3B.

Figure 5A:
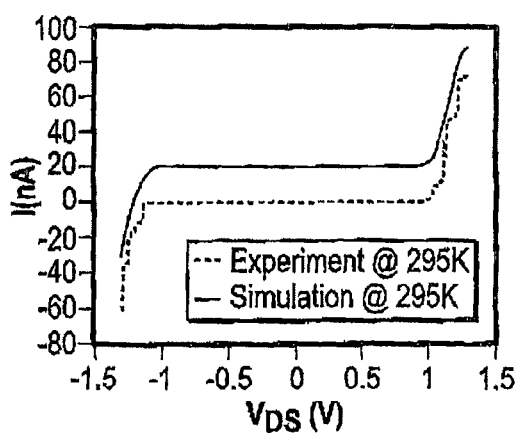
FIGS. 5A-5B are graphs demonstrating effective temperature lowering in accordance with one embodiment of the present invention.
Figure 5B:
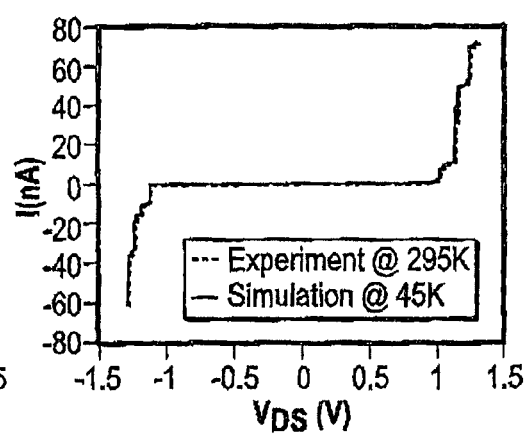

The factor of ~6.5 suppression of the FD smearing (FIG. 3D) implies that the electron temperature can be effectively lowered by the same factor. This is demonstrated in FIGS. 5A-5B, in which the room-temperature experimental I-V is compared with simulations at room temperature (FIG. 5A; the simulated I-V is vertically displaced by 20 nA for clarity) and at 45K (=295K/6.5) (FIG. 5B), respectively. Simulation carried out at 295K (FIG. 5A) shows that the abrupt current changes and the current plateaus no longer exist due to the FD smearing. On the other hand, when the effective temperature of 45K is used in the simulation, an excellent agreement between the experiment and the simulation is seen, FIG. 5B. This effective temperature lowering would have enormous practical implications since cryogenic temperatures (<45K) can be obtained without any physical cooling.

Figure 6A:
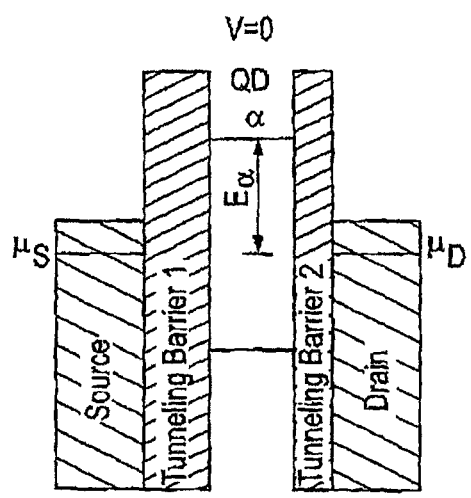
FIGS. 6A-6B are energy diagrams for a DBTJ (double-barrier tunneling junction) for a zero voltage bias and a positive voltage bias, respectively, in accordance with one embodiment of the present invention.
Figure 6B:
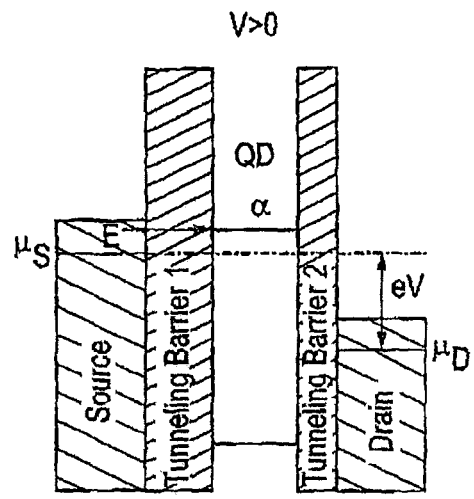

The calculation of the FWHMs for the Fermi-Dirac smearing in FIG. 3D will now be briefly described. FIGS. 6A and 6B are energy diagrams for a DBTJ for a zero voltage bias and a positive voltage bias, respectively. The lightly shaded areas in the electrodes schematically represent the thermal smearing at non-zero temperatures. When a voltage bias is applied as in FIG. 6B, an electron with energy E (which may be different from the source Fermi level $\mu_S$) can tunnel into the QD if E aligns with the QD energy level $\alpha$. For a bias voltage V, the voltage drops across the tunneling barrier 1 and 2 are $\eta V$ and $(1-\eta)V$, respectively, where $\eta$ is the voltage division factor [30, 36] ($\eta = C_2/(C_1+C_2)$, where $C_1$ and $C_2$ are the junction capacitances for barrier 1 and barrier 2, respectively). For the usual DBTJ, first its I-V characteristics are calculated that would result from the Fermi-Dirac distribution of electrons. Then the differential conductance dI/dV is obtained by numerical differentiation of the I-V. The FWHM of the dI/dV peak is analytically obtained. Consider the case in which there is no charge accumulation at the QD, i.e., consider the shell tunneling regime [30, 51]. Since there is no charge accumulation $\Gamma_1$ is much smaller than $\Gamma_2$ ($\Gamma_1$ and $\Gamma_2$: the tunneling rate through junction 1 and junction 2, respectively); once an electron tunnels from the source to the QD (through barrier 1), it tunnels out to the drain (through barrier 2) before the other electron from the source tunnels into the QD. The current is then determined by $\Gamma_1$ (the slower rate). $\Gamma_1(E, V)$, the electron tunneling rate from the source to the QD at electron energy E and voltage bias V, is given by [52]

$$\Gamma_1(E, V) = 2\frac{2\pi}{\hbar}\rho_S(E)\rho_{QD}(E+\eta eV)|T(E)|^2 f(E) \quad (1)$$

where $\rho_S(E)$ and $\rho_{QD}(E)$ are the density of states for the source electrode and the QD, respectively, $f(E)$ is the Fermi-Dirac distribution function of the source with Fermi level at $\mu_S$, $\eta$ is the voltage division factor and $|T(E)|^2$ is the tunneling transmission probability. The electrical current I(V) is obtained by integrating $\Gamma_1(E,V)$ with respect to E, $$I(V) = \qquad (2)$$
$$e\int_0^\infty \Gamma_1(E, V) dE = \frac{4\pi e}{\hbar}\int_0^\infty \rho_S(E)\rho_{QD}(E+\eta eV)|T(E)|^2 f(E) dE$$

where e is the charge of an electron. We simplify equation (2) by approximating $\rho_S(E)$ and $T(E)$ with $\rho_S(E_F)$ and $T(E_F)$, respectively, where $E_F$ ($\approx \mu_S$) is the Fermi energy of the source electrode [52];

$$I(V) \cong \frac{g_0}{e}\int_0^\infty \rho_{QD}(E+\eta eV) f(E) dE \quad (3)$$

where $$g_0 = \frac{4\pi e^2}{\hbar}\rho_S(E_F)|T(E_F)|^2$$

The discrete energy level of the QD is represented by $\rho_{QD}(E)$ with the delta function, $$\rho_{QD}(E)=\delta(E-(E_\alpha+\mu_S)) \quad (5)$$

where $E_\alpha$ is the energy for the QD level $\alpha$ (with its reference energy at $\mu_S$; see FIG. 6A). From equations (3)-(5), we have $$I(V) \cong \frac{g_0}{e}f(E_\alpha+\mu_S-\eta eV) = \frac{g_0}{e}\frac{1}{e^{(E_\alpha-\eta eV)/kT}+1} \quad (6)$$

Figure 7:
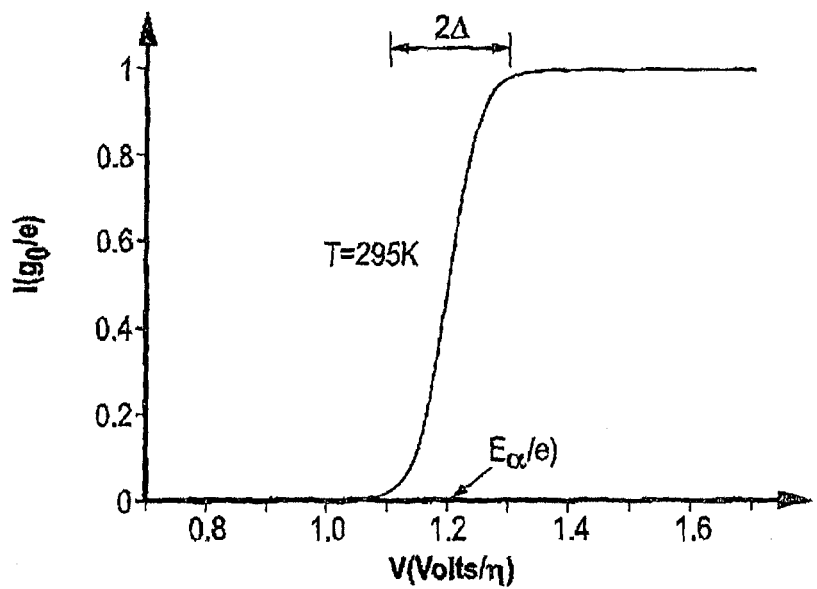
FIG. 7 is a graph showing the I-V characteristics resulting from the Fermi-Dirac thermal smearing in accordance with one embodiment of the present invention.

Equation (6) indicates that with no electron accumulation at the QD the I-V is governed by the Fermi-Dirac distribution in the electrode. FIG. 7 shows the I-V characteristics at 295 K. The I-V relationship from equation (6) with the QD energy level $E_\alpha$ at 1.2 eV and T=295 K. $\Delta$=~90 mV.

The differential conductance dI/dV is obtained from equation (6) as $$\frac{dI(V)}{dV} = \frac{\eta g_0}{kT}\frac{e^{(E_\alpha-\eta eV)/kT}}{[e^{(E_\alpha-\eta eV)/kT}+1]^2} \quad (7)$$

Figure 8:
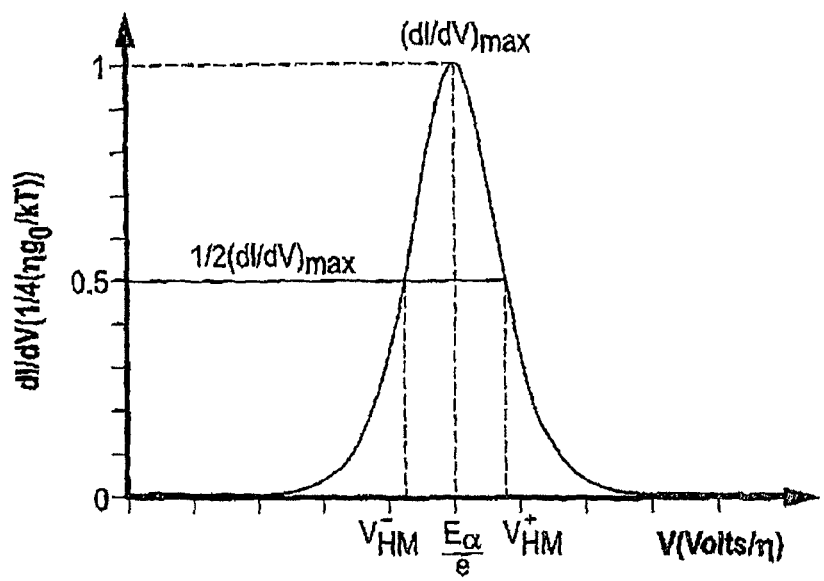
FIG. 8 is a graph showing the differential conductance, dI(V)/dV, that results from the Fermi-Dirac thermal smearing in accordance with one embodiment of the present invention.

FIG. 8 shows the dI/dV relationship from equation (7). The maximum dI/dV is obtained when $V=E_\alpha/\eta e$, $$\left(\frac{dI}{dV}\right)_{max} = \frac{dI(V)}{dV}\bigg|_{V=\frac{E_\alpha}{\eta e}} = \frac{1}{4}\frac{\eta g_0}{kT} \quad (8)$$

The voltages $V_{HM}^+$ and $V_{HM}^-$ are the bias voltages that give the half of the maximum differential conductance value (dI/dV)$_{max}$ and can be obtained from equations (7) and (8) and solving the following equation, $$\frac{\eta g_0}{kT} \frac{e^{(E_\alpha - \eta eV)/kT}}{[e^{(E_\alpha - \eta eV)/kT} + 1]^2} = \frac{1}{2}\left(\frac{dI}{dV}\right)_{max} = \frac{1}{2}\left(\frac{1}{4}\frac{\eta g_0}{kT}\right) \quad (9)$$

By solving equation (9), we have $$V_{HM}^+ = \frac{E_\alpha}{\eta e} - \frac{kT}{\eta e}\ln(3 - 2\sqrt{2}) \quad (10)$$

$$V_{HM}^- = \frac{E_\alpha}{\eta e} - \frac{kT}{\eta e}\ln(3 + 2\sqrt{2})$$

The FWHM (in energy unit) is then $$FWHM = \eta e(V_{HM}^+ - V_{HM}^-) \quad (11)$$
$$= kT[\ln(3 + 2\sqrt{2}) - \ln(3 - 2\sqrt{2})]$$
$$= 3.52549\, kT.$$

When a voltage bias is applied between the source and the drain, the voltage is divided across the barrier 1 and barrier 2. The voltage division factor η is defined such that the voltage drops across junction 1 and junction 2 are $\eta V_{DS}$ and $(1-\eta)V_{DS}$, respectively. One can obtain η from the following relationship [30, 35-36, 53-54]:

$$\eta eV_{zc} = E_g + U = E_{g,optical} + E_{e-h} \quad (12)$$

where e is the charge of an electron, $V_{zc}$ is the zero-conductance gap (voltage difference between the s peak (LUMO) and the $h_1$ peak (HOMO)) in the I-V or dI/dV measurement, $E_g$ is the bandgap of a QD [35, 37, 38] (difference of the single-particle energy levels for LUMO (s) and HOMO ($h_1$)), U is the single-electron charging energy of the QD [30, 36, 53, 55], $E_{g,optical}$ is the optical bandgap [35, 37, 38, 56] and $E_{e-h}$ is the electron-hole Coulomb interaction energy. The $E_{e-h}$ is given by [27, 55, 57, 58]

$$E_{e-h} = \frac{1.79 e^2}{4\pi\varepsilon_0 \varepsilon_{in} R} \quad (13)$$

where $\varepsilon_0$ is the permittivity of free space, $\varepsilon_{in}$ is the dielectric constant of the QD (=8 for CdSe [30]) and R is the radius of the QD. From equations (12) and (13), $$\eta = \left[E_{g,optical} + \frac{1.79 e^2}{4\pi\varepsilon_0 \varepsilon_{in} R}\right] / eV_{zc} \quad (14)$$

From equation (14), one finds that the η's are 0.94 and 0.83 for units in FIGS. 3A and 3B, respectively. Table 1 summarizes the calculations:

TABLE 1

Voltage division factor η for the units in FIGS. 3A and 3B

| Sample | CdSe QD Diameter (nm) | $E_{g,optical}$ (eV) [56] | $E_{e-h}$ (eV) | $V_{zc}$ (V) | η |
|---|---|---|---|---|---|
| Unit in FIG. 3A | 7.0 | 1.937 | 0.092 | 2.169 | 0.94 |
| Unit in FIG. 3B | 5.5 | 2.000 | 0.117 | 2.548 | 0.83 |

For the unit in FIG. 3A, a differential conductance measurement gave the zero-conductance gap $V_{zc}$ as 2.169 V. For the unit in FIG. 3B, the I-V measurement gave the zero-conductance gap $V_{zc}$ as 2.548 V (FIG. 4). The optical bandgaps $E_{g,optical}$ were obtained from the reference 56 using nominal CdSe QD sizes.

The differential conductance measurements in FIGS. 3A and 3B show that the peak widths decrease with decreasing temperatures. Their functional relationship is linear as detailed below.

Figure 9:
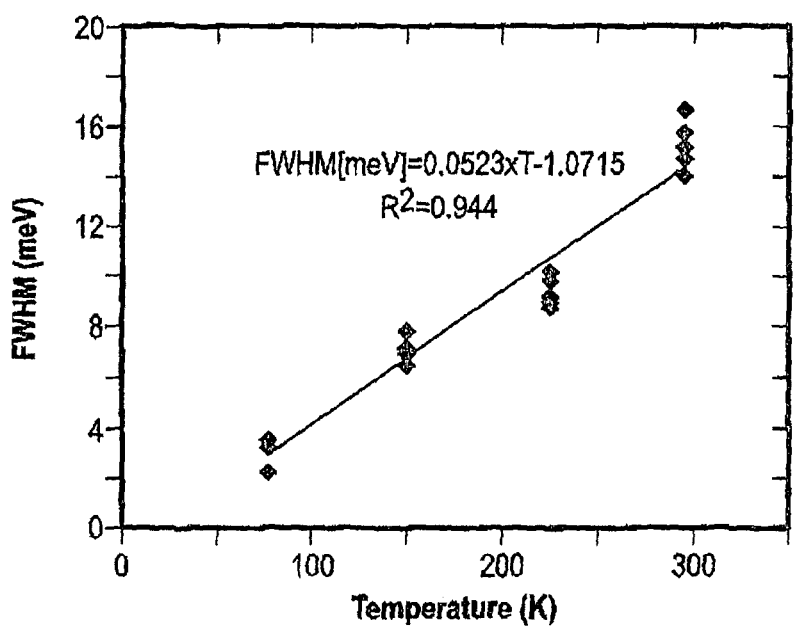
FIG. 9 is a graph showing the temperature dependence of the FWHMs (full width at half maximum's) of the differential conductance peaks in accordance with one embodiment of the present invention.
Figure 12I:
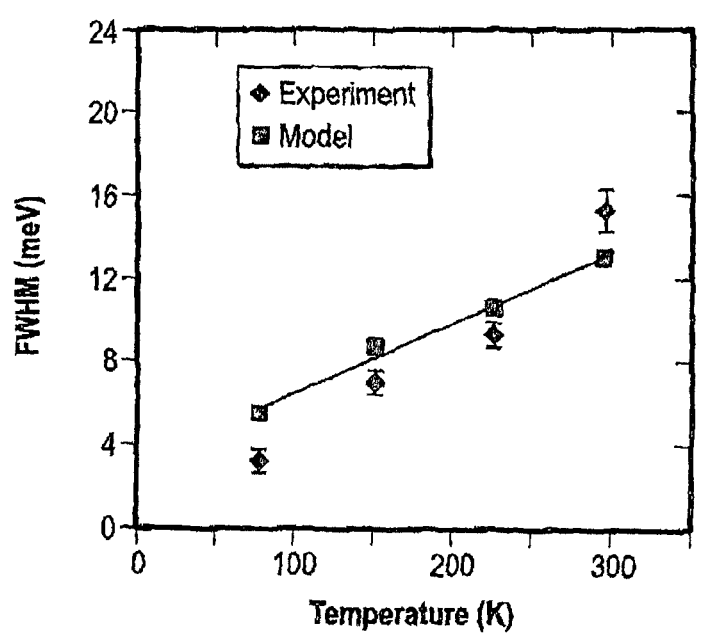

Table 2 and 3 summarize the FWHMs of the measured differential conductance peaks in FIGS. 3A and 3B, respectively. FIG. 9 shows the FWHMs (in energy unit) as a function of temperature. The FWHMs at each temperature have very small deviations; at a given temperature, the FWHM values are very close to each other without regard to quantum dot levels (s, p or d) or the samples measured (the unit with 7.0 nm CdSe QD or the unit with 5.5 nm CdSe QD). A fit with the linear regression method shows that the FWHM vs. temperature can be nicely described by a linear functional relationship $$FWHM\,[meV] = 0.0523 \times T - 1.0715 \quad (15)$$

With an $R^2$ value as high as 0.944.

The effective temperature of the energy-filtered electrons can be obtained from Equations (11) and (15) as $$T_{eff} = [0.0523 \times T\,(bath\,temp.) - 1.0715]/[3.52549 \times k] \quad (16)$$

From equation (16), effective electron temperatures are 47 K, 35 K, 22 K and 10 K when the reservoir temperatures are 295 K, 225 K, 150 K and 77 K, respectively.

Table 2 shows the measured FWHMs at different temperatures for s, p and d peaks. η value of 0.94 (from Table 1) was used to obtain the FWHMs in energy scale (meV).

TABLE 2

FWHMs of the differential conductance peaks (from the unit in FIG. 3A).

| | s-peak | | p-peak | | d-peak | |
|---|---|---|---|---|---|---|
| Temperature | FWHM (mV) | FWHM (meV) | FWHM (mV) | FWHM (meV) | FWHM (mV) | FWHM (meV) |
| 77 K | 3.8 | 3.6 | 3.5 | 3.3 | 2.4 | 2.3 |
| 150 K | 6.9 | 6.5 | 7.6 | 7.1 | 7.0 | 6.6 |
| 225 K | 10.4 | 9.7 | 9.3 | 8.7 | 9.7 | 9.1 |
| 295 K | 16.1 | 15.1 | 15.6 | 14.7 | 17.7 | 16.6 |

Table 3 shows the measured FWHMs at different temperatures for s and p peaks. η value of 0.83 (from Table 1) was used to obtain the FWHMs in energy scale (meV).

TABLE 3

FWHMs of the differential conductance
peaks (from the unit in FIG. 3B)

| Temperature | s-peak FWHM (mV) | s-peak FWHM (meV) | p-peak FWHM (mV) | p-peak FWHM (meV) |
|---|---|---|---|---|
| 77 K | 4.3 | 3.6 | 4.3 | 3.6 |
| 150 K | 8.4 | 7.0 | 9.4 | 7.8 |
| 225 K | 10.7 | 8.9 | 12.2 | 10.2 |
| 295 K | 18.9 | 15.7 | 16.9 | 14.0 |

A model for the energy-filtered cold electron transport of the present invention is shown in FIG. 10A-10C. The system is made of the following components, a source electrode (L), a quantum well (QW), a quantum dot (QD) and a drain electrode (R), with tunneling barriers separating them. Tunneling barrier on the source side separates the QW and the QD, and tunneling barrier on the drain side separates the QD and the drain (R). Electrons tunnel between the adjacent components in a sequential manner. The QW on the drain side does not contribute to the energy filtering since under the condition $\in_D > \mu_R$, electrons in the QD will tunnel out to the drain anyway without regard to the presence of QW in the drain side. For simplicity, the model does not include the QW on the drain side.

The tunneling rates between the adjacent components are defined as $\Gamma_L^\pm(i_W)$, $\Gamma_D^\pm(i_W)$, $\Gamma_W^\pm(i_D)$ and $\Gamma_R^\pm(i_D)$. $\Gamma_L^\pm(i_W)$ is the tunneling rate when the number of electrons in the QW before the tunneling is $i_W$, where the superscript "+" and "−" represents an electron is added to the QW and subtracted from the QW, respectively, and the subscript "L" represents the electron addition and subtraction is through the source electrode (L). Other rates are defined with the same manner as follows. $\Gamma_D^\pm(i_W)$ is the rate for an electron to tunnel from the QD to the QW ("+") or from QW to QD ("−") when the number of electrons in the QW before tunneling is $i_W$. $\Gamma_W^\pm(i_D)$ is the rate for an electron to tunnel from the QW to the QD ("+") or from QD to QW ("−") when the number of electrons in the QD level before tunneling is $i_D$. $\Gamma_R^\pm(i_D)$ is the rate for an electron to tunnel from the drain electrode (R) to the QD ("+") or from QD to R ("−") when the number of electrons in the QD before the transport is $i_D$. These rates are governed by the positions of chemical potentials/energy levels $\mu_L$, $\in_W$, $\in_D$ and $\mu_R$ of the source, QW, QD and drain, respectively. For a given set of rates, the rate equations are simultaneously solved [28], which gives an electrical current I at a voltage bias V (i.e., the I-V). The I-V's and differential conductances (dI/dV's) from the model calculations are in good agreement with the experimental data over all temperature ranges investigated (77 K-295 K).

For the electron tunneling between the QW and the QD, inelastic electron tunneling processes are included. Referring to FIG. 10B, it is assumed that an electron tunneling from a lower energy state to a higher energy state (energy gain) is possible if coupled with a phonon absorption [41, 42]. The tunneling probability of the inelastic tunneling through phonon absorption $\gamma_{absorp}(\in, T)$ is given by [41]

$$\gamma_{absorp}(\in, T) = n(|\in|, T) A(|\in|) \quad (17)$$

where $\in < 0$ (we define $\in < 0$ for the energy gain), $n(|\in|, T)$ is the Bose-Einstein distribution function of phonon population, $n(\in > 0, T) = 1/(e^{\in/kT} - 1)$, where T is the absolute temperature and k is the Boltzmann constant and $A(\in)$ is the Einstein A coefficient for spontaneous emission of phonons [41, 42]. The total tunneling probability includes the contribution by the elastic tunneling $\gamma_{elastic}(\in)$, for which the lifetime broadening with the Lorentzian distribution [10, 24, 46, 59] is assumed and is given by $$\gamma_{elastic}(\varepsilon) = \frac{2}{\hbar}\left(\frac{\hbar T_{elastic}}{2}\right)^2 \frac{\frac{\hbar T_{elastic}}{2}}{\varepsilon^2 + \left(\frac{\hbar T_{elastic}}{2}\right)^2} \quad (18)$$

where $\hbar$ is the reduced Planck constant and $T_{elastic}$ is the elastic tunneling probability when the QW energy level and QD energy level align exactly (i.e., when $\in = 0$). The total tunneling probability $\gamma(\in < 0, T)$ is then $$\gamma(\varepsilon < 0, T) = \gamma_{absorp}(\varepsilon, T) + \gamma_{elastic}(\varepsilon) \quad (19)$$

$$= n(|\varepsilon|, T)A(|\varepsilon|) + \gamma_{elastic}(\varepsilon)$$

$$= n(|\varepsilon|, T)A(|\varepsilon|) + \frac{2}{\hbar}\left(\frac{\hbar T_{elastic}}{2}\right)^2 \frac{\frac{\hbar T_{elastic}}{2}}{\varepsilon^2 + \left(\frac{\hbar T_{elastic}}{2}\right)^2} \quad (20)$$

$$= 1/(e^{|\varepsilon|/kT} - 1)A(|\varepsilon|) + \frac{2}{\hbar}\left(\frac{\hbar T_{elastic}}{2}\right)^2 \frac{\frac{\hbar T_{elastic}}{2}}{\varepsilon^2 + \left(\frac{\hbar T_{elastic}}{2}\right)^2}$$

Referring to FIG. 10C, an inelastic tunneling from a higher energy state to a lower energy state (energy loss) occurs through phonon emission [10, 41, 42] and other energy relaxation processes [16, 24, 43-45] (e.g., interface-roughness scattering, impurity scattering, alloy disorder scattering), which are represented by $\gamma_{emiss}(\in,T)$ and $\gamma_{relax}(\in)$ respectively. The tunneling probability through phonon emission $\gamma_{emiss}(\in, T)$ is given by [41, 42]

$$\gamma_{emiss}(\varepsilon, T) = [n(\varepsilon, T) + 1]A(\varepsilon) \quad (21)$$

$$= [1/(e^{\varepsilon/kT} - 1) + 1]A(\varepsilon)$$

The total tunneling probability in which an electron loses the energy in the tunneling ($\in > 0$) is then $$\gamma(\varepsilon > 0, T) = \gamma_{emiss}(\varepsilon, T) + \gamma_{elastic}(\varepsilon) + \gamma_{relax}(\varepsilon) \quad (22)$$

$$= [n(\varepsilon, T) + 1]A(\varepsilon) + \gamma_{relax}(\varepsilon) + \gamma_{elastic}(\varepsilon)$$

$$= [1/(e^{\varepsilon/kT} - 1) + 1]A(\varepsilon) + \frac{2}{\hbar}\left(\frac{\hbar T_{elastic}}{2}\right)^2 \frac{\frac{\hbar T_{elastic}}{2}}{\varepsilon^2 + \left(\frac{\hbar T_{elastic}}{2}\right)^2} + \gamma_{relax}(\varepsilon)$$

Note that $\gamma(\in<0, T)$ and $\gamma(\in>0, T)$ are temperature dependent through the Bose-Einstein distribution function, which is the origin of the temperature dependence of the I-V's and dI/dV's. The tunneling probabilities $\gamma(\in<0, T)$ and $\gamma(\in>0, T)$, along with the probabilities of electrons occupying the QW and QD states, determine the tunneling rates $\Gamma_D^\pm(i_W)$ and $\Gamma_W^\pm(i_D)$.

The rate equations are constructed as follows. Define $P_W(i_W)$ as the probability that $i_W$ number of electrons reside in the QW, where $i_W$ can be either 0, 1 or 2. Similarly, $P_D(i_D)$ is the probability that $i_D$ number of electrons reside in the QD, where $i_D$ can be either 0 or 1 (since the single-electron charging energy of our QD is significant, ~100 meV, the state having two electrons in the QD level is treated as a different state having a higher energy). Then, the tunneling rates $\Gamma_L^\pm(i_W)$, $\Gamma_D^\pm(i_W)$, $\Gamma_W^\pm(i_D)$ and $\Gamma_R^\pm(i_D)$ are related to the tunneling probabilities $\Gamma(\in<0, T)$ and $\gamma(\in>0, T)$ and the occupation probabilities $P_W(i_W)$ and $P_D(i_D)$ as follows:

$$\Gamma_L^+(0)=f_L(\in_W)\times D_L(\in_W)\times T_L \quad (24)$$

$$\Gamma_L^+(1)=f_L(\in_W)\times D_L(\in_W)\times T_L \quad (25)$$

$$\Gamma_L^-(1)=[1-f_L(\in_W)]\times D_L(\in_W)\times T_L \quad (26)$$

$$\Gamma_L^-(2)=[1-f_L(\in_W)]\times D_L(\in_W)\times T_L \quad (27)$$

$$\Gamma_D^+(0)=\gamma(\in_D-\in_W,T)\times P_D(1) \quad (28)$$

$$\Gamma_D^+(1)=\gamma(\in_D-\in_W,T)\times P_D(1) \quad (29)$$

$$\Gamma_D^-(1)=\gamma(\in_W-\in_D,T)\times P_D(0) \quad (30)$$

$$\Gamma_D^-(2)=\gamma(\in_W-\in_D,T)\times P_D(0) \quad (31)$$

$$\Gamma_W^+(0)=\gamma(\in_W-\in_D,T)\times [P_W(1)+P_W(2)] \quad (32)$$

$$\Gamma_W^-(1)=\gamma(\in_D-\in_W,T)\times [P_W(0)+P_W(1)] \quad (33)$$

$$\Gamma_R^+(0)=f(\in_D)\times D_R(\in_D)\times T_R \quad (34)$$

$$\Gamma_R^-(1)=[1-f_R(\in_D)]\times D_R(\in_D)\times T_R \quad (35)$$

where $f_L(E)$ and $f_L(E)$ are the Fermi-Dirac functions with chemical potential $\mu_L$ and $\mu_R$ for source (L) and drain (R) electrode, respectively, $\in_W$ and $\in_D$ are the energies of the QW and the QD states, respectively, $T_L$ is the tunneling probability for electron tunneling between the source (L) and the QW, $T_R$ is the tunneling probability for electron tunneling between the QD and the drain (R), $D_L(E)$ and $D_R(E)$ are the density of states for the source and the drain electrodes, respectively. As shown in equations (24)-(35), the tunneling rates $\Gamma_L^\pm(i_W)$, $\Gamma_D^\pm(i_W)$, $\Gamma_W^\pm(i_D)$ and $\Gamma_R^\pm(i_D)$ are determined by the positions of $\mu_L$, $\in_W$, $\in_D$ and $\mu_R$, which in turn are determined by the voltage bias V applied between the source and the drain. Their relationships are $\mu_L-\mu_R=eV$, $\Delta(\in_W-\in_D)=\eta eV$ and $\Delta(\in_D-\mu_R)=(1-\eta)eV$.

At steady state, the transition rates between two adjacent configurations are the same (the net transition is zero). For two QW configurations with $i_W=0$ and $i_W=1$, for example, the transition rates between the two are the same:

$$P_W(0)\times[\Gamma_L^+(0)+\Gamma_D^+(0)]=P_W(1)\times[\Gamma_L^-(1)+\Gamma_D^-(1)] \quad (36)$$

Likewise, the transition rates between two QW configurations with $i_W=1$ and $i_W=2$ are the same, which gives:

$$P_W(1)\times[\Gamma_L^+(1)+\Gamma_D^+(1)]=P_W(2)\times[\Gamma_L^-(2)+\Gamma_D^-(2)] \quad (37)$$

Similarly, the transition rates between two adjacent QD configurations are the same:

$$P_D(0)\times[\Gamma_W^+(0)+\Gamma_R^+(0)]=P_D(1)\times[\Gamma_W^-(1)+\Gamma_R^-(1)] \quad (38)$$

One also has the following equations since the sum of the probabilities should be unity:

$$P_W(0)+P_W(1)+P_W(2)=1 \quad (39)$$

$$\text{and } P_D(0)+P_D(1)=1 \quad (40)$$

Since there are five equations, (36)-(40), and five unknowns, $P_W(0)$, $P_W(1)$, $P_W(2)$, $P_D(0)$ and $P_D(1)$, the simultaneous equations can be solved. For a given set of tunneling rates $\Gamma_L^\pm(i_W)$, $\Gamma_D^\pm(i_W)$, $\Gamma_W^\pm(i_D)$ and $\Gamma_R^\pm(i_D)$ for a specific V, one numerically solves the simultaneous equations (36)-(40) and obtain $P_W(0)$, $P_W(1)$, $P_W(2)$, $P_D(0)$ and $P_D(1)$. The electrical current I is then given by $$I(V)=e\times[P_D(1)\times\Gamma_R^-(1)-P_D(0)\times\Gamma_R^+(0)] \quad (41)$$

where e is the charge of an electron. The dI/dV is obtained by numerical differentiation of the I(V).

Numerical calculations were carried out using the model above. For functions $A(\in)$, $\Gamma_{relax}(\in)$ and $\gamma_{elastic}(\in)$ in equations (17)-(23), the functional forms shown in FIGS. 11A-11C [24, 41, 42, 46, 59] were used. The other parameters used were: $T_L\times D_L(\in_W)=1.3\times 10^{11}$ [1/sec] and $T_R\times D_R(\in_D)=1.3\times 10^{11}$ [1/sec], where constant values of $T_L$, $T_R$, $D_L$ and $D_R$ were assumed. $\mu_L=0$ (reference energy zero), $\in_W=0$, $\in_D=E_S-\eta eV$ (where $E_S$ is the position of the s-level at V=0; $V_S=E_S/\eta e$) and $\mu_R=-eV$.

Equations (36)-(40) were numerically solved and the I(V) was obtained. FIGS. 12A-12H show resulting I-V and dI/dV calculations at different temperatures. An abrupt current jump, $\Delta=\sim 15$ mV, is found at room temperature, FIG. 12A, in good agreement with the experimental measurement in FIG. 2A. The current jumps become more abrupt as the temperature decreases, FIGS. 12B-12D. The dI/dV's, FIGS. 12E-12H, show narrow peak widths, with the peak width decreasing with decreasing temperature, in good agreement with the differential conductance measurements in FIGS. 3A-3B. Note that the dI/dV peaks in FIGS. 3A-3B are of a triangular shape, not Gaussian or Lorentzian. The model calculations in FIG. 12E-12H faithfully reproduce the triangular-type dI/dV peaks. For quantitative comparisons, the FWHMs from the model calculations and those from the experimental measurements are displayed in FIG. 12I. A very good agreement is found between them over the temperature range investigated (77K-295K).

The electron energy filtering and its associated cold electron transport have profound technical implications. Various electron systems/devices that have so far been able to function only at low temperatures could now be made to work at higher temperatures, in particular, at room temperature. Also, for many electronic devices that operate at room temperature, the cold electrons could be used to greatly enhance their performances. Two examples will now be presented. First, the use of cold electrons in single-electron transistors (SETs) will be demonstrated, which results in clear Coulomb staircase and Coulomb oscillations at room temperature without external cooling. Second, it will be shown that cold electron transport can lead to an extremely steep current turn-on/off capability, in which a voltage change of only ~10 mV enables a 10 fold current change (~10 mV/decade) at room temperature.

Figure 13A:
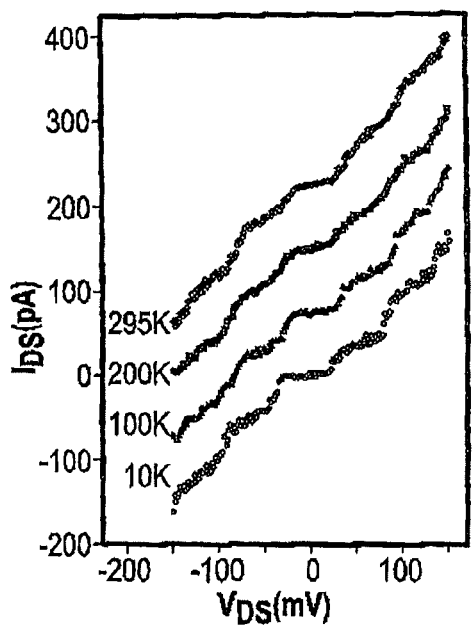
Figure 13B:
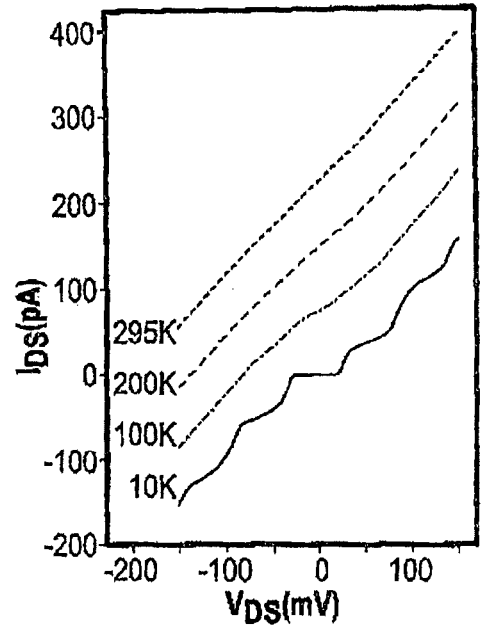
Figure 13C:
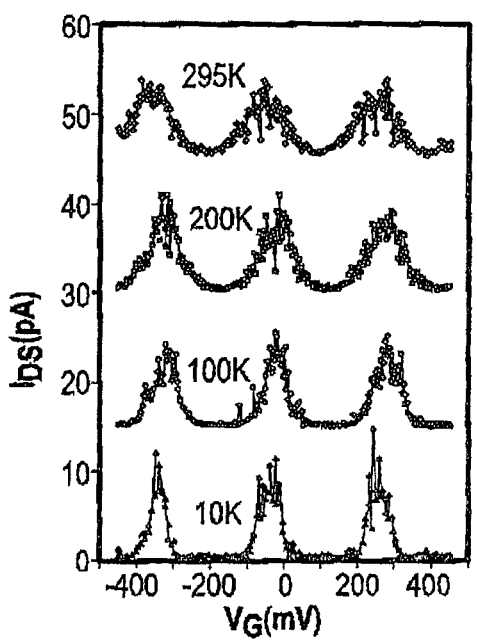
Figure 13D:
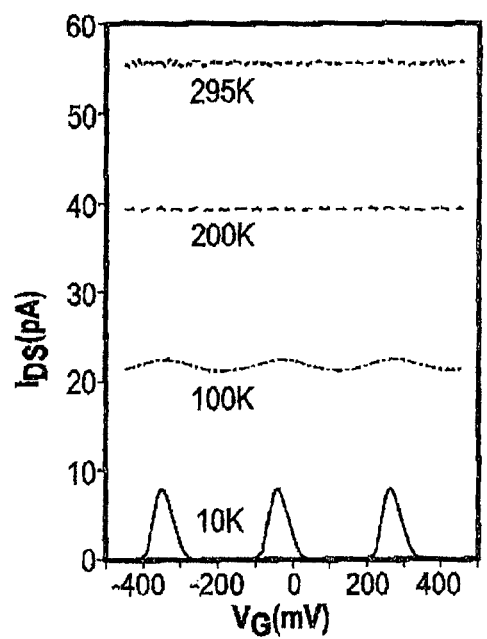

Single-electron transistors (SETs) were fabricated using the configuration shown in FIG. 1C, but with two alterations: 1) the CdSe QD was replaced by a metal nanoparticle (~10 nm Au nanoparticle), and 2) a gate electrode was added using the configuration reported previously, in which the gate encompasses the periphery of the drain/insulating layer/source stack in FIG. 1C. FIGS. 13A-13L show the application of energy-filtered cold electron transport to SETs. FIG. 13A shows the measured I-V characteristics of a fabricated SET at different temperatures. The Coulomb staircase is clearly seen at all temperatures, including room temperature. Above 10 K, each I-V is vertically displaced by 75 pA from the lower temperature one for clarity. $K_{DS}$: source-drain voltage. $I_{DS}$: source-drain current. FIG. 13B shows the I-V characteristics calculated with orthodox theory under the usual Fermi-Dirac distribution (Simulator: SIMON 2.0). FIG. 13C shows the measured Coulomb oscillations at different temperatures. $V_G$: gate voltage. $V_{DS}$ was 10 mV. Above 10 K, each I-V is vertically displaced by 15 pA from the lower temperature one for clarity. FIG. 13D shows the Coulomb oscillations calculated with orthodox theory under the usual Fermi-Dirac distribution. All temperatures indicated in FIGS. 13A-13D are the reservoir temperatures. FIGS. 13E-13F show a comparison of the experimental and simulated Coulomb staircases (FIG. 13E) and Coulomb oscillations (FIG. 13F) at 10 K. T(exp): the reservoir temperature at which the experiment was carried out. T(sim): the simulation temperature. FIGS. 13G-13L show a comparison of experimental and simulated Coulomb staircases and Coulomb oscillations at elevated reservoir temperatures (100 K-295 K). For the simulations, the effective electron temperatures were used in the orthodox theory calculation. Just a single set of parameters (except for the background charge $Q_0$ [40]) was used for all simulations in FIGS. 13B, 13D and 13E-13L. The parameters are $C_1$=0.85 aF, $C_2$=2.9 aF, $C_G$=0.52 aF, $R_1$=8.7×$10^7$Ω and $R_2$=6.6× $10^8$Ω. The background charges $Q_0$ for FIGS. 13E-13L are −0.075 e, 0.45 e, 0.075 e, 0.40 e, −0.075 e, 0.50 e, −0.025 e and 0.50 e, respectively.

FIGS. 13A and 13C display measured I-V characteristics of a fabricated SET at different temperatures. Over all temperatures studied, including room temperature, clear single-electron transport behavior, i.e., Coulomb staircases (FIG. 13A) and Coulomb oscillations (FIG. 13C), is observed. The temperature behavior observed here well reflects the effectiveness of our method as follows. At the lowest temperature (10 K) the Coulomb staircase and Coulomb oscillations are accurately described by the orthodox theory of single-electron transport [40, 47] as evidenced by the excellent match between the experiment (blue dots) and the theory (red lines) in FIGS. 13E and 13F. Note that the suppressed FD smearing has a profound effect on the SET. As shown in FIGS. 13A and 13C, these low-temperature (10 K) SET characteristics are well preserved even at much higher temperatures (100-295 K). That is, raising the temperature makes only a minor change on the SET characteristics, dramatically increasing the operation temperature range of SETs. Further analysis shows that the effective temperature lowering explains all the experimental observations in FIGS. 13A and 13C extremely well. Note that with the usual Fermi-Dirac thermal smearing in effect (i.e., no energy filtering), the Coulomb staircases and Coulomb oscillations are substantially or completely wiped out at these temperatures, FIGS. 13B and 13D.

The preservation of the Coulomb staircases and Coulomb oscillations at elevated reservoir temperatures is explained by the fact that the energy-filtered electrons are much colder than the reservoir. Quantitative analysis can be made using the effective temperatures of the energy-filtered electrons. As discussed earlier, by comparing the FWHMs in FIG. 3D (see equation (16)), one gets effective electron temperatures ~45 K, ~30 K and ~15 K for the reservoir temperatures 295 K, 200 K and 100 K, respectively. These low electron temperatures explain the experimental data in FIGS. 13A and 13C extremely well. This is shown in FIGS. 13G-13L, in which the orthodox theory calculations (red lines) at these low temperatures faithfully reproduce all the experimental Coulomb staircase and Coulomb oscillation data (dots). The benefit of having low-temperature electrons is clearly seen in the current SET example: the requirement for cooling with liquid He/$N_2$ can be lifted, yet the low-temperature SET performance remains. With similar methodology, it is highly probable that the same benefit can be extended to other systems, such as spintronic and optoelectronic devices.

The second example is related to obtaining a steep current turn-on/off capability for field-effect transistors, a critical element for realizing ultralow-power-dissipation electronics. Thermodynamics imposes a fundamental limit on the steepness of current turn-on/off as ln10·(kT/e). Its value at room temperature is 60 mV/decade, which limits voltage scaling and reduction of power dissipation [6]. For a solution, studies have been carried out in search of new types of transistors that do not rely on electron thermal injection, for example, the tunnel field-effect transistor (TFET) which uses band-to-band tunneling [6]. Many experimental challenges, however, have limited progress and to our best knowledge, the most steep experimental turn-on/off value reported is ~40 mV/decade over about one order of magnitude of drain current [6, 48-50]. In contrast, the low electron temperature of the present invention provides a simple route to extremely steep current turn-on/off operation: at room temperature (reservoir), the electron temperature of 45 K leads to a current turn-on/off steepness of 9 mV/decade, from ln10·(k·45/e). Its experimental confirmation is displayed in FIGS. 23A-23B, where a steepness of ~10 mV/decade is demonstrated. The present value of ~10 mV/decade can lead to approximately 2 orders of magnitude reduction in power dissipation compared to the currently most advanced CMOS transistors, paving a new route toward ultralow-power-dissipation electronics.

As previously described, our invention enables effective suppression of the FD thermal smearing and lowering electron temperatures by a factor of ~6.5. Although the factor of ~6.5 is already a very significant number, the foregoing discussion describes key factors to further suppress the FD smearing and reduce electron temperatures even further.

As outlined in FIG. 1B, the energy filtering process requires a discrete state which is spatially located between the electrode and the tunneling barrier. This discrete energy state is obtained by creating a quantum well between the electrode and the tunneling barrier. This is accomplished through a proper selection of materials, their nanoscale geometric arrangement, and engineering the energy band bending of tunneling barriers. These are presented in detail below when we describe the following specifics: (1) controlled formations of quantum wells through material selections and interface engineering of dielectric layers; (2) formation of an electron energy filtering structure using a vertical electrode configuration and semiconductor or metal nanoparticles; (3) formation of an electron energy filtering structure using nanopillars; and (4) design and fabrication of "two-terminal" device configurations (having source and drain, but without the gate) and "three-terminal" device configurations (transistors).

Quantum wells are created by manipulating the energy band bending of the materials involved. This requires an appropriate selection of materials and their proper geometrical arrangement, as well as engineering the interfaces between the material layers. The present invention satisfies the following goals: (1) obtain the capability of creating and eliminating the electron energy filtering structure at our disposal; (2) elucidate key parameters that control the degree of energy filtering; and (3) fabricate the optimum energy filtering structure and obtain effective temperature lowering by a factor of 6.5 or higher.

The suppressed FD smearing in FIGS. 2-4 and 13 was observed for a material system made of Cr, $Cr_2O_3$, and $SiO_2$. By using proper material systems and structures, the energy filtering effect and suppression of FD smearing can be further enhanced. The formation of quantum well energy states and the filtering effect depend on four parameters: the energy barrier ($E_b$), the degree of band bending ($E_{bend}$), and the thicknesses of tunneling barrier 1 ($d_1$) and tunneling barrier 2 ($d_2$) shown in FIG. 14. Here, the key requirement for the energy filtering is that the band bending $E_{bend}$ needs to be larger than the energy barrier $E_b$. Otherwise, the discrete energy levels formed in the quantum well would be located higher than the Fermi level of the source electrode $E_F$; for the energy filtering, the discrete energy level formed in the quantum well needs to be located close to the Fermi level of the electrode. Using this energy landscape and also assisted by tunneling transmission coefficient calculations, various materials and structures can be evaluated and the optimal system that produces the maximum suppression of FD or the lowest effective electron temperature can be identified.

Some examples of selecting optimal systems are given here. The Table below shows several material systems that were selected based on the size of energy barrier $E_b$ (the energy barrier between the source metal and the barrier 1 in FIG. 14), which ranges from 1.6-2.5 eV for Al/Al$_2$O$_3$ to 0.02 eV for Pb/Cr$_2$O$_3$.

| Material System (Source/Barrier 1) | $E_b$ (eV) |
|---|---|
| Al/Al$_2$O$_3$ | 1.6-2.5 |
| Pb/Cr$_2$O$_3$ | 0.02 |
| Cr/Cr$_2$O$_3$ | 0.06 |
| Ti/TiO$_x$ | 0.285 |

The role of energy barrier $E_b$ on the formation of energy filtering structure as schematically displayed in FIGS. 15A-15B will be described. For example, if Al/Al$_2$O$_3$ system is used (its barrier height is 1.6-2.5 eV, at least a factor of 10 higher than that for Cr/Cr$_2$O$_3$ system), no energy filtering is expected to occur unless the band bending is appreciably large (>1.6-2.5 eV); if the energy levels formed in the quantum well, they would be located far above the electrode Fermi level, FIG. 15A. The energy filtering can, however, be obtained for this system by creating a band bending $E_{bend}$ higher than the energy barrier $E_b$ using various methods described in following sections. The Al/Al$_2$O$_3$ system can be compared with the Cr/Cr$_2$O$_3$ system, for which the energy barrier $E_b$ is appreciably lower, ~0.1 eV; upon a small band bending, a discrete state which is close to the electrode Fermi level is formed in the quantum well, FIG. 15B. So, by using appropriate materials systems and appropriate band bendings, the energy filter can be turned on or off. This energy filtering can be assessed through the I-V measurement. If the energy filter is on, a room-temperature I-V measurement will produce abrupt current jumps, FIG. 15B (bottom). If the energy filter is off, the room-temperature I-V would not produce any abrupt current jumps due to the usual FD thermal smearing, FIG. 15A (bottom).

Another critical factor for the formation of a quantum well is the degree of band bending $E_{bend}$ in FIG. 14. The band bending will depend on the following factors: (1) the work functions of the materials used (electrode, tunneling barrier 1, tunneling barrier 2, and semiconductor or metal nanoparticle); and (2) the interface dipoles and/or interface charges created at the interfaces of the films. The former can be determined by the material selection, and the latter can be controlled by introducing dipolar molecules at the interface and/or treating the surfaces with UV/Ozone or plasma. The interface dipoles and/or interface charges can also be formed spontaneously at the interface of the tunneling barrier 1 and tunneling barrier 2 by properly selecting the two barrier materials. Manipulating the interface dipoles and/or interface charges and associated band bending is described below.

To form a quantum well, the conduction band of the barrier 1 needs to be bent downward (FIG. 14). As the first approach, this band bending is controlled by forming dipolar SAMs on the surface of barrier 1 (the interface between the barrier 1 and barrier 2). It is well appreciated that the modification of surfaces or interfaces by molecules or atoms can dramatically change the electronic properties of materials [61-67]. For example, it has been demonstrated experimentally and theoretically that the adsorption of atoms on the surface can change the work function of metals as much as >2 eV [68, 69]. The change of work function by monolayer or submonolayer coverage of dipolar SAMs can also be very substantial, more than 0.5 eV [61, 62, 65, 66, 70]. With these band bendings, along with a proper selection of the material system (which determines the energy barrier $E_b$), a quantum well and a discrete energy state can be made to form near the electrode Fermi level $E_F$, FIG. 15B.

Figure 16:
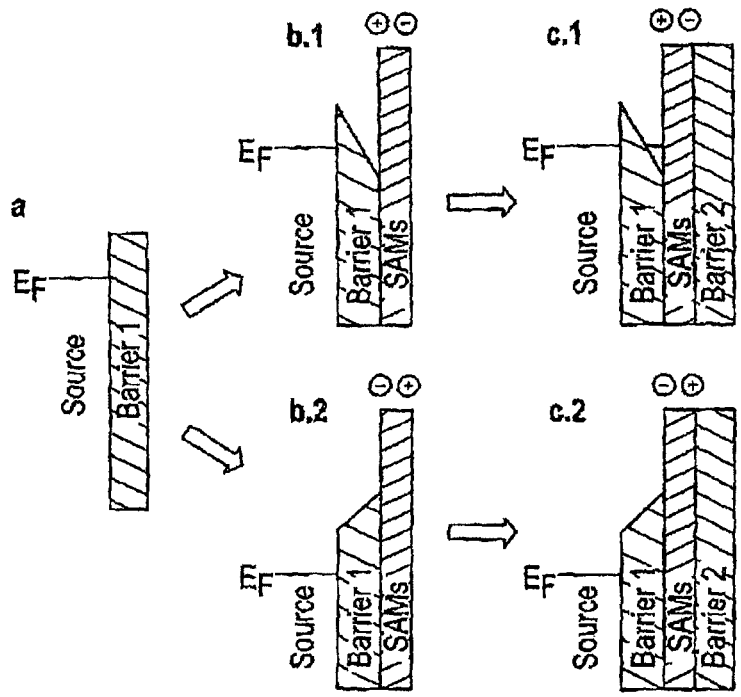
FIG. 16 is a flow chart for engineering the band bending using self-assembled monolayers (SAMs) of dipolar molecules in accordance with one embodiment of the present invention.

FIG. 16 shows a schematic of controlling the band bending of barrier 1 using SAMs of different polarities. Depending on the direction of the dipole moment of the SAMs and/or the polarity of the interface charges, the band bending of the tunneling barrier 1 can occur either downward or upward direction, FIGS. 16b.1 and 16b.2, respectively. Upon placing tunneling barrier 2 (e.g., SiO$_2$) on the SAMs, the former can lead to a creation of a quantum well and a discrete energy level (FIG. 16c.1), whereas the latter will not produce a quantum well (FIG. 16c.2). Through this manipulation of interface dipoles and/or interface charges, the energy filter can be turned on and off as desired. This not only elucidates the detailed mechanism of the observed suppression of Fermi-Dirac smearing and effective temperature lowering, but also leads to the capability of controlling the energy filtering with great precision. A broad spectrum of interface dipoles and/or interface charges can be obtained by using various molecules that have different head groups, chain lengths, and anchor groups [62, 65, 66]. Formation of interface dipoles and/or interface charges will be characterized using Kelvin probe force microscopy (KPFM) and/or X-ray photoelectron spectroscopy (XPS) [71-73].

The other techniques to create and control the interface dipoles and/or interface charges are UV/Ozone or plasma treatment of the surfaces [74-76]. The interface dipoles and/or interface charges created can change the work function as high as 2 eV [74, 77]. These techniques, possibly in conjunction with the SAMs formation, can be used to control the band bending, and therefore to create the energy filtering structure of this invention.

To create downward band bending and to create the energy filtering structure of this invention, FIG. 15B, we can also utilize the spontaneous interface dipole formation that occurs for many material systems of barrier 1 and barrier 2. For example, Cr$_2$O$_3$ and SiO$_2$ can be used for barrier 1 and barrier 2 materials in FIG. 15B, respectively, for which the spontaneous formation of interface dipoles at the interface of Cr$_2$O$_3$ and SiO$_2$ layers produces a desired dipole direction (positive pole in barrier 1 side and negative pole in barrier 2 side) and therefore the desired downward band bending.

Controlling the electron energy filtering for cold electron transport as described above can be incorporated into many different configurations. Two cases are described below as examples. The first approach is to build energy filtering electronic devices that use a vertical electrode configuration and semiconductor or metal nanoparticles. The second approach employs a nanopillar configuration in which all the electrodes, tunneling barriers, and energy filtering structure reside in a single nanopillar. The following sections describe these two approaches.

Figure 17A:
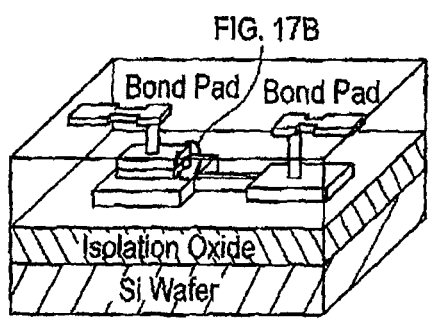
FIGS. 17A-17C show an energy-filtered cold electron device structure using vertical electrode configuration and a QD (semiconductor nanoparticle) in accordance with one embodiment of the present invention.
Figure 17B:
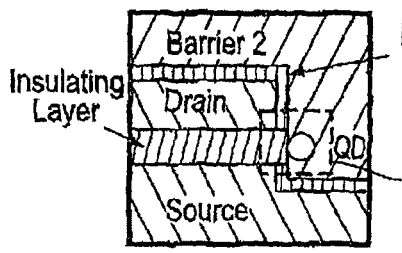
Figure 17C:
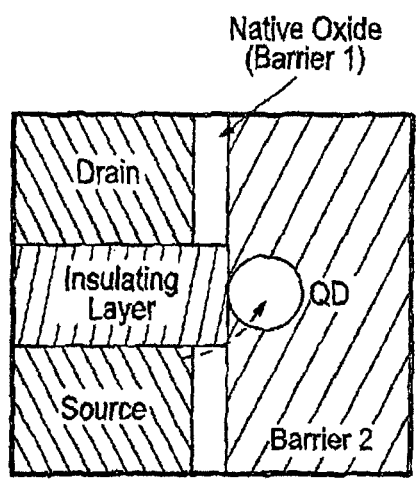

A schematic of the first approach is shown in FIGS. 17A-17C with a magnified view of the region where the energy-filtered tunneling will take place. By closely looking at the electron tunneling path (indicated by an arrow) from the source electrode to the QD (semiconductor nanoparticle), it is important to note that electrons go through two tunneling barriers, barrier 1 and barrier 2. The barrier 1 is a native oxide that naturally forms on the surface of metal electrode. Utilizing native oxides of metals for the barrier 1 is beneficial since quality films with consistent thickness can be obtained. Many metals form native oxides. The candidate electrode metals that we can use include Cr, Al, Ti, Ta, and Mo. For the tunneling barrier 2, a dielectric material whose conduction band edge lies much above the conduction band edge of the barrier 1 is used. This is to ensure that a quantum well is formed when the downward band bending of barrier 1 takes place. Candidate materials for barrier 2 include $SiO_2$ and $Si_3N_4$. The barrier 2 is deposited on the surface of barrier 1 using deposition techniques such as sputtering, plasma-enhanced chemical vapor deposition (PECVD), and atomic-layer deposition (ALD). Prior to deposition of barrier 2, the surface of barrier 1 may be treated with SAMs or plasma to form interface dipoles and to produce an appropriate band bending of the barrier 1 as described in the previous section. Alternatively, the spontaneous interface dipole formation at the interface of barrier 1 and barrier 2 can be used to create the appropriate band bending and to create the energy filtering structure as described above.

In the second approach, a nanopillar configuration is used to create the electron energy filtering structure and to fabricate energy-filtered cold electron devices. In the nanopillar configuration, all the device components (electrodes, tunneling barriers, quantum dot/semiconductor nanocrystal) reside in a single nanopillar. FIG. 18 shows a nanopillar configuration that is composed of source (Cr), a first tunneling barrier ($Cr_2O_3$), a second tunneling barrier ($SiO_2$), Si island, an additional second tunneling barrier ($SiO_2$), an additional first tunneling barrier ($Cr_2O_3$), and drain (Cr). The nanopillar contains two tunneling barriers between the source and the Si island; $Cr_2O_3$ for the first tunneling barrier and $SiO_2$ for the second tunneling barrier. As previously described, the band bending in the $Cr_2O_3$ (the first tunneling barrier) conduction band leads to a formation of a quantum well and a discrete state in the quantum well, creating the energy filtering structure. Other material combinations can also be used to construct the energy filtering structure in a nanopillar.

The merit of using nanopillar structure is that accurate dimensional control is possible such as the thickness of the tunneling barriers and distances between the components in a stack of electrode/tunneling barriers/quantum dot/tunneling barriers/electrode. Furthermore, arranging the device components within a nanopillar and their dimensional control in the nanopillar can be very versatile; for example, different series of device components can be put in nanopillars in relatively simple procedure. These merits come from the fact that nanopillars are fabricated from a stack of films, for which the thickness can be accurately controlled with sub-nanometer scale precision.

Nanopillar structures can be fabricated as follows. A stack of material layers are made by deposition or oxidation/nitridation, and then a nanoparticle is placed on top of the film stack as shown in FIG. 19A. Each tunneling barrier layer in the schematic may comprise of multiple barriers (e.g., a first tunneling barrier and a second tunneling barrier) and also interface dipole SAMs between them. Using the nanoparticle as an etching hard mask, the film stack is vertically etched by reactive ion etching (RIE), producing a nanopillar as shown in FIG. 19B. The nanoparticle on top of the nanopillar is selectively removed using chemical etching, producing the final nanopillar structure that contains all the device components (electrodes, tunneling barriers, etc) as shown in FIG. 19C. FIG. 19D is an SEM image of a nanopillar that was fabricated with procedure in FIGS. 19A-19C. This nanopillar was composed of Cr source, $Cr_2O_3$ tunneling barrier, Cr island, $Cr_2O_3$ tunneling barrier, and Cr drain. The individual $Cr_2O_3$ barriers could not be resolved with SEM.

The thicknesses of the device components in a nanopillar (e.g., tunneling barrier thickness) can be accurately controlled since they are determined by the layer thicknesses formed in the first step in FIG. 19A; the layer thickness can be controlled with sub-nanometer scale precision using techniques such as ALD and PECVD. By choosing the materials deposited and by accurately controlling their thicknesses in the first step (FIG. 19A), a variety of nanopillars can be fabricated.

The electron tunneling characteristics are assessed by I-V and dI/dV (lock-in) measurements at varying temperatures. Electrical contacts to the nanopillar are made using usual CMOS fabrication procedure, which include deposition of passivation material (e.g., SOG: spin-on-glass), photolithography, RIE, and metal deposition. FIGS. 20A-20D show the process flow to make electrical contacts to the nanopillar. FIG. 20A shows deposition of passivation material (e.g., SOG: spin-on-glass). FIG. 20B shows RIE etching to expose the top portion of the nanopillar. FIG. 20C shows formation of a drain pad which makes an electrical contact with the nanopillar. The drain pad is formed using photolithography, metal deposition, and lift-off. FIG. 20D shows formation of vias and metal interconnects. This is made by deposition of another layer of passivation material (e.g., SOG: spin-on-glass), making vias with photolithography and RIE etching, filling the vias with metal deposition, and formation of bond pads using photolithography, metal deposition and lift-off.

The capability of effectively suppressing the Fermi-Dirac thermal smearing and accompanying effective temperature lowering can be utilized to obtain electronic devices that can operate with extremely-low power consumption. Thermodynamics (FD distribution) imposes a low bound on transistors' subthreshold swing (SS), the measure of how abruptly a transistor can be turned off below the threshold voltage $V_{th}$. With a low subthreshold swing (for which transistors can be turned off abruptly), the supply voltage $V_{DD}$ can be reduced and hence the power consumption (proportional to the square of $V_{DD}$) while maintaining a low OFF-state current. For current transistor architecture, however, the thermodynamics sets the lowest possible subthreshold swing to 60 mV/decade at room temperature [7, 78, 79], and $V_{DD}$ cannot be reduced much smaller than one volt without having a significant OFF-state current. This imposes an intrinsic limit on reduction of power consumption during transistor operation. Thermodynamics tells that the subthreshold swing SS is proportional to the temperature T, SS=ln10·(kT/e). The ability of this invention to obtain low effective electron temperature through electron energy filtering can produce a low SS since it is proportional to the electron temperature. The low SS allows a use of smaller supply voltage $V_{DD}$, allowing device operation with extremely-low power consumption. As previously described, the effective electron temperature is 45 K when the reservoir temperature is room temperature (295K), making SS as small as 10 mV/decade at room temperature. With this SS, power consumption can be reduced by a factor of 100 compared to that for current state-of-the-art CMOS transistors.

The previous sections described electron energy filtering and associated effective electron temperature lowering in two-terminal configuration, i.e., without the gate. Here, fabrication procedures to add gate electrodes to make three-terminal devices, i.e., the transistors, are described. Two different transistor configurations are described: (1) transistors employing vertical electrode configuration and semiconductor nanoparticles; and (2) transistors using nanopillar configuration. We name these transistors "energy-filtered cold electron transistors".

Figure 21:
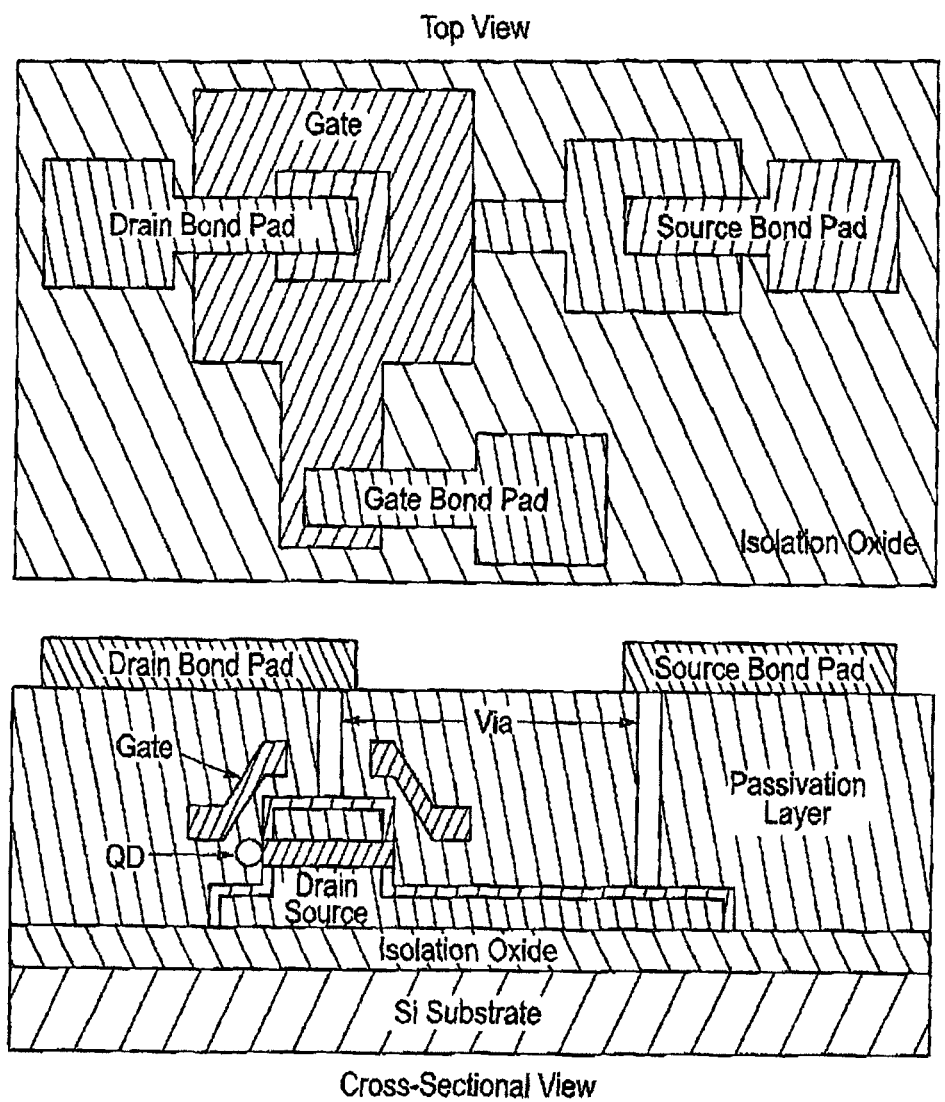
FIG. 21 is a top view and cross-section view of a schematic of an energy-filtered cold electron transistor in accordance with one embodiment of the present invention.

Energy-filtered cold electron transistors are fabricated by adding gate electrodes to the two-terminal device structure previously discussed. FIG. 21 displays a schematic of the transistor structure, in which a gate electrode encompasses the periphery of the source/insulating layer/drain stack. This gate addition will be made through photolithography and gate metal deposition before forming the vias and bond pads. The use of photolithography along with other CMOS-compatible process steps allows production of individually addressable gates and large-scale parallel fabrication of the energy-filtered cold electron transistors.

Figure 22A:
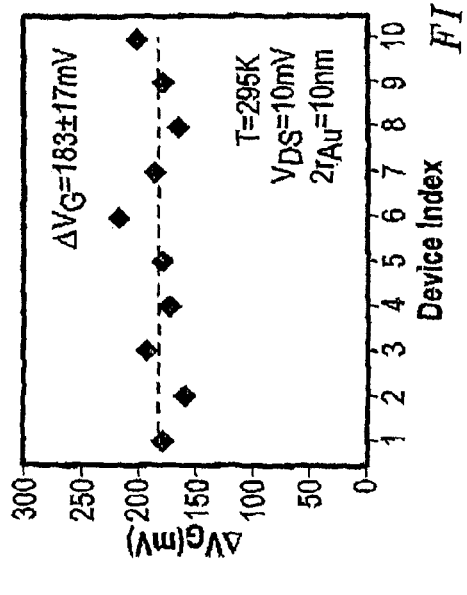
FIGS. 22A-22B are graphs showing the test of the gate design in FIG. 21 with fabrication of single-electron transistors (SETs) in accordance with one embodiment of the present invention.
Figure 22B:
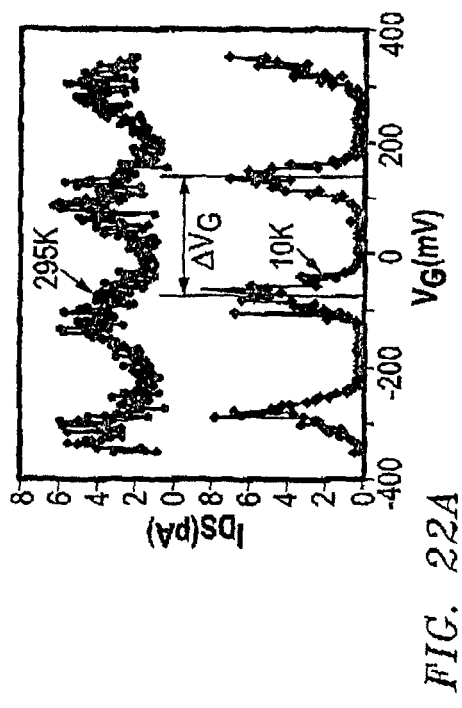

It is important to check if the gate design in FIG. 21 gives the desired gating power (allowing responsive gate modulation of the I-V characteristics) and also whether the gate structure can be reliably and reproducibly fabricated with a small device-to-device variation. The previous work on fabricating single-electron transistors (SETs) supports that this is the case [26]. For this SET fabrication, essentially the same configuration as in FIG. 21 was used, except that metal nanoparticles (~10 nm Au nanoparticles) were used instead of semiconductor nanoparticles. FIG. 22A shows the modulation of the current as a function of gate voltage. A clear Coulomb oscillation (periodic change of the current as a function of gate voltage) can be seen, which demonstrates that the gate design in FIG. 21 can deliver the desired gating power. The device-to-device variation was also checked by measuring the Coulomb interval $\Delta V_G$ (peak-to-peak distance in the Coulomb oscillation; indicated by the arrow in FIG. 22A) for ten different SETs fabricated in a single batch. FIG. 22B displays $\Delta V_G$ from these SETs and shows that the device-to-device variation is less than 10%. These demonstrate that our gate structure in FIG. 21 can be reliably fabricated with CMOS-compatible processes and materials and produce a responsive gating power.

One of the performance goals of the energy-filtered cold electron transistor is to obtain subthreshold swing (SS) of 10 mV/decade or less at room temperature. The subthreshold swing is the measure of "gate voltage" change required to reduce the source-drain current by a factor of 10. Although a gate electrode is needed to measure the subthreshold swing of a transistor, I-V measurements for a two-terminal device (with no gate electrode) can also give clear information whether a targeted subthreshold swing is achievable or not when a gate is added. For example, if the source-drain current of a device can be turned down by a factor of 10 with a source-drain voltage change of 10 mV, a subthreshold swing of 10 mV/decade can be obtained as long as the gate coupling to the semiconductor nanoparticle is sufficiently high. We obtained this capability as described below.

Figure 23A:
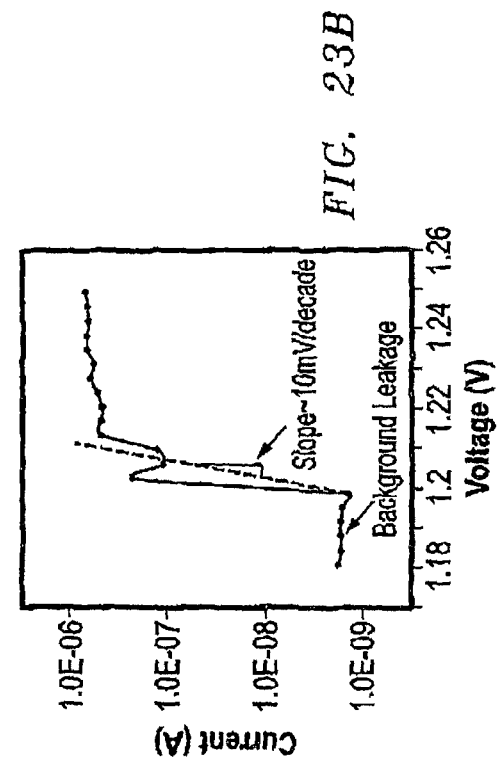
FIGS. 23A-23B are graphs of the I-V characteristics demonstrating a steep current turning-on/off capability of ~10 mV/decade at room temperature in accordance with one embodiment of the present invention.
Figure 23B:
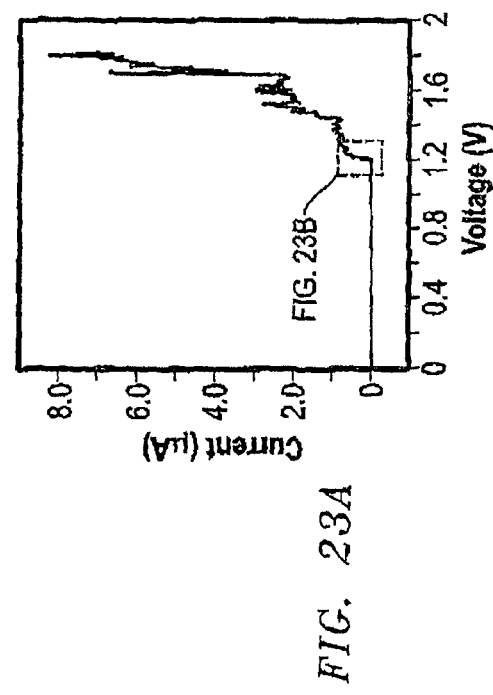

An energy-filtered cold electron device with the two-terminal configuration as in FIG. 17 was fabricated using $Cr_2O_3$ and $SiO_2$ as the tunneling barrier 1 and tunneling barrier 2, respectively. A CdSe QD with a diameter of ~6 nm was used as the semiconductor nanocrystal. FIG. 23A shows its I-V characteristics measured at room temperature. A very steep increase of electrical current (see the red dotted square) can be seen which corresponds to the alignment of the QW energy level E with the conduction band edge of the CdSe QD (1st energy state of the QD in the conduction band). FIG. 23B is a zoomed-in view of the steep current change in log scale and demonstrates that the slope is ~10 mV/decade. This data demonstrates that if a gate with a sufficient capacitive coupling with the QD is added to produce a transistor, FIG. 21, a subthreshold swing of 10 mV/decade can be obtained at room temperature. With further optimization of the electron energy filtering, effective electron temperatures can be further reduced below 45 K at room temperature and a subthreshold swing of less than 10 mV/decade can be realized at room temperature.

Figure 24B:
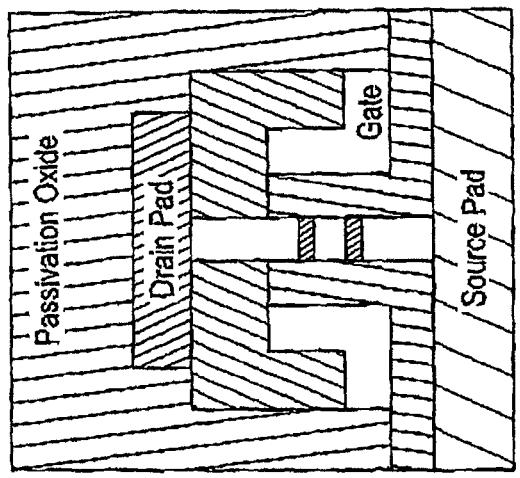
FIGS. 24A-24B are schematics of a completed energy-filtered cold electron nanopillar transistor with a gate electrode incorporated in accordance with one embodiment of the present invention.
Figure 24A:
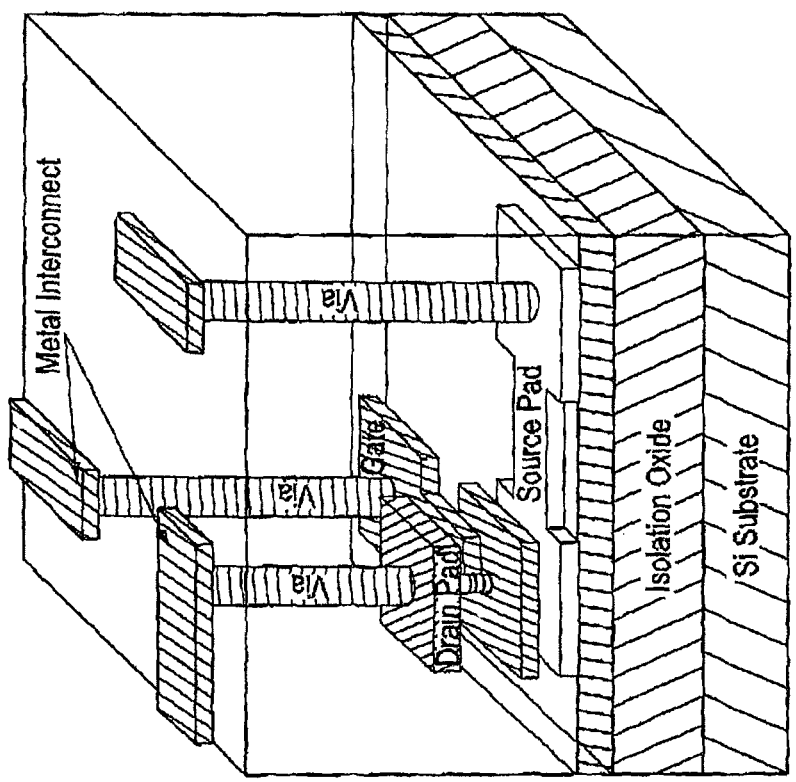

This section describes fabricating energy-filtered nanopillar cold electron transistors by inserting the gates into the two-terminal nanopillar devices shown in FIG. 20D. FIGS. 24A-24B show schematics of a completed energy-filtered cold electron nanopillar transistor with a gate electrode incorporated. In this configuration, the gate electrode surrounds the semiconductor island of the nanopillar, controlling its electrostatic potential. The procedure to achieve this configuration is schematically displayed in the cross-sectional view around the nanopillar in FIGS. 25A-25J. After nanopillar formation on the source pad, a conformal film of an insulating material (gate dielectric; e.g., $SiO_2$) is deposited using PECVD or ALD in FIG. 25A. The conformal deposition ensures that the same thickness of the insulating material is deposited on the side of nanopillar as on other planar surfaces. The metal for gate electrode (e.g., Cr, Al, and Ti) is deposited (e.g., using sputtering) onto the wafer, producing a semi-conformal film on top of the gate dielectric film in FIG. 25B. If necessary, the wafer may be constantly tilted and rotated during the sputter deposition, making the metal film more conformal. A passivation material is deposited, thick enough to cover all the nanopillars (the surface is planarized), in FIG. 25C. A planarized surface can be obtained either through spin-coating of spin-on glass (SOG) or using chemical-mechanical polishing (CMP). The passivation material is vertically etched using RIE until the gate metal film (in red) surrounding the drain portion of the nanopillar is well exposed in FIG. 25D. The exposed gate metal film is then selectively removed by wet chemical etching, exposing gate dielectric layer surrounding the drain portion of nanopillar in FIG. 25E. The exposed gate dielectric layer is subsequently removed by wet chemical etching, exposing the drain portion of the nanopillar in FIG. 25F. At this point, the gate metal (the red film) covers all the substrate surfaces. The gate metal is patterned to produce the gate structure in FIGS. 24A-24B. This is done using photolithography and RIE in FIGS. 25G-25H. With the procedure in FIG. 20C, the drain pad is fabricated in FIG. 25I. The wafer is then passivated in FIG. 25J, which is followed by the construction of interconnection lines, producing the final energy-filtered cold electron nanopillar transistor structure in FIGS. 24A-24B.

Energy-filtered cold electron nanopillar transistors that are individually addressable can be fabricated on a large scale. One essential requirement to achieve this is the capability of placing single nanoparticles (used for etching hard mask) on exact target locations on the substrate, FIG. 19A. This is achieved using a technique, named single-particle placement (SPP), in which single nanoparticles are electrostatically guided and placed on the target locations with nanoscale precision [60]. An SEM image in FIG. 26A shows the capability of the SPP; exactly one nanoparticle is placed on the center of each circular guiding pattern. The SPP can be utilized to precisely place single nanoparticles on exact target locations in a single batch process on an entire wafer, FIG. 26B, from which individually addressable nanopillar tunnel transistors can be created in parallel over an entire wafer, FIG. 26C.

The methods described above for the fabrication of the structures in FIG. 17 and FIG. 21 will now be briefly summarized. The device units were fabricated on Si wafers using CMOS-compatible processes and materials. The fabrication was carried out in the class 1000 cleanroom. Starting with a four inch silicon wafer, silicon oxide of ~1.5 µm was thermally grown for electrical isolation of the devices. Over the isolation oxide layer, bottom electrodes (Cr) were made using photolithography (Negative photoresist NR9-1000PY; Futurrex), deposition of ~200 nm thick Cr and lift-off. The insulating layers ($SiO_2$ or $Al_2O_3$) were deposited using plasma-enhanced chemical vapor deposition (PECVD) or atomic-layer deposition (ALD). The thicknesses of the insulating layers were 4.5 nm-10 nm, with the thinner layer for smaller nanoparticles (~5.5 nm CdSe) and the thicker layer for larger nanoparticles (~10 nm Au). The top electrodes (Cr) were put on the insulating layer using the second photolithography step (Negative photoresist NR9-1000PY; Futurrex), ~200 nm thick Cr metal deposition and lift-off. The top electrodes were positioned on top of the bottom electrodes using the alignment marks in the photomasks. Using the top electrodes as the hard mask, the insulating layer was then vertically etched away by reactive ion etching (RIE) with $CF_4$ chemistry. The RIE plasma etch created top electrode/insulating layer/bottom electrode stacks that were vertically aligned. Then, CdSe quantum dots or the Au nanoparticles were attached on the exposed sidewall of the insulating layer in the top electrode/insulating layer/bottom electrode stack. After the nanoparticle attachment the device units were passivated with ~300 nm thick sputtered silicon oxide, followed by the final passivation with ~700 nm thick e-beam evaporated silicon oxide. For single-electron transistor fabrications, the gate electrodes were inserted before the final passivation step. The gate patterns were defined using an additional photolithography step (Negative photoresist NR9-1000PY; Futurrex), followed by ~350 nm thick Cr deposition and lift-off. To form the metal contact to bottom electrodes, top electrodes and gate electrodes, the Via-holes were created by the RIE etching of the passivation silicon oxide. Finally the bond pads were defined using photolithography, followed by evaporation of ~100 nm Cr and ~250 nm Au, and lift-off.

Procedure to attach semiconductor or metal nanoparticles onto the exposed sidewall of the insulating layer is described here. The substrate was functionalized with self-assembled monolayers (SAMs) of 3-aminopropyltriethoxysilane (APTES: $(C_2H_5O)_3$—Si—$(CH_2)_3$—$NH_2$). The APTES (99%) was purchased from Sigma-Aldrich and used without further purification. The SAMs of APTES were formed by immersing the substrate in 1 mM APTES solution in ethanol for 30 minutes at room temperature. The substrate was then rinsed with pure ethanol, followed by drying with nitrogen. The ~7 nm and ~5.5 nm CdSe nanoparticles in toluene were purchased from NN Labs. The ~10 nm Au nanoparticle colloid was purchased from Ted Pella. The APTES functionalized substrates were immersed in the CdSe or Au nanoparticle colloids at room temperature for 8-24 hours. CdSe or Au nanoparticles were attached on the exposed sidewall of the insulating layer as well as other exposed surfaces. Only the nanoparticles that were attached on the exposed sidewall and were in the right tunneling range from both electrodes contributed to the electrical signal. After attachment of CdSe or Au nanoparticles, the wafers were exposed to UV ozone (PSD-UVT, NovaScan) for 30 minutes at room temperature. After the UV ozone treatment, the wafers were immediately transported into the vacuum chamber for silicon oxide passivation.

Here we describe key elements that can lower electron temperature even further and make the energy-filtered cold electron transport more powerful. In principle, if there is no nearby energy state in the QW to which the electron can be thermally excited, the tunneling of an electron from the source electrode to the QW state leaves the electron at zero temperature [8, 9]. Furthermore, if the electron does not gain energy during the subsequent tunneling event to the QD, the electron temperature would remain effectively at zero Kelvin. If these two conditions were fulfilled, electron transport at extremely-low electron temperatures can be obtained. The first condition can be satisfied relatively easily since the energy level separation in the QW can be made much larger than the room temperature thermal energy [16, 23]; with a thin (<2 nm) layer thickness of the barrier 1 in FIG. 14, the energy level separation of the QW becomes much larger (>a few hundred meV) than the room temperature thermal energy (~25 meV). The second condition, i.e., blocking energy-gaining pathways, can be fulfilled by controlling the factors that affect the phonon absorption. For example, the phonon absorption can be minimized by lowering the effective Debye cutoff frequency. This can be achieved by proper selection of materials for QD, dielectric, passivation layers, etc. and proper design of device dimensions (e.g., QD size) and geometric configurations.

Out of many breakthroughs of this invention described in the previous sections, two of them are specifically noted below as they have immediate relevance to practical applications.

First, our invention allows energy filtering and effective cooling of electrons "without any external cooling", i.e., the energy filtering can be carried out "at room temperature". Furthermore, the temperature lowering can be as much as 250 degrees (295K–45K=250K) even the system is operated at room temperature. This unique capability of this invention may be compared with previous works by others in which the electron temperature is effectively lowered only when the entire system is cooled to cryogenic temperatures, typically less than 1 Kelvin [8-15]. This requirement of external cooling using cryogens (liquid He or liquid $N_2$) or cryogenic cooling systems severely limits practical applications.

Second, our invention allows a large-scale parallel fabrication of energy-filtered cold electron devices using CMOS-compatible processes and materials. All the energy-filtered cold electron device structures previously described (FIGS. 1C, 17, 18, 19, 20, 21, 24, 25, and 26) can be fabricated using CMOS-compatible processes and materials. This important advantage of present invention may be compared with previous works by others [8-15] in which materials and processes used are not CMOS-compatible and a large-scale fabrication is difficult to achieve.

The present invention provides a transformative technology that effectively suppresses the Fermi-Dirac distribution of electrons, in which electron energies are filtered and very low electron temperatures (<45 K) are obtained without any physical cooling. With this effective temperature lowering, many novel electronic, optoelectronic, and spintronic devices that can currently function only at cryogenic temperatures will be able to operate at room temperature without any external cooling. Furthermore, the low electron temperature can dramatically enhance the performance of many electronic, optoelectronic, and spintronic devices at room temperature. One important example among many potential military, commercial, and space applications is to utilize the electron energy filtering and effective temperature lowering to fabricate transistors that can operate with extremely-low power consumption (green transistors), cutting the energy consumption by a factor of >100. This means that electronic equipment can function with only 1% of power resources or the battery weight of an instrument and can be reduced by a factor of >100, without sacrificing the performance. This capability would generate numerous military applications, examples include: unmanned aerial vehicles (UAVs), remote communication devices, remote sensing devices, missiles, submarines, aircrafts, and electronic devices that marines carry in their missions. Impact to commercial device applications is also expected to be immense; for example, cell phones and laptops that can operate for a month without recharging can be realized.

Various new transistor architectures using the room-temperature energy filter of the present invention will now be described.

One of the key elements of the invention is to create a quantum well adjacent to an electrode. The discrete energy level in the quantum well created serves as the energy filter. In the exemplary structure composed of $Cr/Cr_2O_3/SiO_2$, the quantum well is formed through band bending of the $Cr_2O_3$ conduction band. Direct evidence of quantum well formation is provided by directly measuring the amount of band bending of the chromium oxide layer which resides between the Cr electrode and $SiO_2$ layer. This is done by fabricating a metal-insulator-semiconductor (MIS) structure in which the insulator is composed of $Cr_2O_3/SiO_2$ layers and carrying out C-V (capacitance-voltage) measurements of the fabricated MIS units. The C-V measurement of the MIS structure is a well-established technique that can directly measure the energy band bending of the insulating layer [81-84]. The amount of band bending of the $Cr_2O_3$ layer was obtained from the flat band voltage shift ($\Delta V_{FB}$) in the C-V plot for MIS units having varying $Cr_2O_3$ thicknesses. For ~2 nm $Cr_2O_3$ (the thickness of native chromium oxide used in the CdSe QD devices and SETs), the $\Delta V_{FB}$ is measured to be −1.1±0.1 V, meaning that the depth of the $Cr_2O_3$ quantum well of the devices is 1.1±0.1 eV. The detail of the experimental measurements is described below.

Figure 27:
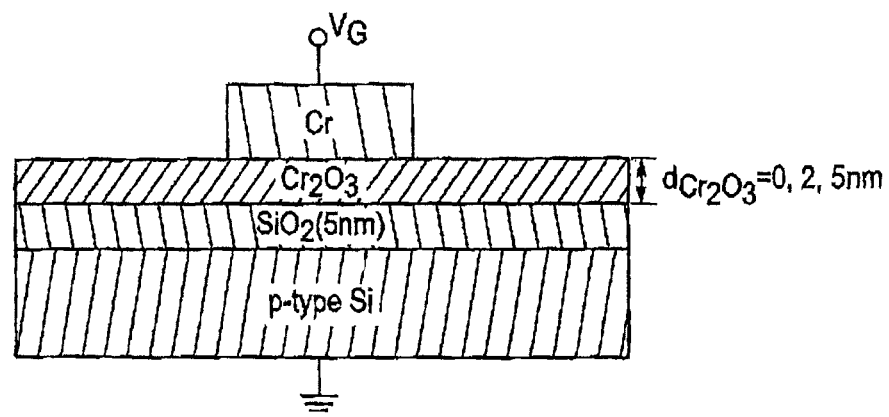
FIG. 27 is a schematic of a metal-insulator-semiconductor (MIS) structure for a direct measurement of the energy band bending of the $Cr_2O_3$ layer in accordance with one embodiment of the present invention.

FIG. 27 shows a schematic of the MIS structure for a direct measurement of the energy band bending of the $Cr_2O_3$ layer in accordance with one embodiment of the present invention. The materials used for the MIS are as follows. For the semiconductor, a p-type Si substrate (sheet resistance: 1-25Ω·cm) was used. On top of the Si substrate, 5 nm $SiO_2$ layer was sputter-deposited with a slow deposition rate of 0.17 nm per minute (AJA Orion UHV System). On top of the $SiO_2$ layer, a $Cr_2O_3$ layer was sputter-deposited in-situ with a deposition rate of 0.25 nm per minute (AJA Orion UHV System). Here the thickness of the $Cr_2O_3$ layer was varied with 3 different conditions: 0 nm (no $Cr_2O_3$ layer), 2 nm and 5 nm. Then, a Cr metal electrode was deposited using the photolithography and lift-off.

Figure 28A:
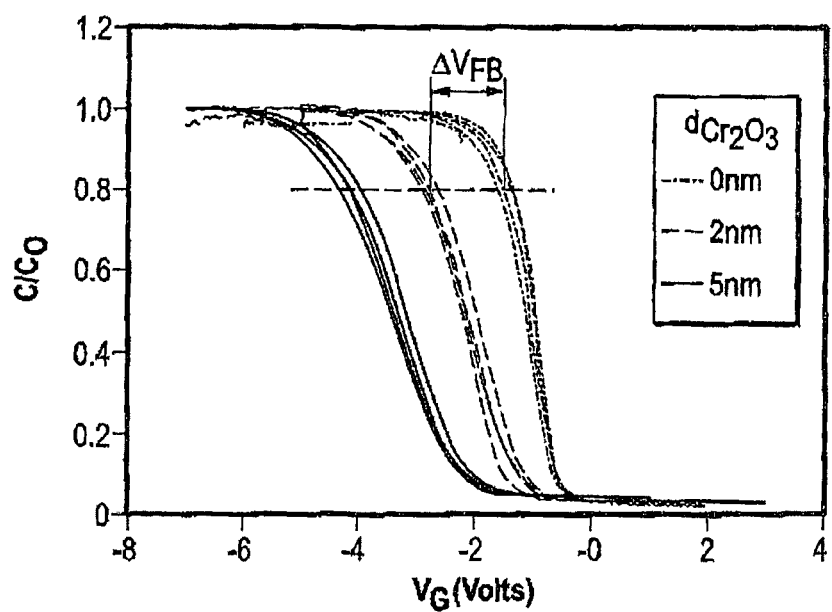
FIGS. 28A-28B are graphs of the measured C-V characteristics for the MIS units with varying $Cr_2O_3$ layer thicknesses $d_{Cr2O3}$ in accordance with one embodiment of the present invention.

The C-V measurements were carried out with an AC modulation frequency of 1 MHz. FIG. 28A shows the measured C-V characteristics for the MIS units having $Cr_2O_3$ layer thicknesses $d_{Cr2O3}$=0 nm (blue), 2 nm (red) and 5 nm (green) (each C-V line is a measurement from a different MIS unit). The C-V data shows that the flat band voltage $V_{FB}$ is shifting in the direction of increasing negative voltages with increasing $Cr_2O_3$ layer thicknesses $d_{Cr2O3}$. The flat band voltage $V_{FB}$ is defined as the voltage $V_G$ at which the C/Co is 0.8 (the dashed line). $\Delta V_{FB}$ (in red in FIG. 28A) is the flat band voltage shift for $d_{Cr2O3}$=2 nm, i.e., $\Delta V_{FB}=V_{FB}$ ($d_{Cr2O3}$=2 nm)−$V_{FB}$ ($d_{Cr2O3}$=0 nm). C/Co is normalized capacitance, where Co is the total capacitance of the $Cr_2O_3/SiO_2$ layers ($1/Co=1/C_{Cr2O3}+1/C_{SiO2}$). The flat band voltages $V_{FB}$ with varying $Cr_2O_3$ thicknesses $d_{Cr2O3}$ are summarized in FIG. 28B. The $V_{FB}$'s are from the C-V measurements in FIG. 28A. A linear relationship is found with $R^2$ value of 0.98. This linear relationship is in good agreement with the known relationship between the flat band voltage shift and the insulating layer thickness [81-84]:

$$\Delta V_{FB}(d_{Cr2O3})=-Q_i/C_{Cr2O3}=-(Q_i/\epsilon_{Cr2O3})\times d_{Cr2O3} \quad (42)$$

$Q_i$ is the effective interface charge density at the $Cr_2O_3/SiO_2$ interface, $C_{Cr2O3}$ is the capacitance per unit area of the $C_{Cr2O3}$ layer, and $\epsilon_{Cr2O3}$ is the permittivity of $Cr_2O_3$.

Figure 28B:
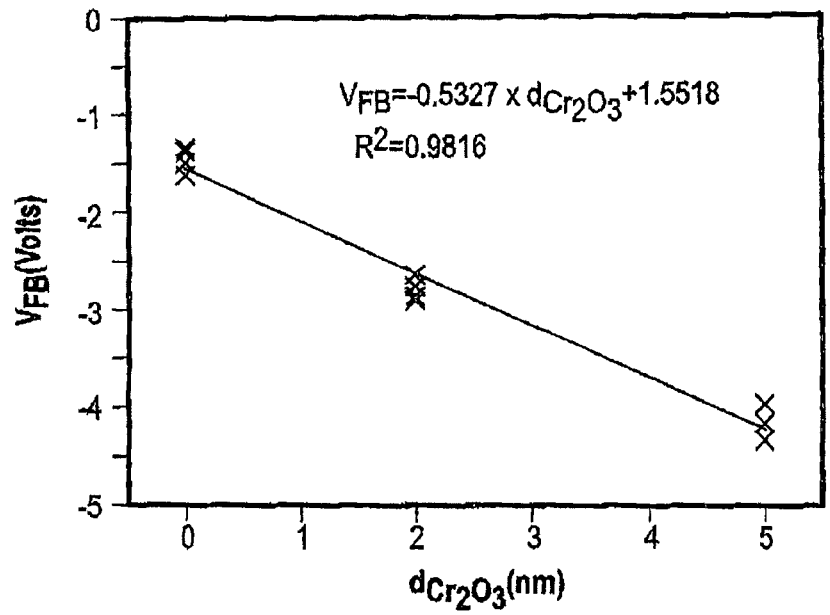

From the C-V measurements in FIGS. 28A-28B, the following is noted. First, the negative shift of $V_{FB}$ with increasing $Cr_2O_3$ thicknesses shows that the energy band bending of the $Cr_2O_3$ layer occurs in the direction to form a quantum well, i.e., the $Cr_2O_3$ energy band goes down as it approaches the $Cr_2O_3/SiO_2$ interface. Second, the magnitude of the flat band voltage shift $\Delta V_{FB}$ for 2 nm $Cr_2O_3$ is about 1 volt or larger, FIG. 28A. More quantitatively, $\Delta V_{FB}$ is −1.1±0.1 V from the linear regression in FIG. 28B:

$$\Delta V_{FB}(d_{cr2O3} = 2 \text{ nm}) = V_{FB}(d_{cr2O3} = 2 \text{ nm}) - V_{FB}(dr_{2O3} = 0 \text{ nm}) \quad (43)$$

$$= -0.5327 \times 2$$

$$= -1.0624 \text{ [V]}$$

From the above, the depth of the quantum well formed in 2 nm $Cr_2O_3$ layer is 1.1±0.1 [eV].

The linear relationship in FIG. 28B and its excellent agreement with the equation (42) prove that for the $Cr/Cr_2O_3/SiO_2$ system shown here as an example, the interface charges at the $Cr_2O_3/SiO_2$ interface are responsible for the quantum well formation, and eventually for the energy filtering. The interface charges are spontaneously formed during the fabrication process and the amount of the interface charges created depends on the process condition, for example, the process parameters (pressure, RF power, gas flow rate, etc.) for the $SiO_2$ deposition. This means that by engineering the process parameters the amount of interface charges can be controlled, which in turn control the amount of the band bending, the depth of quantum well, and the positions of the quantum well energy levels, eventually determining the characteristics (e.g., the effective electron temperature) of the energy filtering.

In summary, the energy band bending of the $Cr_2O_3$ layer has been directly measured by fabricating MIS units having varying $Cr_2O_3$ thicknesses and carrying out C-V measurements of the MIS units. The negative values of the flat band voltage shift $\Delta V_{FB}$ show that the band banding of the $Cr_2O_3$ layer occurs in the direction to form a quantum well. The depth of the quantum well for the 2 nm $Cr_2O_3$ layer is measured to be 1.1±0.1 [eV].

Another important element that enables the room-temperature energy filtering of the present invention is the large separation between quantum levels in the QW energy filter. For energy filtering through a quantum state to work at room temperature, the level spacing between adjacent quantum levels in the energy filter must be appreciably larger than room-temperature thermal energy, ~25 meV. The narrow quantum confinement in the QW layer is able to produce large energy level separations because a QW can reliably be made very thin, a few nanometers. For the chromium oxide QW of the present invention, its thickness (~2 nm) along with its QW depth (~1 eV) produces energy level spacing larger than 250 meV. This level separation is more than ten times larger than room-temperature thermal energy, making room-temperature energy filtering possible.

An added practical benefit to the QW energy filter of the present invention is its facile formation. For the chromium oxide QW used, the oxide is spontaneously formed on the chromium electrode surface, a relatively simple and controllable procedure. In addition, the materials used in the QW energy filter formation (e.g., Cr, $Cr_2O_3$ and $SiO_2$) are compatible with mainstream CMOS materials and processes. This CMOS compatibility is an important attribute that is essential for a broad range of practical device applications.

A variety of new transistor architectures can be created using the room-temperature energy filter of the present invention. The energy filter is positioned adjacent to an electrode and filters out thermally excited energetic electrons in the electrode as they are transported to the central island and eventually to the other electrode. A gate adjacent to the central island controls the electrostatic potential of the central island and thereby controls electron transport. The room-temperature energy filter of the present invention can be used to create a variety of new transistor structures since the energy filters can be implemented into many different configurations. Two examples have been described in the previous sections, one using vertically stacked source/insulating layer/drain configuration with the central island attached on the sidewall of the insulating layer, the other using the nanopillar structure. Another example is described here that uses a planar configuration in which source, energy filter, a central island, and drain are positioned in a planner configuration.

Figure 29:
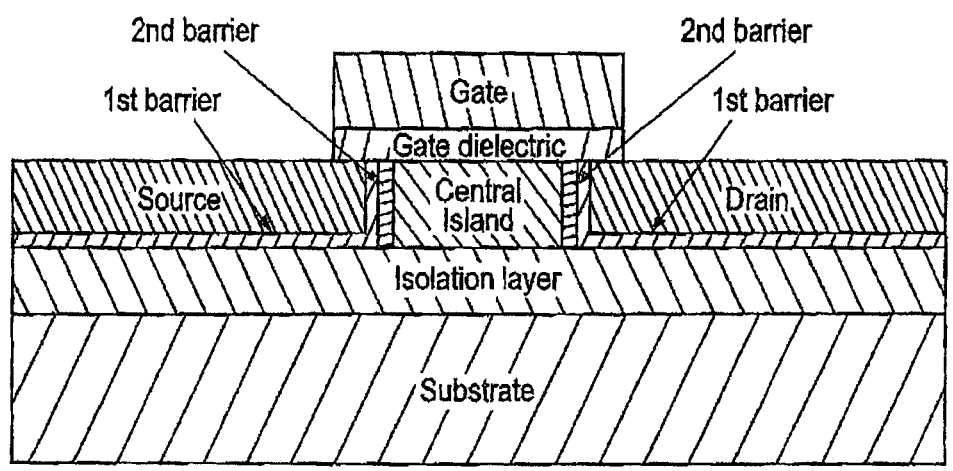
FIG. 29 is a schematic of an example of energy-filtered cold electron transistor that utilizes room-temperature energy filter in accordance with one embodiment of the present invention.

FIG. 29 shows a schematic (not to scale) of an energy-filtered cold electron transistor in a planer configuration that utilizes room-temperature energy filter in accordance with the present invention. The room-temperature energy filter is positioned between an electrode and the central island. The room-temperature energy filter is formed in a configuration made of a sequential arrangement of an electrode, first tunneling barrier, second tunneling barrier, and a central island. The quantum well is formed in the first tunneling barrier using energy band bending and a discrete level of the quantum well serves as the energy filter. The gate electrode located on top of the central island controls the electrostatic potential of the central island and controls the electron transport from one electrode to the other.

More specifically, the energy-filtered cold electron transistor includes a central island, a second tunneling barrier, an additional second tunneling barrier, a first tunneling barrier, an additional first tunneling barrier, a first electrode, a second electrode, a gate dielectric and a gate electrode. The central island is disposed on an isolation layer and has at least a first wall and a second wall. The central island can be a bulk semiconductor material, a semiconductor nanoparticle, a metal nanoparticle, an organic material, an inorganic material, a magnetic material, or a superconducting material. The second tunneling barrier is disposed on the first wall of the central island. The additional second tunneling barrier is disposed on the second wall of the central island. The first tunneling barrier is disposed on the second tunneling barrier and a first portion of the isolation layer. The additional first tunneling barrier is disposed on the additional second tunneling barrier and a second portion of the isolation layer. The first electrode is disposed on the first tunneling barrier above the first portion of the isolation layer and adjacent to the first tunneling barrier disposed on the second tunneling barrier. The second electrode is disposed on the additional first tunneling barrier above the second portion of the isolation layer and adjacent to the additional first tunneling barrier disposed on the additional second tunneling barrier. The gate dielectric is disposed above a portion of the first electrode, the first tunneling barrier, the second tunneling barrier, the central island, the additional second tunneling barrier, the additional first tunneling barrier and a portion of the second electrode. Alternatively, the gate dielectric is disposed only above the central island. The gate electrode is disposed on the gate dielectric.

An energy-filtered cold electron transistor, comprising a first electrode, a second electrode, a gate electrode and an electron energy filter (quantum well) disposed between the first electrode and the second electrode, operates by filtering out any thermally excited electrons using the electron energy filter by a discrete state of the quantum well at room temperature, transporting only energy-filtered cold electrons between the first and second electrodes, and controlling the transport of the energy-filtered cold electrons using the gate electrode. The energy-filtered cold electrons are produced with an effective electron temperature of 45 K or below at room temperature using the electron energy filter without any external cooling. The energy-filtered cold electron transistor produces extremely steep current turn-on and turn-off capability, wherein the energy-filtered cold electrons with an effective electron temperature of 45 K or below produce a subthreshold swing of less than or equal to 10 mV/decade at room temperature. The energy-filtered cold electron transistor can have a supply voltage of less than or equal to 0.1 V.

The electron energy filter is formed from a sequential arrangement of the first electrode, a first tunneling barrier and a second tunneling barrier. The quantum well is formed in the first tunneling barrier and a discrete quantum state or multiple number of discrete quantum states are formed in the quantum well. A depth of the quantum well is controlled by energy band bending of the first tunneling barrier and the energy band bending is adjusted by controlling interface charges, interface dipoles, and formation of SAMs (self-assembled monolayers) at a surface of the first tunneling barrier. The electron energy filter can also be formed from a sequential arrangement of the second electrode, an additional first tunneling barrier and an additional second tunneling barrier. In such a case, the quantum well is formed in the additional first tunneling barrier and a discrete quantum state or multiple number of discrete quantum states are formed in the quantum well. The depth of the quantum well is controlled by energy band bending of the additional first tunneling barrier and the energy band bending is adjusted by controlling interface charges, interface dipoles, and formation of SAMs (self-assembled monolayers) at a surface of the additional first tunneling barrier.

FIGS. 30A-30J show a schematic (not to scale) of process flow for a fabrication of the energy-filtered cold electron transistor shown in FIG. 29. Here the materials for the substrate, isolation layer, central island, electrode, first tunneling barrier, and second tunneling barrier are displayed. The materials displayed are to show an example of materials selection and other sets of materials can be used. In this example, Si, $SiO_2$, Si, Cr, $Cr_2O_3$ and $SiO_2$ are used for substrate, isolation layer, central island, electrode, first tunneling barrier, and second tunneling barrier, respectively.

Figure 30A:
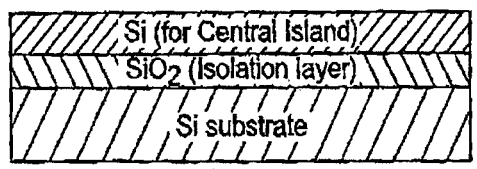
FIGS. 30A-30J illustrates the process flow for fabricating the energy-filtered cold electron transistor in FIG. 29 in accordance with one embodiment of the present invention.
Figure 30B:
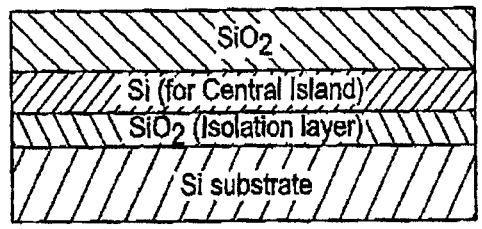
Figure 30C:
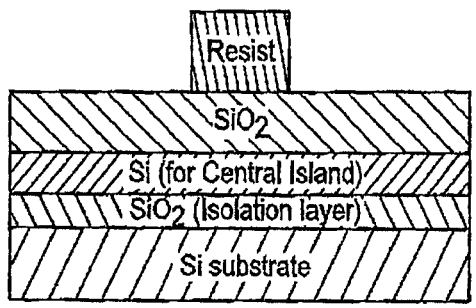
Figure 30D:
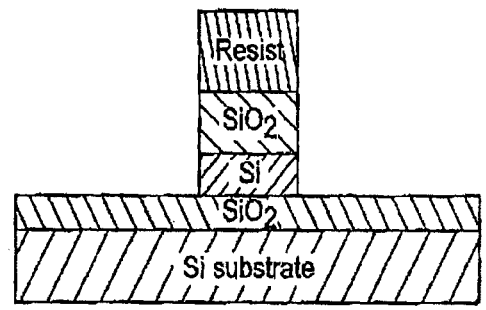
Figure 30E:
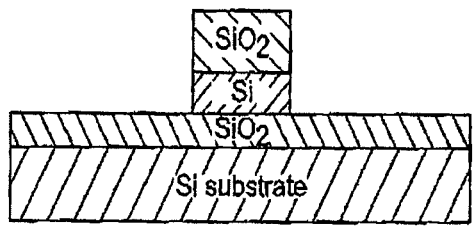
Figure 30F:
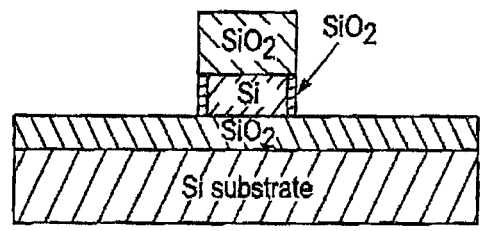
Figure 30G:
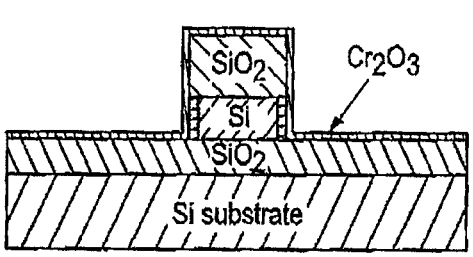
Figure 30H:
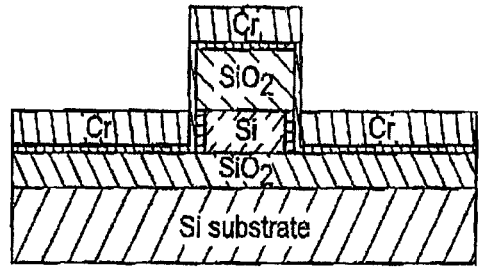
Figure 30I:
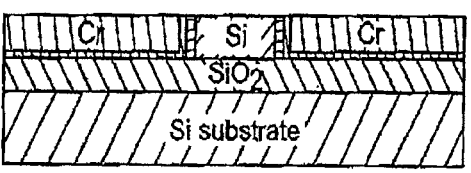
Figure 30J:
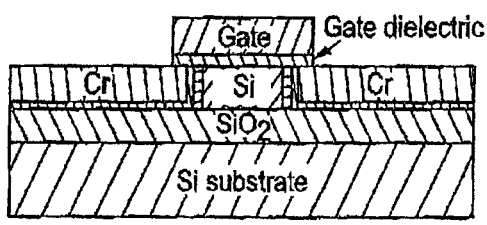

FIG. 30A shows a starting structure, in which Si layer (for the central island) is separated from the substrate with $SiO_2$ isolation layer. On top of the Si layer, a $SiO_2$ layer is deposited as shown in FIG. 30B. A resist is deposited on the $SiO_2$ layer and patterned using lithography as shown in FIG. 30C. Using the resist, the underlying $SiO_2$/Si layers are vertically etched using plasma etching (reactive ion etching: RIE) as shown in FIG. 30D. The resist is removed as shown in FIG. 30E. The sidewall of the Si central island is oxidized producing $SiO_2$ layer, which serves as the second tunneling barrier, as shown in FIG. 30F. Alternatively, the second tunneling barrier can be formed using deposition techniques such as plasma enhanced chemical vapor deposition (PECVD), atomic layer deposition (ALD), or sputtering. Then, the first tunneling barrier ($Cr_2O_3$) is conformally deposited using techniques such as sputtering as shown in FIG. 30G. The metal electrode (Cr) is deposited using techniques such as e-beam evaporation or thermal evaporation as shown in FIG. 30H. The structures positioned above the Si central island are then lifted off by removing $SiO_2$ using HF etching and sonication, leaving a planer structure, as shown FIG. 30I. The gate dielectric and gate electrode are formed using lithography and deposition of gate dielectric and gate metal, completing the energy-filtered cold electron transistor structure, as shown in FIG. 30J.

More specifically, the method for forming an energy-filtered cold electron transistor includes providing a substrate, forming or depositing an isolation layer on the substrate, forming or depositing a semiconductor material or a metal on the isolation layer in FIG. 30A. The semiconductor material or the metal is used to from the central island and can be selected from the group including Si, Ge, CdSe, CdTe, GaAs, InP, InAs, Al, Pb, Cr, Cu, Au, Ag, Pt, Pd, and Ti. An organic material, an inorganic material, a magnetic material or a superconducting material can also be used as a central island material. Forming or depositing a sacrificial material on the central island material in FIG. 30B. Depositing and patterning a resist to define a shape of the central island in FIG. 30C. Forming the central island by etching or removing the sacrificial material and the semiconductor material or the metal around the central island in FIG. 30D, and removing the resist in FIG. 30E. A second tunneling barrier material is formed or deposited around the semiconductor material or the metal of the central island in FIG. 30F. The second tunneling barrier material forms a second tunneling barrier on a first side of the central island and an additional second tunneling barrier on a second side of the central island. A first tunneling barrier material is formed or deposited on top and around the sacrificial material on the central island, on the second tunneling barrier, and on the isolation layer in FIG. 30G. The first tunneling barrier material forms a first tunneling barrier adjacent to the second tunneling barrier and an additional first tunneling barrier adjacent to the additional second tunneling barrier. The first tunneling barrier and the second tunneling barrier can be a single type of material, or two different materials. For example, the first tunneling barrier can be selected from the group including $Al_2O_3$, $Cr_2O_3$, and $TiO_x$ and the second tunneling barrier can be selected from the group including $SiO_2$, $Si_3N_4$, $Al_2O_3$, $Cr_2O_3$, and $TiO_x$. An electrode material is formed or deposited on the first tunneling barrier to form a first electrode adjacent to the first tunneling barrier and a second electrode adjacent to the additional first tunneling barrier in FIG. 30H. The electrode material for first electrode and second electrode can be selected from the group including Al, Pb, Cr, Cu, Au, Ag, Pt, Pd, and Ti. All materials above a plane substantially level with a top of the first electrode and the second electrode are removed or lifted off in FIG. 30I. A gate dielectric is formed or deposited above a portion of the first electrode, the first tunneling barrier, the second tunneling barrier, the central island, the additional second tunneling barrier, the additional first tunneling barrier and a portion of the second electrode in FIG. 30J. Alternatively, the gate dielectric is formed or deposited only above the central island. A gate electrode is formed or deposited on the gate dielectric in FIG. 30J. In addition, one or more vias and metal interconnects attached to the first electrode, the second electrode, the gate electrode or a combination thereof can be formed (not shown).

Figure 31A:
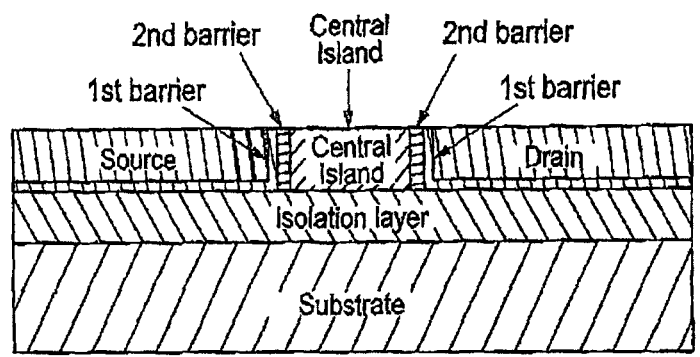
FIGS. 31A-31B are a cross sectional view and top view of the energy-filtered cold electron transistor in accordance with one embodiment of the present invention.
Figure 31B:
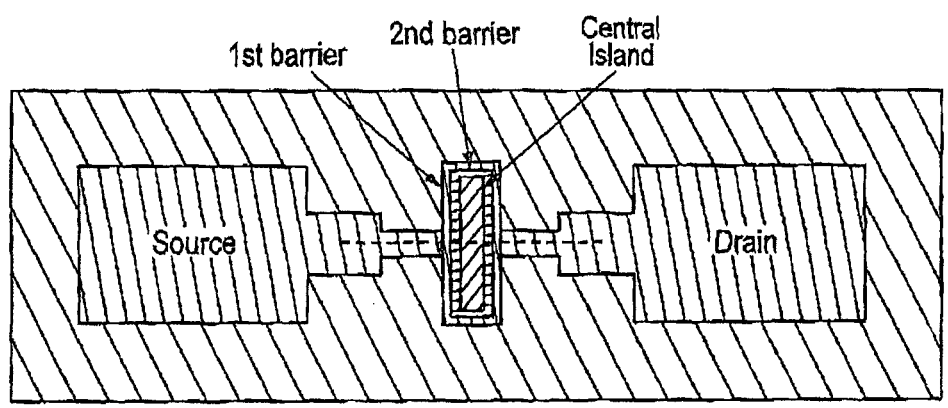
Figure 32A:
FIGS. 32A-32E are schematics of mask layouts used to fabricate the energy-filtered cold electron transistor in FIG. 29 in accordance with one embodiment of the present invention.
Figure 32B:
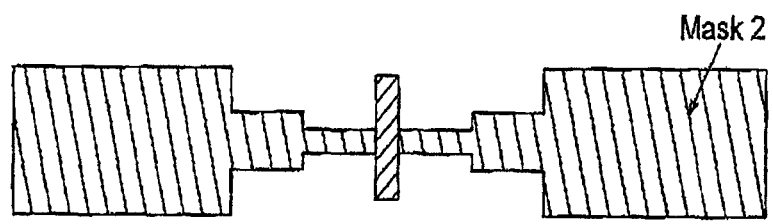
Figure 32C:
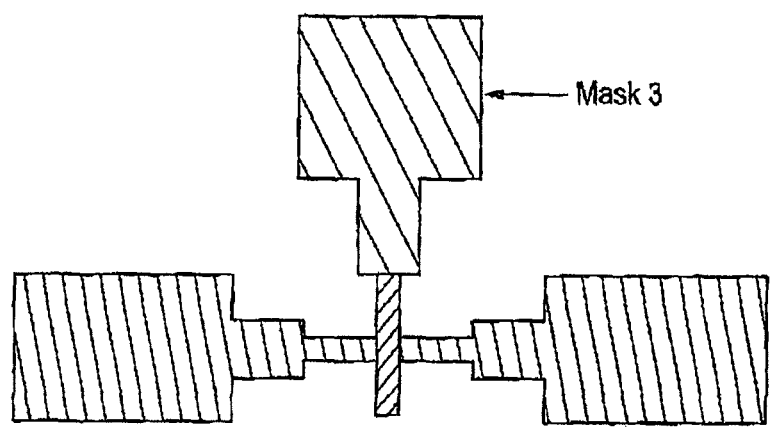
Figure 32D:
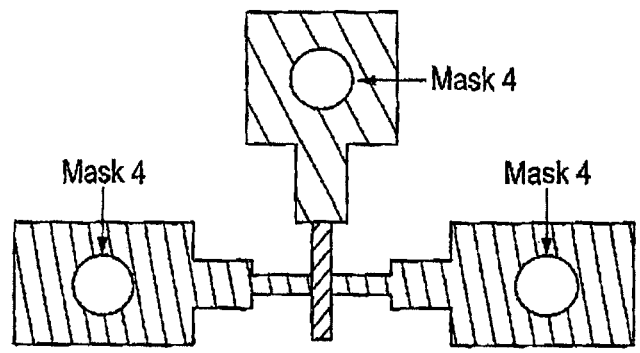
Figure 32E:
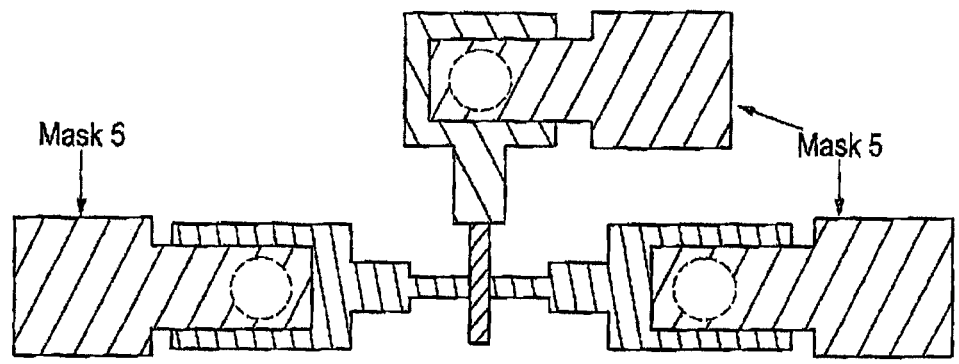

FIGS. 31A-31B show cross sectional and top views (not to scale) of the energy-filtered cold electron transistor in accordance with the present invention. The gate electrode and gate dielectric are not shown for simplicity. The dotted line in FIG. 31B indicates where the cross section is made for the cross sectional view in FIG. 31A. FIGS. 32A-32E show schematic of the mask set (not to scale) that can be used to fabricate the transistor structure with the procedure in FIGS. 30A-30J. The central island is formed using a first mask in a first pattern substantially as shown in FIG. 32A. The first electrode and the second electrode are formed using a second mask in a second pattern substantially as shown in FIG. 32B. The gate electrode is formed using a third mask in a third pattern substantially as shown in FIG. 32C. The one or more vias are formed using a fourth mask in a fourth pattern substantially as shown in FIG. 32D. The one or more metal interconnects are formed using a fifth mask in a fifth pattern substantially as shown in FIG. 32E.

The energy-filtered cold electron transistor in FIGS. 29-31 can be fabricated with completely CMOS-compatible processes and materials. The energy-filtered cold electron transistors can be fabricated on a large scale in parallel processing using CMOS-compatible mask steps.

It will be understood by those of skill in the art that information and signals may be represented using any of a variety of different technologies and techniques (e.g., data, instructions, commands, information, signals, bits, symbols, and chips may be represented by voltages, currents, electromagnetic waves, magnetic fields or particles, optical fields or particles, or any combination thereof). Likewise, the various illustrative logical blocks, modules, circuits, and algorithm steps described herein may be implemented as electronic hardware, computer software, or combinations of both, depending on the application and functionality. Moreover, the various logical blocks, modules, and circuits described herein may be implemented or performed with a general purpose processor (e.g., microprocessor, conventional processor, controller, microcontroller, state machine or combination of computing devices), a digital signal processor ("DSP"), an application specific integrated circuit ("ASIC"), a field programmable gate array ("FPGA") or other programmable logic device, discrete gate or transistor logic, discrete hardware components, or any combination thereof designed to perform the functions described herein. Similarly, steps of a method or process described herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. Although preferred embodiments of the present invention have been described in detail, it will be understood by those skilled in the art that various modifications can be made therein without departing from the spirit and scope of the invention as set forth in the appended claims.

REFERENCES

1. Roche, B., Riwar, R. P., Voisin, B., Dupont-Ferrier, E., Wacquez, R., Vinet, M., Sanquer, M., Splettstoesser, J. & Jehl, X. A two-atom electron pump. *Nat. Commun.* 4, 1581 (2013).
2. Allen, M. T., Martin, J. & Yacoby, A. Gate-defined quantum confinement in suspended bilayer graphene. *Nat. Commun.* 3, 934 (2012).
3. Jansen, R. Silicon spintronics. *Nat. Mater.* 11, 400-408 (2012).
4. Appelbaum, I., Huang, B. Q. & Monsma, D. J. Electronic measurement and control of spin transport in silicon. *Nature* 447, 295-298 (2007).
5. Tomioka, K., Yoshimura, M. & Fukui, T. A III-V nanowire channel on silicon for high-performance vertical transistors. *Nature* 488, 189-192 (2012).
6. Ionescu, A. M. & Riel, H. Tunnel field-effect transistors as energy-efficient electronic switches. *Nature* 479, 329-337 (2011).
7. Seabaugh, A. C. & Zhang, Q. Low-Voltage Tunnel Transistors for Beyond CMOS Logic. *Proc. IEEE* 98, 2095-2110 (2010).
8. van der Wiel, W. G., De Franceschi, S., Elzerman, J. M., Fujisawa, T., Tarucha, S. & Kouwenhoven, L. P. Electron transport through double quantum dots. *Rev. Mod. Phys.* 75, 1-22 (2003).
9. Kouwenhoven, L. Coupled Quantum Dots as Artificial Molecules. *Science* 268, 1440-1441 (1995).
10. van der Vaart, N. C., Godijn, S. F., Nazarov, Y. V., Harmans, C. J. P. M., Mooij, J. E., Molenkamp, L. W. & Foxon, C. T. Resonant Tunneling Through Two Discrete Energy States. *Phys. Rev. Lett.* 74, 4702-4705 (1995).
11. Muhonen, J. T., Meschke, M. & Pekola, J. P. Micrometer-scale refrigerators. *Rep. Prog. Phys.* 75, 046501 (2012).
12. Giazotto, F., Heikkila, T. T., Luukanen, A., Savin, A. M. & Pekola, J. P. Opportunities for mesoscopics in thermometry and refrigeration: Physics and applications. *Rev. Mod. Phys.* 78, 217-274 (2006).
13. Prance, J. R., Smith, C. G., Griffiths, J. P., Chorley, S. J., Anderson, D., Jones, G. A. C., Farrer, I. & Ritchie, D. A. Electronic Refrigeration of a Two-Dimensional Electron Gas. *Phys. Rev. Lett.* 102, 146602 (2009).
14. Edwards, H. L., Niu, Q. & Delozanne, A. L. A quantum-dot refrigerator. *Appl. Phys. Lett.* 63, 1815-1817 (1993).
15. Nahum, M., Eiles, T. M. & Martinis, J. M. Electronic Microrefrigerator Based on a Normal-Insulator-Superconductor Tunnel Junction. *Appl. Phys. Lett.* 65, 3123-3125 (1994).
16. Capasso, F., Mohammed, K. & Cho, A. Y. Sequential resonant tunneling through a multiquantum well superlattice. *Appl. Phys. Lett.* 48, 478-480 (1986).
17. Kita, K. & Toriumi, A. Origin of electric dipoles formed at high-k/$SiO_2$ interface. *Appl. Phys. Lett.* 94, 132902 (2009).
18. Kirsch, P. D. et al. Dipole model explaining high-k/metal gate field effect transistor threshold voltage tuning *Appl. Phys. Lett.* 92, 092901 (2008).
19. Harrison, W. A. & Tersoff, J. Tightbinding theory of heterojunction band lineups and interface dipoles. *J. Vac. Sci. Technol. B* 4, 1068-1073 (1986).
20. Tersoff, J. Theory of semiconductor heterojunctions: The role of quantum dipoles. *Phys. Rev. B* 30, 4874-4877 (1984).
21. Maraghechi, P., Foroughi-Abari, A., Cadien, K. & Elezzabi, A. Y. Observation of resonant tunneling phenomenon in metal-insulator-insulator-insulator-metal electron tunnel devices. *Appl. Phys. Lett.* 100, 113503 (2012).
22. Kakushima, K., Okamoto, K., Tachi, K., Song, J., Sato, S., Kawanago, T., Tsutsui, K., Sugii, N., Ahmet, P., Hattori, T. & Iwai, H. Observation of band bending of metal/high-k Si capacitor with high energy x-ray photoemission spectroscopy and its application to interface dipole measurement. *J. Appl. Phys.* 104, 104908 (2008).
23. Klimeck, G., Lake, R., Bowen, R. C., Frensley, W. R. & Moise, T. S. Qunantum device simulation with a generalized tunneling formula. *Appl. Phys. Lett.* 67, 2539-2541 (1995).
24. Chevoir, F. & Vinter, B. Scattering-assisted tunneling in double-barrier diodes: Scattering rates and valley current. *Phys. Rev. B* 47, 7260-7274 (1993).
25. Chen, J., Chen, J. G., Yang, C. H. & Wilson, R. A. The I-V characteristics of double-barrier resonant tunneling diodes: Observation and calculation on their temperature dependence and asymmetry. *J. Appl. Phys.* 70, 3131-3136 (1991).
26. Ray, V., Subramanian, R., Bhadrachalam, P., Ma, L. C., Kim, C. U. & Koh, S. J. CMOS-compatible fabrication of room-temperature single-electron devices. *Nat. Nanotechnol.* 3, 603-608 (2008).
27. Banin, U., Cao, Y. W., Katz, D. & Millo, O. Identification of atomic-like electronic states in indium arsenide nanocrystal quantum dots. *Nature* 400, 542-544 (1999).
28. Banin, U. & Millo, O. Tunneling and optical spectroscopy of semiconductor nanocrystals. *Annu. Rev. Phys. Chem.* 54, 465-492 (2003).
29. Alperson, B., Rubinstein, I., Hodes, G., Porath, D. & Millo, O. Energy level tunneling spectroscopy and single electron charging in individual CdSe quantum dots. *Appl. Phys. Lett.* 75, 1751-1753 (1999).
30. Jdira, L., Liljeroth, P., Stoffels, E., Vanmaekelbergh, D. & Speller, S. Size-dependent single-particle energy levels and interparticle Coulomb interactions in CdSe quantum dots measured by scanning tunneling spectroscopy. *Phys. Rev. B* 73, 115305 (2006).
31. Millo, O., Katz, D., Cao, Y. W. & Banin, U. Scanning tunneling spectroscopy of InAs nanocrystal quantum dots. *Phys. Rev. B* 61, 16773-16777 (2000).
32. Jdira, L., Overgaag, K., Stiufiuc, R., Grandidier, B., Delerue, C., Speller, S. & Vanmaekelbergh, D. Linewidth of resonances in scanning tunneling spectroscopy. *Phys. Rev. B* 77, 205308 (2008).
33. Overgaag, K., Vanmaekelbergh, D., Liljeroth, P., Mahieu, G., Grandidier, B., Delerue, C. & Allan, G. Electron-phonon coupling and intervalley splitting determine the linewidth of single-electron transport through PbSe nanocrystals. *J. Chem. Phys.* 131, 224510 (2009).
34. Sun, Z. X., Swart, I., Delerue, C., Vanmaekelbergh, D. & Liljeroth, P. Orbital and Charge-Resolved Polaron States in CdSe Dots and Rods Probed by Scanning Tunneling Spectroscopy. *Phys. Rev. Lett.* 102, 196401 (2009).
35. Li, J. B. & Wang, L. W. Band-structure-corrected local density approximation study of semiconductor quantum dots and wires. *Phys. Rev. B* 72, 125325 (2005).
36. Niquet, Y. M., Delerue, C., Lannoo, M. & Allan, G. Single-particle tunneling in semiconductor quantum dots. *Phys. Rev. B* 64, 113305 (2001).
37. Soloviev, V. N., Eichhofer, A., Fenske, D. & Banin, U. Molecular Limit of a Bulk Semiconductor: Size Dependence of the "Band Gap" in CdSe Cluster Molecules. *J. Am. Chem. Soc.* 122, 2673-2674 (2000).

38 Murray, C. B., Norris, D. J. & Bawendi, M. G. Synthesis and Characterization of Nearly Monodisperse CdE (E=S, Se, Te) Semiconductor Nanocrystallites. *J. Am. Chem. Soc.* 115, 8706-8715 (1993).

39 Ekimov, A. I., Hache, F., Schanneklein, M. C., Ricard, D., Flytzanis, C., Kudryavtsev, I. A., Yazeva, T. V., Rodina, A. V. & Efros, A. L. Absorption and Intensity-Dependent Photoluminescence Measurements on Cdse Quantum Dots—Assignment of the 1st Electronic-Transitions. *J. Opt. Soc. Am.* B 10, 100-107 (1993).

40 Likharev, K. K. Single-electron devices and their applications. *Proc. IEEE* 87, 606-632 (1999).

41 Fujisawa, T., Oosterkamp, T. H., van der Wiel, W. G., Broer, B. W., Aguado, R., Tarucha, S. & Kouwenhoven, L. P. Spontaneous emission spectrum in double quantum dot devices. *Science* 282, 932-935 (1998).

42 Brandes, T. & Kramer, B. Spontaneous emission of phonons by coupled quantum dots. *Phys. Rev. Lett.* 83, 3021-3024 (1999).

43 Khanna, S. K. & Lambe, J. Inelastic Electron Tunneling Spectroscopy. *Science* 220, 1345-1351 (1983).

44 Jaklevic, R. C. & Lambe, J. Molecular Vibration Spectra by Electron Tunneling. *Phys. Rev. Lett.* 17, 1139-1140 (1966).

45 Lambe, J. & Jaklevic, R. C. Molecular Vibration Spectra by Inelastic Electron Tunneling. *Phys. Rev.* 165, 821-832 (1968).

46 Nazarov, Y. V. Quantum interference, tunnel junctions and resonant tunneling interferometer. *Physica B* 189, 57-69 (1993).

47 Averin, D. V. & Likharev, K. K. in *Mesoscopic Phenomena in Solids* (eds B. L. Altshuler, P. A. Lee, & R. A. Webb) 173-271 (Elsevier, 1991).

48 De Volder, M. F. L., Tawfick, S. H., Baughman, R. H. & Hart, A. J. Carbon Nanotubes: Present and Future Commercial Applications. *Science* 339, 535-539 (2013).

49 Appenzeller, J., Lin, Y. M., Knoch, J. & Avouris, P. Band-to-band tunneling in carbon nanotube field-effect transistors. *Phys. Rev. Lett.* 93, 196805 (2004).

50 Knoll, L., Zhao, Q. T., Nichau, A., Trellenkamp, S., Richter, S., Schafer, A., Esseni, D., Selmi, L., Bourdelle, K. K. & Mantl, S. Inverters With Strained Si Nanowire Complementary Tunnel Field-Effect Transistors. *IEEE Electron Device Lett.* 34, 813-815 (2013).

51 Bakkers, E. P. A. M., Hens, Z., Zunger, A., Franceschetti, A., Kouwenhoven, L. P., Gurevich, L. & Vanmaekelbergh, D. Shell-Tunneling Spectroscopy of the Single-Particle Energy Levels of Insulating Quantum Dots. *Nano Lett.* 1, 551-556 (2001).

52 Zabet-Khosousi, A. & Dhirani, A. A. Charge Transport in Nanoparticle Assemblies. *Chem. Rev.* 108, 4072-4124 (2008).

53 Niquet, Y. M., Delerue, C., Allan, G. & Lannoo, M. Interpretation and theory of tunneling experiments on single nanostructures. *Phys. Rev. B* 65, 165334 (2002).

54 Franceschetti, A. & Zunger, A. Pseudopotential calculations of electron and hole addition spectra of InAs, InP, and Si quantum dots. *Phys. Rev. B* 62, 2614-2623 (2000).

55 Lannoo, M., Delerue, C. & Allan, G. Screening in Semiconductor Nanocrystallites and Its Consequences for Porous Silicon. *Phys. Rev. Lett.* 74, 3415-3418 (1995).

56 Yu, W. W., Qu, L. H., Guo, W. Z. & Peng, X. G. Experimental Determination of the Extinction Coefficient of CdTe, CdSe, and CdS nanocrystals. *Chem. Mat.* 15, 2854-2860 (2003).

57 Bawendi, M. G., Steigerwald, M. L. & Brus, L. E. The Quantum Mechanics of Larger Semiconductor Clusters ("Quantum Dots"). *Annu. Rev. Phys. Chem.* 41, 477-496 (1990).

58 Brus, L. E. Electron-electron and electron-hole interactions in small semiconductor crystallites: The size dependence of the lowest excited electronic state. *J. Chem. Phys.* 80, 4403-4409 (1984).

59 Stoof, T. H. & Nazarov, Y. V. Time-dependent resonant tunneling via two discrete states. *Phys. Rev. B* 53, 1050-1053 (1996).

60 Huang, H. W., Bhadrachalam, P., Ray, V. & Koh, S. J. Single-particle placement via self-limiting electrostatic gating. *Appl. Phys. Lett.* 93, 073110 (2008).

61 Kuo, C. H., Liu, C. P., Lee, S. H., Chang, H. Y., Lin, W. C., You, Y. W., Liao, H. Y. & Shyue, J. J. Effect of surface chemical composition on the work function of silicon substrates modified by binary self-assembled monolayers. *Phys. Chem. Chem. Phys.* 13, 15122-15126 (2011).

62 Chung, Y., Verploegen, E., Vailionis, A., Sun, Y., Nishi, Y., Murmann, B. & Bao, Z. A. Controlling Electric Dipoles in Nanodielectrics and Its Applications for Enabling Air-Stable n-Channel Organic Transistors. *Nano Lett.* 11, 1161-1165 (2011).

63 Munro, A. M., Zacher, B., Graham, A. & Armstrong, N. R. Photoemission Spectroscopy of Tethered CdSe Nanocrystals: Shifts in Ionization Potential and Local Vacuum Level As a Function of Nanocrystal Capping Ligand. *ACS Appl. Mater. Interfaces* 2, 863-869 (2010).

64 Lin, M. C., Chu, C. J., Tsai, L. C., Lin, H. Y., Wu, C. S., Wu, Y. P., Wu, Y. N., Shieh, D. B., Su, Y. W. & Chen, C. D. Control and detection of organosilane polarization on nanowire field-effect transistors. *Nano Lett* 7, 3656-3661 (2007).

65 Ofir, Y., Zenou, N., Goykhman, I. & Yitzchaik, S. Controlled amine functionality in self-assembled monolayers via the hidden amine route: Chemical and electronic tunability. *J. Phys. Chem. B* 110, 8002-8009 (2006).

66 Ray, S. G., Cohen, H., Naaman, R., Liu, H. Y. & Waldeck, D. H. Organization-induced charge redistribution in self-assembled organic monolayers on gold. *J. Phys. Chem. B* 109, 14064-14073 (2005).

67 Gu, D. F., Sistiabudi, R. & Dey, S. K. Modification of work function of Ti by self-assembled monolayer molecules on SiO(2)/p-Si. *J. Appl. Phys.* 97, 123710 (2005).

68 Crispin, X., Geskin, V., Crispin, A., Cornil, J., Lazzaroni, R., Salaneck, W. R. & Bredas, J. L. Characterization of the interface dipole at organic/metal interfaces. *J. Am. Chem. Soc.* 124, 8131-8141 (2002).

69 Lang, N. D. Theory of Work-Function Changes Induced by Alkali Adsorption. *Phys. Rev. B* 4, 4234-4244 (1971).

70 Gershewitz, O., Grinstein, M., Sukenik, C. N., Regev, K., Ghabboun, J. & Cahen, D. Effect of molecule-molecule interaction on the electronic properties of molecularly modified Si/SiOx surfaces. *J. Phys. Chem. B* 108, 664-672 (2004).

71 Lin, M. H., Chen, C. F., Shiu, H. W., Chen, C. H. & Gwo, S. Multilength-Scale Chemical Patterning of Self-Assembled Monolayers by Spatially Controlled Plasma Exposure: Nanometer to Centimeter Range. *J. Am. Chem. Soc.* 131, 10984-10991 (2009).

72 Nonnenmacher, M., Oboyle, M. P. & Wickramasinghe, H. K. Kelvin Probe Force Microscopy. *Appl. Phys. Lett.* 58, 2921-2923 (1991).

73 Jacobs, H. O., Knapp, H. F., Muller, S. & Stemmer, A. Surface potential mapping: A qualitative material contrast in SPM. *Ultramicroscopy* 69, 39-49 (1997).

74 Knizhnik, A. A., Iskandarova, I. M., Bagatur'yants, A. A., Potapkin, B. V. & Fonseca, L. R. C. Impact of oxygen on the work functions of Mo in vacuum and on $ZrO_2$. *J. Appl. Phys.* 97, 064911 (2005).

75 Rentenberger, S., Vollmer, A., Zojer, E., Schennach, R. & Koch, N. UV/ozone treated Au for air-stable, low hole injection barrier electrodes in organic electronics. *J. Appl. Phys.* 100, 053701, doi:10.1063/1.2336345 (2006).

76 Watson, D. F. Linker-Assisted Assembly and Interfacial Electron-Transfer Reactivity of Quantum Dot-Substrate Architectures. *J. Phys. Chem. Lett.* 1, 2299-2309, doi: 10.1021/jz100571u (2010).

77 Kawano, H. Effective work functions for ionic and electronic emissions from mono- and polycrystalline surfaces. Prog. *Surf Sci.* 83, 1-165, doi:DOI 10.1016/j.prog-surf.2007.11.001 (2008).

78 Solomon, P. M. Inability of Single Carrier Tunneling Barriers to Give Subthermal Subthreshold Swings in MOSFETs. *IEEE Electron Device Lett.* 31, 618-620 (2010).

79 Koswatta, S. O., Koester, S. J. & Haensch, W. On the Possibility of Obtaining MOSFET-Like Performance and Sub-60-mV/dec Swing in 1-D Broken-Gap Tunnel Transistors. *IEEE Trans. Electron Devices* 57, 3222-3230 (2010).

80 Theis, T. N. & Solomon, P. M. In Quest of the "Next Switch": Prospects for Greatly Reduced Power Dissipation in a Successor to the Silicon Field-Effect Transistor. *Proc. IEEE* 98, 2005-2014 (2010).

81 Sze, S. M. *Physics of Semiconductor Devices.* 2nd edn, Chapter 7, (John Wiley & Sons, 1981).

82 Streetman, B. G. & Banerjee, S. K. *Solid State Electronic Devices.* 6th edn, Chapter 6, (Pearson Prentice Hall, 2005).

83 Son, J., Chobpattana, V., McSkimming, B. M. & Stemmer, S. Fixed charge in high-k/GaN metal-oxide-semiconductor capacitor structures. *Appl. Phys. Lett.* 101, 102905 (2012).

84 Esposto, M., Krishnamoorthy, S., Nath, D. N., Bajaj, S., Hung, T. H. & Rajan, S. Electrical properties of atomic layer deposited aluminum oxide on gallium nitride. *Appl. Phys. Lett.* 99, 133503 (2011).

The invention claimed is:

1. A method for operating an energy-filtered cold electron transistor comprising the steps of:
providing the energy-filtered cold electron transistor, the energy-filtered cold electron transistor comprising a first electrode, a second electrode, a gate electrode and an electron energy filter disposed between the first electrode and the second electrode, wherein the electron energy filter comprises a quantum well;
filtering out any thermally excited electrons using the electron energy filter by a discrete state of the quantum well at room temperature;
transporting only energy-filtered cold electrons between the first and second electrodes; and
controlling the transport of the energy-filtered cold electrons using the gate electrode.

2. The method as recited in claim 1, wherein the energy-filtered cold electron transistor comprises a sequential arrangement of the first electrode, a first tunneling barrier, a second tunneling barrier, a central island, an additional second tunneling barrier and the second electrode.

3. The method as recited in claim 2, wherein the sequential arrangement further comprises an additional first tunneling barrier disposed between the additional second tunneling barrier and the second electrode.

4. The method as recited in claim 2, wherein the central island is formed from a bulk semiconductor material, a semiconductor nanoparticle, a metal nanoparticle, an organic material, an inorganic material, a magnetic material, or a superconducting material.

5. The method as recited in claim 1, wherein the electron energy filter is formed from a sequential arrangement of the first electrode, a first tunneling barrier and a second tunneling barrier.

6. The method as recited in claim 5, wherein the quantum well is formed in the first tunneling barrier and a discrete quantum state or multiple discrete quantum states are formed in the quantum well.

7. The method as recited in claim 6, wherein a depth of the quantum well is controlled by energy band bending of the first tunneling barrier and the energy band bending is adjusted by controlling interface charges, interface dipoles, and formation of SAMs (self-assembled monolayers) at a surface of the first tunneling barrier.

8. The method as recited in claim 1, wherein the electron energy filter is formed from a sequential arrangement of the second electrode, an additional first tunneling barrier and an additional second tunneling barrier.

9. The method as recited in claim 8, wherein the quantum well is formed in the additional first tunneling barrier and a discrete quantum state or multiple discrete quantum states are formed in the quantum well.

10. The method as recited in claim 9, wherein a depth of the quantum well is controlled by energy band bending of the additional first tunneling barrier and the energy band bending is adjusted by controlling interface charges, interface dipoles, and formation of SAMs (self-assembled monolayers) at a surface of the additional first tunneling barrier.

11. The method as recited in claim 1, wherein the energy-filtered cold electrons are produced with an effective electron temperature of 45 K or below at room temperature using the electron energy filter without any external cooling.

12. The method as recited in claim 11, wherein the energy-filtered cold electrons produce a subthreshold swing of less than or equal to 10 mV/decade at room temperature.

13. The method as recited in claim 12, wherein the energy-filtered cold electron transistor has a supply voltage of less than or equal to 0.1 V.

14. The method as recited in claim 1, wherein the energy-filtered cold electron transistor comprises:
a central island disposed on an isolation layer, the central island having at least a first wall and a second wall;
a second tunneling barrier disposed on the first wall of the central island;
an additional second tunneling barrier disposed on the second wall of the central island;
a first tunneling barrier disposed on the second tunneling barrier and a first portion of the isolation layer;
an additional first tunneling barrier disposed on the additional second tunneling barrier and a second portion of the isolation layer;
the first electrode disposed on the first tunneling barrier above the first portion of the isolation layer and adjacent to the first tunneling barrier disposed on the second tunneling barrier;
the second electrode disposed on the additional first tunneling barrier above the second portion of the isolation layer and adjacent to the additional first tunneling barrier disposed on the additional second tunneling barrier;
a gate dielectric disposed above the central island; and
the gate electrode disposed on the gate dielectric.

15. The method as recited in claim 14, wherein the gate dielectric is disposed above a portion of the first electrode, the first tunneling barrier, the second tunneling barrier, the central island, the additional second tunneling barrier, the additional first tunneling barrier and a portion of the second electrode.

16. The method as recited in claim 14, wherein the first tunneling barrier and the second tunneling barrier are formed from a single type of material.

17. The method as recited in claim 14, wherein the first tunneling barrier and the second tunneling barrier are formed from two different materials.

18. The method as recited in claim 14, wherein the first electrode comprises a Cr source electrode, the first tunneling barrier comprises $Cr_2O_3$, the central island comprises Si, and the second electrode comprises a Cr drain electrode.

19. The method as recited in claim 14, wherein the first tunneling barrier comprises $Cr_2O_3$ and the second tunneling barrier comprises $SiO_2$ or $Si_3N_4$.

20. The method as recited in claim 14, wherein:
the first electrode and second electrode are formed from a material selected from the group consisting of Al, Pb, Cr, Cu, Au, Ag, Pt, Pd, and Ti;
the central island is formed from a material selected from the group consisting of Si, Ge, CdSe, CdTe, GaAs, InP, InAs, Al, Pb, Cr, Cu, Au, Ag, Pt, Pd, and Ti;
the first tunneling barrier is formed from a material selected from the group consisting of $Al_2O_3$, $Cr_2O_3$, and $TiO_x$; and
the second tunneling barrier is formed from a material selected from the group consisting of $SiO_2$, $Si_3N_4$, $Al_2O_3$, $Cr_2O_3$, and $TiO_x$.

* * * * *